United States Patent
Saie et al.

(10) Patent No.: US 9,354,514 B2
(45) Date of Patent: May 31, 2016

(54) PHOTOSENSITIVE TRANSPARENT COMPOSITION FOR COLOR FILTER OF SOLID-STATE IMAGING DEVICE, AND PRODUCTION METHOD OF COLOR FILTER OF SOLID-STATE IMAGING DEVICE, COLOR FILTER OF SOLID-STATE IMAGING DEVICE, AND SOLID-STATE IMAGING DEVICE, EACH USING THE SAME

(71) Applicant: FUJIFILM Corporation, Tokyo (JP)

(72) Inventors: Toshiyuki Saie, Shizuoka (JP); Shinichi Kanna, Shizuoka (JP); Makoto Kubota, Shizuoka (JP); Yuzo Nagata, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 13/923,537

(22) Filed: Jun. 21, 2013

(65) Prior Publication Data
US 2013/0285182 A1     Oct. 31, 2013

Related U.S. Application Data

(63) Continuation of application No. PCT/JP2011/078232, filed on Nov. 30, 2011.

(30) Foreign Application Priority Data

Dec. 24, 2010 (JP) ................ 2010-288927

(51) Int. Cl.
*G03F 7/004* (2006.01)
*G02B 5/20* (2006.01)
(Continued)

(52) U.S. Cl.
CPC ......... *G03F 7/004* (2013.01); *G02B 5/20* (2013.01); *G02B 5/201* (2013.01); *G03F 7/0007* (2013.01);
(Continued)

(58) Field of Classification Search
CPC ... H01L 31/0232; G03F 7/0007; G03F 7/047; G03F 7/031; G03F 7/027; G03F 7/033; G03F 7/004; G02B 5/206; G02B 5/20; G02B 5/201
USPC ............ 257/432, 440; 430/7, 270.1, 281.1, 430/287.1, 321; 359/891
See application file for complete search history.

(56) References Cited

U.S. PATENT DOCUMENTS 5,278,009 A * 1/1994 Iida et al. .................. 430/7
8,362,140 B2 * 1/2013 Fujimaki et al. ........ 524/559
(Continued)

FOREIGN PATENT DOCUMENTS

CN     101349865 A     1/2009
EP     2 103 966 A2     9/2009
(Continued)

OTHER PUBLICATIONS

EIC 2800 Search Report, STIC OPIM, Jun. 18, 2014.*
(Continued)

*Primary Examiner* — John A McPherson
(74) *Attorney, Agent, or Firm* — Sughrue Mion, PLLC

(57) ABSTRACT

There is provided a photosensitive transparent composition for a color filter of a solid-state imaging device, containing (A) a photopolymerization initiator, (B) a polymerizable compound, and (C) an alkali-soluble resin, wherein the cured film obtained from the photosensitive transparent composition has a refractive index of 1.60 to 1.90 for light at a wavelength of 633 nm.

17 Claims, 1 Drawing Sheet

(51) Int. Cl.
*H01L 27/14* (2006.01)
*H01L 31/0232* (2014.01)
*G03F 7/00* (2006.01)
*G03F 7/027* (2006.01)
*G03F 7/033* (2006.01)
*G03F 7/031* (2006.01)

(52) U.S. Cl.
CPC .............. *G03F 7/0047* (2013.01); *G03F 7/027* (2013.01); *G03F 7/033* (2013.01); *H01L 31/0232* (2013.01); *G03F 7/031* (2013.01)

(56) References Cited

U.S. PATENT DOCUMENTS

| | | | | |
|---|---|---|---|---|
| 2007/0128548 | A1* | 6/2007 | Kim et al. | 430/281.1 |
| 2008/0171272 | A1* | 7/2008 | Nakashima et al. | 430/7 |
| 2008/0268354 | A1* | 10/2008 | Suzuki | 430/7 |
| 2009/0023085 | A1 | 1/2009 | Tsuchimura | |
| 2009/0082487 | A1* | 3/2009 | Kanda | 522/174 |
| 2009/0226822 | A1* | 9/2009 | Sasao et al. | 430/2 |
| 2010/0044817 | A1* | 2/2010 | Takakuwa et al. | 257/432 |
| 2010/0261815 | A1* | 10/2010 | Cho et al. | 524/89 |
| 2011/0039195 | A1* | 2/2011 | Einaga | 430/7 |
| 2011/0124824 | A1 | 5/2011 | Nagata et al. | |
| 2011/0207331 | A1* | 8/2011 | Sakaguchi et al. | 438/703 |
| 2012/0045616 | A1* | 2/2012 | Ishiji et al. | 428/156 |
| 2012/0257283 | A1* | 10/2012 | Maruyama et al. | 359/619 |
| 2013/0217832 | A1* | 8/2013 | Niitani et al. | 525/284 |

FOREIGN PATENT DOCUMENTS

| | | | | | |
|---|---|---|---|---|---|
| EP | 2 502 963 | A1 | | 9/2012 | |
| JP | 200386778 | A | | 3/2003 | |
| JP | 200386778 | A | * | 3/2003 | |
| JP | 200698985 | A | * | 4/2006 | |
| JP | 200698985 | A | | 4/2006 | |
| JP | 200753153 | A | * | 3/2007 | |
| JP | 200753153 | A | | 3/2007 | |
| JP | 2007-246351 | A | * | 9/2007 | |
| JP | 2009-096977 | A | | 5/2009 | |
| JP | 2009-179678 | A | * | 8/2009 | |
| JP | 2009179789 | A | * | 8/2009 | |
| JP | 2009179789 | A | | 8/2009 | |
| JP | 2009265642 | A | | 11/2009 | |
| JP | 2009265642 | A | * | 11/2009 | |
| JP | 2010-106268 | A | | 5/2010 | |
| TW | 2009-14998 | A | | 4/2009 | |
| TW | 2010-13313 | A | | 4/2010 | |
| WO | 2008/023712 | A1 | | 2/2008 | |
| WO | WO2009116442 | | * | 9/2009 | 524/559 |
| WO | WO 2011/062198 | A1 | * | 5/2011 | |

OTHER PUBLICATIONS

Computer-generated translation of JP 2009-179678 (Aug. 2009).*
Computer-generated translation of JP 2007-246351 (Sep. 2007).*
International Search Report dated Feb. 21, 2012 from the International Searching Authority in counterpart application No. PCT/JP2011/078232.
Written Opinion dated Feb. 21, 2012 from the International Searching Authority in counterpart application No. PCT/JP2011/078232.
Search Report dated May 9, 2014, issued by the European Patent Office in counterpart European Application No. 11850155.0.
Office Action dated Apr. 8, 2014, issued by the Japanese Patent Office in counterpart Japanese Application No. 2010-288927.
Office Action dated Jan. 26, 2015 issued by the State Intellectual Property Office of P.R. China in counterpart Chinese Patent Application No. 201180062073.8.
Office Action dated Dec. 16, 2014, issued by the Japanese Patent Office in counterpart Japanese Application No. 2010-288927.
Office Action dated Jul. 21, 2015 issued by the Korean Intellectual Property Office in counterpart Korean Patent Application No. 10-2013-7015970.
Office Action issued on Jun. 24, 2015, issued by the State Intellectual Property Office of the People's Republic of China in counterpart Chinese Patent Application No. 201180062073.8.
Office Action dated Apr. 23, 2015 issued by Taiwanese Patent Office in counterpart Taiwanese Application No. 100143975.
Office Action dated Oct. 29, 2015, issued by the Taiwanese Intellectual Property Office in counterpart Taiwanese Application No. 100143975.
Office Action dated Feb. 22, 2016 issued by The State Intellectual Property Office of P.R. China in counterpart Chinese Application No. 201180062073.8.

* cited by examiner

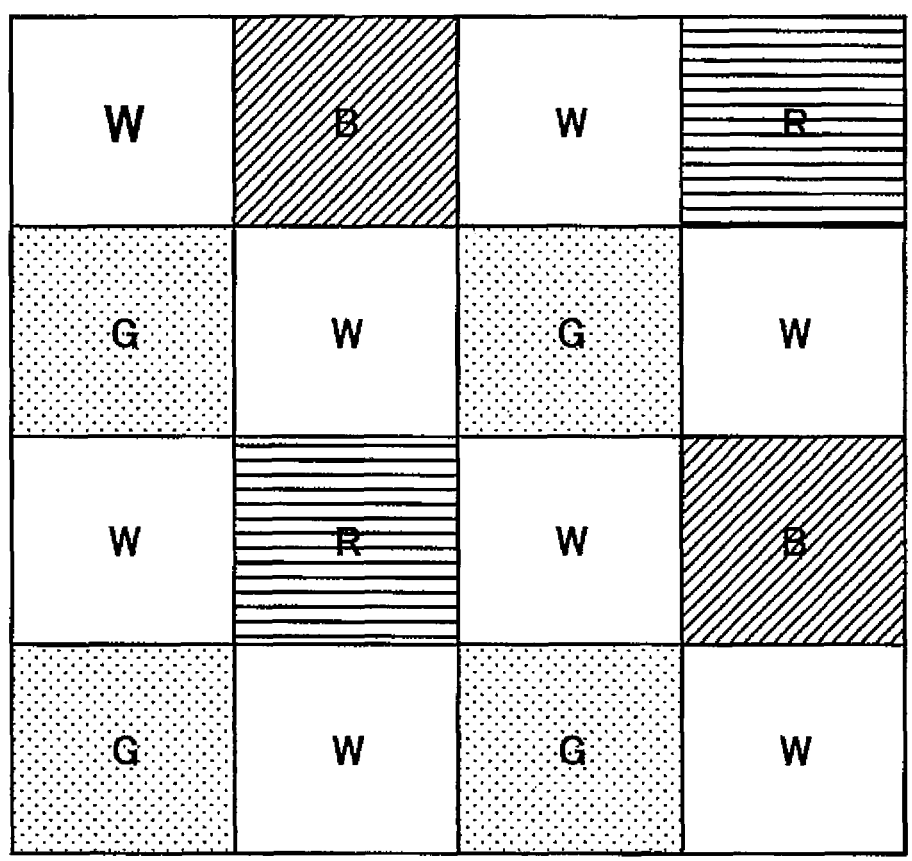

PHOTOSENSITIVE TRANSPARENT COMPOSITION FOR COLOR FILTER OF SOLID-STATE IMAGING DEVICE, AND PRODUCTION METHOD OF COLOR FILTER OF SOLID-STATE IMAGING DEVICE, COLOR FILTER OF SOLID-STATE IMAGING DEVICE, AND SOLID-STATE IMAGING DEVICE, EACH USING THE SAME

CROSS REFERENCE TO RELATED APPLICATION

This is a continuation of International Application No. PCT/JP2011/078232 filed on Nov. 30, 2011, and claims priority from Japanese Patent Application No. 2010-288927, filed on Dec. 24, 2010, the entire disclosures of which are incorporated therein by reference.

TECHNICAL FIELD

The present invention relates to a photosensitive transparent composition for a color filter of a solid-state imaging device, and a production method of a color filter of a solid-state imaging device, a color filter of a solid-state imaging device, and a solid-state imaging device, each using the composition.

BACKGROUND ART

In recent years, miniaturization of a pixel as well as increase in the number of pixels of an image sensor are progressing with an attempt to enhance the resolution of the image sensor (CCD, CMOS), but on the other hand, the aperture becomes small, leading to reduction of sensitivity.

Accordingly, for the purpose of increasing the sensitivity, as shown in FIG. 1, one of a plurality of color filters is sometimes made to be a white (transparent) color filter (see, JP-A-2007-53153 (the term "JP-A" as used herein means an "unexamined published Japanese patent application")). In the FIGURE, W indicates a white pattern (transparent pattern), R indicates a red pattern, G indicates a green pattern, and B indicates a blue pattern.

As the method to produce such a white pattern (white filter pixel) in a color filter, for example, a technique of forming a coated layer by using a photosensitive transparent composition containing a polymerizable monomer, an alkali-soluble resin, a photopolymerization initiator and a specific ultraviolet absorber, and subsequently subjecting the coated layer to exposure and developer to form a color filter is known (see, JP-A-2009-265642).

It is stated that according to the photosensitive transparent composition described in JP-A-2009-265642, the exposure illuminance dependency is kept low, the residual film ratio is high with little development scum, a pattern excellent in the resolution can be stably formed, and a color filter free from reduction in the transmittance for visible light and enabling display of a definite high-quality image can be provided.

SUMMARY OF INVENTION

However, with further miniaturization of the pixel, a color filter with one side of the filter pixel being about 1 μm is demanded in particular, and it is required that a high-quality image can be captured also in an image sensor where a color filter having a white filter image with such a size is mounted.

Incidentally, JP-A-2008-185683 discloses, for example, in Examples that a film is formed using a composition containing a metal oxide particle, a compound having two or more acryloyl groups, a photopolymerization initiator and a surfactant and the film is exposed and developed, whereby a microlens array is formed. However, in JP-A-2008-185683, it is neither disclosed nor suggested to obtain a color filter having a white filter pixel or obtain a fine filter pixel with one side having a size of about 1 μm.

Under these circumstances, the present invention has been made, and an object of the present invention is to provide a photosensitive transparent composition for a color filter of a solid-state imaging device, which can produce a color filter containing a white filter pixel with one side being about 1 μm and ensuring that when the color filter is mounted in an image sensor, a high-quality image can be captured with high sensitivity in the image sensor, and a production method of a color filter of a solid-state imaging device, a color filter of a solid-imaging device, and a solid-state imaging device, each using the composition.

As a result of intensive studies, the present inventors have found that when the photosensitive transparent composition is designed such that the cured film obtained from the photosensitive transparent composition has a relatively high refractive index and when a color filter containing the cured film as a white filter pixel with one side being about 1 μm is mounted in an image sensor, imaging in the image sensor can be performed with high sensitivity.

Furthermore, the present inventors have found that when an alkali-soluble resin is incorporated into the photosensitive transparent composition and when a film is formed using the photosensitive transparent composition obtained above and the film is exposed and alkali-developed, a pattern having an excellent pattern profile despite one side having a size of about 1 μm is obtained with high resolution in a state of the development scum being reduced. In addition, it has been found that when the thus-obtained pattern is used as a white filter pixel in a color filter, a high-quality image can be captured in an image sensor.

The present invention has the following configurations, and the above-described objects can be attained by these configurations.

(1) A photosensitive transparent composition for a color filter of a solid-state imaging device, containing:
   (A) a photopolymerization initiator,
   (B) a polymerizable compound, and
   (C) an alkali-soluble resin,
wherein the cured film obtained from the photosensitive transparent composition has a refractive index of 1.60 to 1.90 for light at a wavelength of 633 nm.

(2) The photosensitive transparent composition for a color filter of a solid-state imaging device as described in (1) above, which further contains an inorganic fine particle.

(3) The photosensitive transparent composition for a color filter of a solid-state imaging device as described in (2) above, wherein the inorganic fine particle contains oxides of one member or two or more members selected from the group consisting of Si, Ti, Zr, Al and Sn.

(4) The photosensitive transparent composition for a color filter of a solid-state imaging device as described in any one of (1) to (3) above, wherein the alkali-soluble resin is a resin having a polymerizable group.

(5) The photosensitive transparent composition for a color filter of a solid-state imaging device as described in any one of (1) to (4) above, which further contains a dispersant.

(6) The photosensitive transparent composition for a color filter of a solid-state imaging device as described in any one of (1) to (5) above, which further contains an ultraviolet absorber.

(7) The photosensitive transparent composition for a color filter of a solid-state imaging device as described in any one of (1) to (6) above, wherein when a cured film with a thickness of 1 μm is formed from the photosensitive transparent composition, the light transmittance in the thickness direction of the cured film is 90% or more over the entire wavelength region of 400 to 700 nm.

(8) A method for producing a color filter of a solid-state imaging device, comprising:

coating the photosensitive transparent composition for a color filter of a solid-state imaging device described in any one of (1) to (7) above to form a coated layer, and exposing and developing the coated layer to form a pattern, thereby obtaining a cured film.

(9) A color filter of a solid-state imaging device, produced by the production method of a color filter of a solid-state imaging device described in (8) above.

(10) A solid-state imaging device comprising the color filter of a solid-state image device described in (9) above.

The present invention preferably further has the following configurations.

(11) The photosensitive transparent composition for a color filter of a solid-state imaging device as described in any one of (1) to (7) above, wherein the polymerizable compound is a polymerizable compound having two or more terminal ethylenically unsaturated bonds.

(12) The photosensitive transparent composition for a color filter of a solid-state imaging device as described in any one of (5) to (7) above, wherein the dispersant is a resin which contains at least a structural unit represented by any of the following formulae (1) to (4):

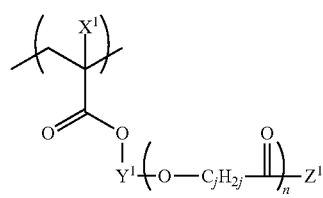

(1)

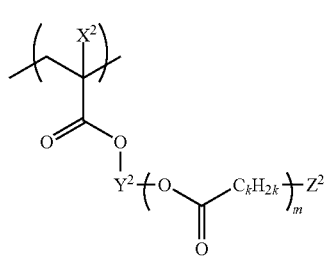

(2)

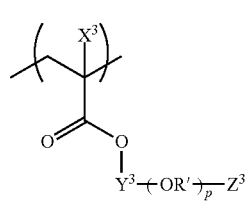

(3)

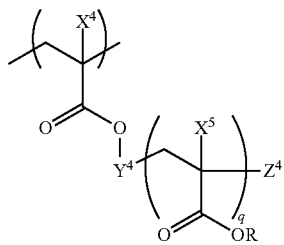

(4)

In formulae (1) to (4), each of $X^1$, $X^2$, $X^3$, $X^4$ and $X^5$ independently represents a hydrogen atom or a monovalent organic group.

In formula (3), R' represents a branched or linear alkylene group.

In formulae (1) to (4), each of $Y^1$, $Y^2$, $Y^3$ and $Y^4$ independently represents a divalent linking group.

In formulae (1) to (4), each of $Z^1$, $Z^2$, $Z^3$ and $Z^4$ independently represents a hydrogen atom or a monovalent substituent.

In formulae (1) to (4), each of n, m, p and q each represents an integer of 1 to 500.

In formulae (1) and (2), each of j and k independently represents an integer of 2 to 8.

In formula (4), R represents a hydrogen atom or a monovalent organic group.

According to the present invention, a photosensitive transparent composition for a color filter of a solid-state imaging device, which can produce a color filter containing a white filter pixel with one side being about 1 μm and ensuring that when the color filter is mounted in an image sensor, a high-quality image can be captured with high sensitivity in the image sensor, and a production method of a color filter of a solid-state imaging device, a color filter of a solid-imaging device, and a solid-state imaging device, each using the composition, can be provided.

BRIEF DESCRIPTION OF DRAWINGS

FIG. 1 is a schematic view showing an example of the color filter containing a white filter pixel, which is mounted in a solid-state imaging device.

DESCRIPTION OF EMBODIMENTS

The photosensitive transparent composition for a color filter of a solid-state imaging device of the present invention is described in detail below.

In the description of the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the description of the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation. In the description of the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam.

The constituent requirements may be described below based on representative embodiments of the present invention, but the present invention is not limited to these embodiments. Incidentally, in the description of the present invention, the range expressed as "(numerical value) to (numerical value)" means a range including the numerical values before and after "to" as the lower limit and the upper limit, respectively.

In the description of the present invention, the term "(meth)acrylate" indicates acrylate and methacrylate, the term "(meth)acryl" indicates acryl and methacryl, and the term "(meth)acryloyl" indicates acryloyl and methacryloyl. Also, in the description of the present invention, the "monomeric substance" has the same meaning as "monomer". The "monomer" as used in the present invention is differentiated from an oligomer and a polymer and indicates a compound having a mass average molecular weight of 2,000 or less. In the description of the present invention, the term "polymerizable compound" indicates a compound having a polymerizable group and may be either a monomer or a polymer. The term "polymerizable group" indicates a group participating in polymerization reaction.

The photosensitive transparent composition for a color filter of a solid-state imaging device of the present invention is a photosensitive transparent composition for a color filter of a solid-state imaging device, containing (A) a photopolymerization initiator, (B) a polymerizable compound, and (C) an alkali-soluble resin, wherein the cured film obtained from the photosensitive transparent composition has a refractive index of 1.60 to 1.90 for light at a wavelength of 633 nm.

The reason why by using the photosensitive transparent composition for a color filter of a solid-state imaging device of the present invention, a pattern having an excellent pattern profile despite one side size of about 1 μm can be obtained with high resolution in a state of the development scum being reduced and by using the obtained pattern as a white color filter, a high-quality image can be captured in an image sensor, is not clearly known, but the configuration where the photosensitive transparent composition contains an alkali-soluble resin is considered to greatly contribute to obtaining the effects above.

Also, by designing the photosensitive transparent composition such that the cured film obtained from the photosensitive transparent composition has a relatively high refractive index, more specifically, such that the cured film obtained from the photosensitive transparent composition for a color filter has a refractive index of 1.60 or more for light at a wavelength of 633 nm, when the film is mounted in an image sensor as a white color filter with one side having a size of about 1 μm, imaging in the image sensor can be performed with high sensitivity, and this is considered to result because the refractive index of the white color filter is 1.60 or more and incident light is thereby liable to be collected in the imaging part of the solid-state imaging device by the waveguide effect.

By designing the photosensitive transparent composition such that the cured film obtained from the photosensitive transparent composition for a color filter has a high refractive index of 1.90 or less for light at a wavelength of 633 nm, a pattern with one side having a size of about 1 μm can be formed.

Typically, the photosensitive transparent composition of the present invention is preferably a negative composition (composition for forming a negative pattern).

Each component of the photosensitive transparent composition of the present invention is described in detail below.

[1] (A) Photopolymerization Initiator

The photosensitive transparent composition of the present invention contains a photopolymerization initiator.

By virtue of containing a photopolymerization initiator, photosensitivity is imparted to the transparent composition, and by virtue of containing the later-described polymerizable compound and alkali-soluble resin, a pattern can be formed by forming a coated layer from the transparent composition and exposing and developing the coated layer. The thus-obtained pattern can be used as a white (transparent) filter in a color filter of a solid-state imaging device.

The photopolymerization initiator is not particularly limited as long as it has an ability of initiating polymerization of the polymerizable compound, and may be appropriately selected from known photopolymerization initiators. For example, those having photosensitivity to light in the region from ultraviolet to visible are preferred, and the initiator may be an activator capable of causing a certain action with a photoexcited sensitizer to produce an active radical or an initiator capable of initiating cationic polymerization according to the kind of the monomer.

The photopolymerization initiator preferably contains at least one kind of a component having a molecular extinction coefficient of at least about 50 in the range of approximately from 300 to 800 nm (more preferably from 330 to 500 nm).

Examples of the photopolymerization initiator include a halogenated hydrocarbon derivative (for example, a compound having a triazine skeleton, and a compound having an oxadiazole skeleton), an acylphosphine compound such as acylphosphine oxide, hexaarylbiimidazole, an oxime compound such as oxime derivative, an organic peroxide, a thio compound, a ketone compound, an aromatic onium salt, a ketoxime ether, an aminoacetophenone compound, and hydroxyacetophenone.

Examples of the halogenated hydrocarbon compound having a triazine skeleton include the compounds described in Wakabayashi et al., *Bull. Chem. Soc. Japan*, 42, 2924 (1969), the compounds described in Britain Patent 1388492, the compounds described in JP-A-53-133428, the compounds described in Germany Patent 3337024, the compounds described in F. C. Schaefer et al., *J. Org. Chem.*, 29, 1527 (1964), the compounds described in JP-A-62-58241, the compounds described in JP-A-5-281728, the compounds described in JP-A-5-34920, and the compounds described in U.S. Pat. No. 4,212,976.

The compounds described in U.S. Pat. No. 4,212,976 include, for example, a compound having an oxadiazole skeleton (e.g., 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole, 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-buthoxystyryl)-1,3,4-oxadiazole, 2-tribromomethyl-5-styryl-1,3,4-oxadiazole).

Examples of the photopolymerization initiator other than those described above include an acridine derivative (e.g., 9-phenylacridine, 1,7-bis(9,9'-acridinyl)heptane), N-phenylglycine, a polyhalogen compound (e.g., carbon tetrabromide, phenyl tribromomethyl sulfone, phenyl trichloromethyl ketone), coumarins (e.g., 3-(2-benzofuroyl)-7-diethylaminocoumarin, 3-(2-benzofuroyl)-7-(1- pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl)coumarin, 3-benzoyl-5,7-dipropoxycoumarin, 7-benzotriazol-2-ylcoumarin, coumarin compounds described in JP-A-5-19475, JP-A-7-271028, JP-A-2002-363206, JP-A-2002-363207, JP-A-2002-363208 and JP-A-2002-363209), acylphosphine oxides (e.g., bis(2,4,6-trimethylbenzoyl)-phenylphosphine oxide, bis(2,6-dimethoxybenzoyl)-2,4,4-trimethyl-pentylphenylphosphine oxide, Lucirin TPO), metallocenes (e.g., bis($\eta$5-2,4-cyclopentadien-1-yl)-bis(2,6-difluoro-3-(1H-pyrrol-1-yl)-phenyl) titanium, $\eta$5-cyclopentadienyl-$\eta$6-cumenyl-iron(1+)-hexafluorophosphate (1−)), and the compounds described in JP-A-53-133428, JP-B-57-1819 (the term "JP-B" as used herein means an "examined Japanese patent publication"), JP-B-57-6096, and U.S. Pat. No. 3,615,455.

Examples of the ketone compound include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenone tetracarboxylic acids and a tetramethyl ester thereof, 4,4'-bis(dialkylamino)benzophenones (e.g., 4,4'-bis(dimethylamino)benzophenone, 4,4'-bis(dicyclohexylamino)benzophenone, 4,4'-bis(diethylamino)benzophenone, 4,4'-bis(dihydroxyethylamino)benzophenone, 4-methoxy-4'-dimethylaminobenzophenone, 4,4'-dimethoxybenzophenone, 4-dimethylaminobenzophenone, 4-dimethylaminoacetophenone, benzyl, anthraquinone, 2-tert-butylanthraquinone, 2-methylanthraquinone, phenanthraquinone, xanthone, thioxanthone, 2-chloro-thioxanthone, 2,4-diethylthioxanthone, fluorenone, 2-benzyl-dimethylamino-1-(4-morpholinophenyl)-1-butanone, 2-methyl-1-[4-(methylthio)phenyl]-2-morpholino-1-propanone, 2-hydroxy-2-methyl-[4-(1-methylvinyl)phenyl]propanol oligomer, benzoin, benzoin ethers (e.g., benzoin methyl ether, benzoin ethyl ether, benzoin propyl ether, benzoin isopropyl ether, benzoin phenyl ether, benzyl dimethyl ketal), acridone, chloroacridone, N-methylacridone, N-butylacridone, and N-butyl-chloroacridone.

A hydroxyacetophenone compound, an aminoacetophenone compound, and an acylphosphine compound may be also suitably used as the photopolymerization initiator. More specifically, for example, an aminoacetophenone-based initiator described in JP-A-10-291969 and an acylphosphine oxide-based initiator described in Japanese Patent 4225898 may be used.

As the hydroxyacetophenone-based initiator, IRGACURE-184, DAROCUR-1173, IRGACURE-500, IRGACURE-2959 and IRGACURE-127 (trade names, all produced by CIBA Japan) may be used. As the aminoacetophenone-based initiator, commercial products IRGACURE-907, IRGACURE-369 and IRGACURE-379 (trade names, all produced by CIBA Japan) may be used. The compounds described in JP-A-2009-191179, where the absorption wavelength matches the light source having a long wavelength such as 365 nm or 405 nm, may be also used as the aminoacetophenone-based initiator. As the acylphosphine-based initiator, commercial products IRGACURE-819 and DAROCUR-TPO (trade names, both produced by CIBA Japan) may be used.

The more preferred photopolymerization initiator includes an oxime-based compound. Specific examples of the oxime-based initiator which can be used include the compounds described in JP-A-2001-233842, the compounds describe in JP-A-2000-80068, and the compounds described in JP-A-2006-342166.

Examples of the oxime compound such as oxime derivative, which is suitably used as the photopolymerization initiator in the present invention, include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Examples of the oxime ester compound include the compounds described in *J. C. S. Perkin II*, pp. 1653-1660 (1979), *J. C. S. Perkin II*, pp. 156-162 (1979), *Journal of Photopolymer Science and Technology*, pp. 202-232 (1995), JP-A-2000-66385, JP-A-2000-80068, JP-T-2004-534797 (the term "JP-T" as used herein means a published Japanese translation of a PCT patent application), and JP-A-2006-342166.

As the commercial product, IRGACURE-OXE01 (produced by CIBA Japan) and IRGACURE-OXE02 (produced by CIBA Japan) may be also suitably used.

As the oxime ester compound other than those described above, for example, the compounds described in JP-T-2009-519904, where oxime is linked to the N-position of carbazole, the compounds described in U.S. Pat. No. 7,626,957, where a hetero-substituent is introduced into the benzophenone moiety, the compounds described in JP-A-2010-15025 and U.S. Patent Application Publication 2009-292039, where a nitro group is introduced into the dye moiety, the ketoxime-based compounds described in International Publication 2009-131189, the compounds described in U.S. Pat. No. 7,556,910, containing a triazine skeleton and an oxide skeleton within the same molecule, and the compounds described in JP-A-2009-221114, having an absorption maximum at 405 nm and exhibiting good sensitivity for a g-line light source, may be also used.

Furthermore, cyclic oxime compounds described in JP-A-2007-231000 and JP-A-2007-322744 may be also suitably used. Among cyclic oxime compounds, the cyclic oxime compounds fused to a carbazole dye, described in JP-A-2010-32985 and JP-A-2010-185072, are preferred because of high light absorptivity and high sensitivity.

Also, the compounds described in JP-A-2009-242469, having an unsaturated bond at a specific site of an oxime compound, can achieve high sensitivity by regenerating an active radical from a polymerization inactive radical and therefore, can be suitably used.

Most preferred are the oxime compound having a specific substituent described in JP-A-2007-269779 and the oxime compound having a thioaryl group described in JP-A-2009-191061.

Specifically, the oxime compound is preferably a compound represented by the following formula (1). Incidentally, the oxime compound may be a compound where the N—O bond of oxime is (E) form, a compound where the bond is (Z) form, or a compound where the bond is a mixture of (E) form and (Z) form.

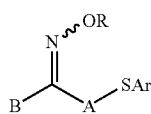

(1)

(wherein each of R and B independently represents a monovalent substituent, A represents a divalent organic group, and Ar represents an aryl group).

The monovalent substituent represented by R is preferably a monovalent nonmetallic atom group. Examples of the monovalent nonmetallic atom group include an alkyl group, an aryl group, an acyl group, an alkoxycarbonyl group, an aryloxycarbonyl group, a heterocyclic group, an alkylthiocarbonyl group, and an arylthiocarbonyl group. These groups may have one or more substituents. The substituent above may be further substituted with another substituent.

Examples of the substituent include a halogen atom, an aryloxy group, an alkoxycarbonyl group, an aryloxycarbonyl group, an acyloxy group, an acyl group, an alkyl group, and an aryl group.

The alkyl group which may have a substituent is preferably an alkyl group having a carbon number of 1 to 30, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group which may have a substituent is preferably an aryl group having a carbon number of 6 to 30, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-tolyl group, an m-tolyl group, a p-tolyl group, a xylyl group, an o-cumenyl group, an m-cumenyl group, a p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The acyl group which may have a substituent is preferably an acyl group having a carbon number of 2 to 20, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group which may have a substituent is preferably an alkoxycarbonyl group having a carbon number of 2 to 20, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group which may have a substituent include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The heterocyclic group which may have a substituent is preferably an aromatic or aliphatic heterocyclic ring containing a nitrogen atom, an oxygen atom, a sulfur atom or a phosphorus atom.

Specific examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxanilyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxantholyl group.

Specific examples of the alkylthiocarbonyl group which may have a substituent include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group which may have a substituent include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

The monovalent substituent represented by B indicates an aryl group, a heterocyclic group, an arylcarbonyl group, or a heterocyclic carbonyl group. These groups may have one or more substituents. Examples of the substituent include the substituents described above. Also, the above-described substituent may be further substituted with another substituent.

Above all, structures shown below are preferred.

In the structures, Y, X and n have the same meanings as Y, X and n in Formula (2) described later, and preferred examples thereof are also the same.

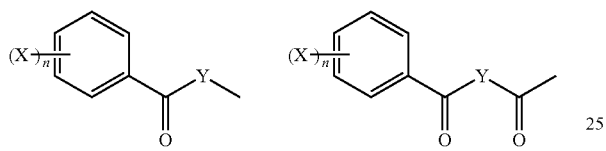

Examples of the divalent organic group represented by A include an alkylene group (preferably an alkylene group having a carbon number of 1 to 12), a cyclohexylene group (preferably a cyclohexylene group having a carbon number of 6 to 12), and an alkynylene group (preferably an alkynylene group having a carbon number of 2 to 12). These groups may have one or more substituents. Examples of the substituent include the substituents described above. Also, the above-described substituent may be further substituted with another substituent.

Above all, from the standpoint of enhancing the sensitivity and suppressing coloration due to heating or aging, A is preferably an unsubstituted alkylene group, an alkylene group substituted with an alkyl group (e.g., methyl group, ethyl group, tert-butyl group, dodecyl group), an alkylene group substituted with an alkenyl group (e.g., vinyl group, allyl group), or an alkylene group substituted with an aryl group (e.g., phenyl group, p-tolyl group, xylyl group, cumenyl group, naphthyl group, anthryl group, phenanthryl group, styryl group).

The aryl group represented by Ar is preferably an aryl group having a carbon number of 6 to 30 and may have a substituent. Examples of the substituent are the same as those of the substituent introduced into the substituted aryl group illustrated above as a specific example of the aryl group which may have a substituent.

Above all, from the standpoint of enhancing the sensitivity and suppressing coloration due to heating or aging, a substituted or unsubstituted phenyl group is preferred.

In view of sensitivity, the structure "SAr" formed by Ar and S adjacent thereto in formula (1) is preferably a structure shown below. In the structures, Me represents a methyl group, and Et represents an ethyl group.

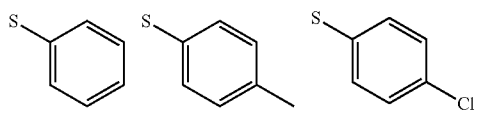

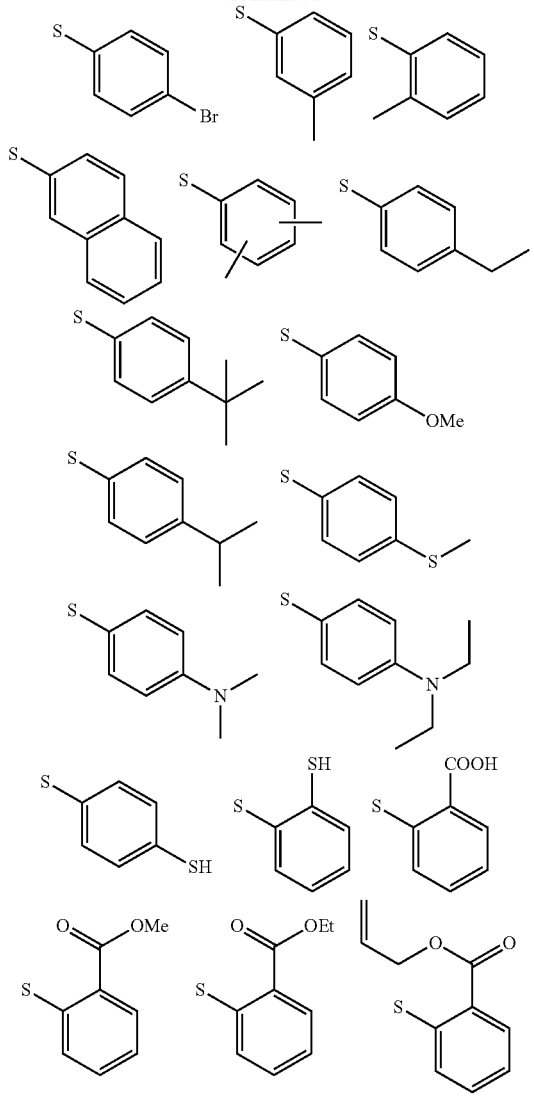

The oxime compound is preferably a compound represented by the following formula (2):

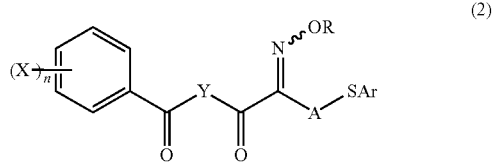

(wherein each of R and X independently represents a monovalent substituent, each of A and Y independently represent a divalent organic group, Ar represents an aryl group, and n is an integer of 0 to 5).

In formula (2), R, A and Ar have the same meanings as R, A and Ar in formula (1), and preferred examples thereof are also the same.

Examples of the monovalent substituent represented by X include an alkyl group, an aryl group, an alkoxy group, an aryloxy group, an acyloxy group, an alkoxycarbonyl group, an amino group, a heterocyclic group, and a halogen atom.

These groups may have one or more substituents. Examples of the substituent include the substituents described above. Also, the above-described substituent may be further substituted with another substituent.

Above all, in view of solvent solubility and enhancement of absorption efficiency in the long wavelength region, X is preferably an alkyl group.

In formula (2), n represents an integer of 0 to 5 and is preferably an integer of 0 to 2.

Examples of the divalent organic group represented by Y include structures shown below. In the groups shown below, "*" indicates a bonding position to the carbon atom adjacent to Y in formula (2).

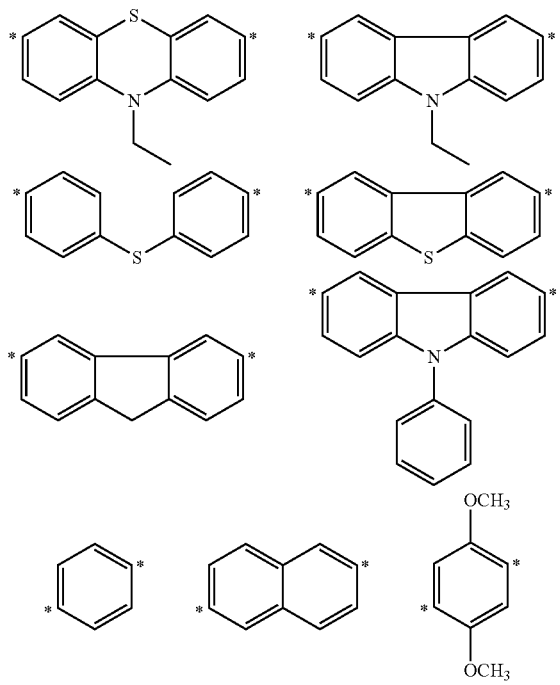

Among these, in view of high sensitivity, structures shown below are preferred.

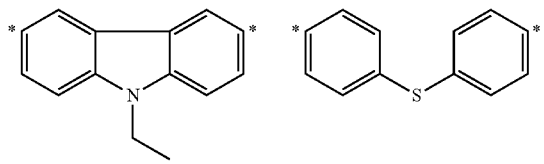

The oxime compound is more preferably a compound represented by the following formula (3):

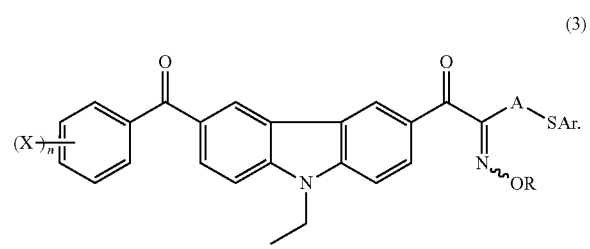

(3)

In formula (3), each of R and X independently represents a monovalent substituent, A represents a divalent organic group, Ar represents an aryl group, and n is an integer of 0 to 5.

In formula (3), R, X, A, Ar and n have the same meanings as R, X, A, Ar and n in formula (2), and preferred examples thereof are also the same.

Specific examples (B-1) to (B-10) of the oxime compound suitably used are illustrated below, but the present invention is not limited thereto.

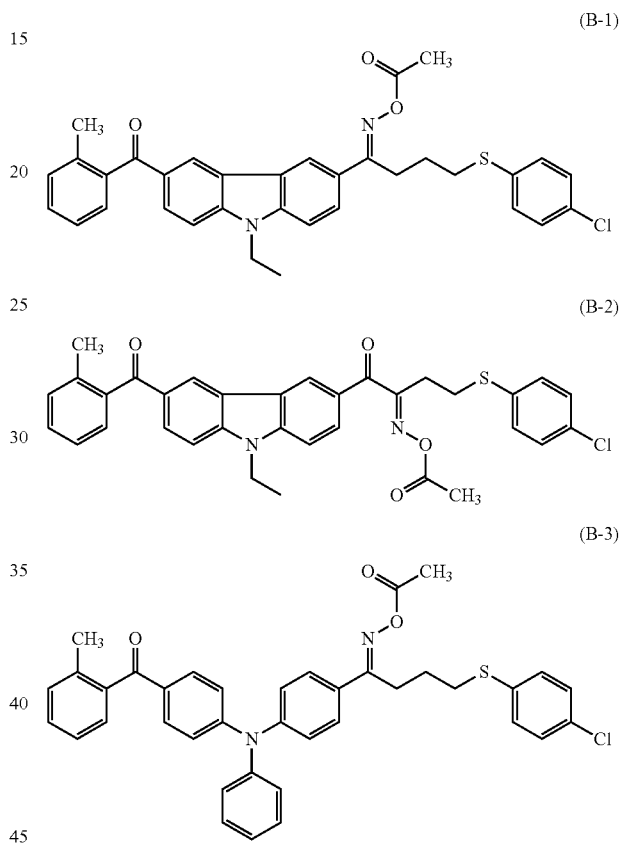

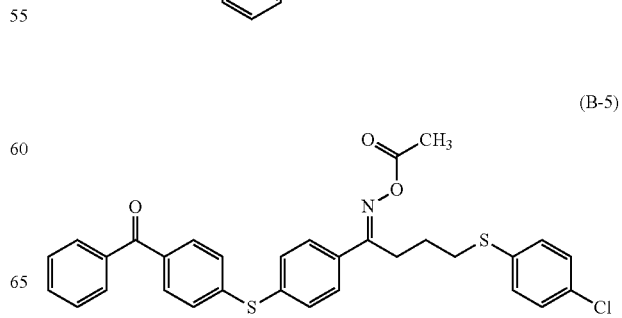

-continued

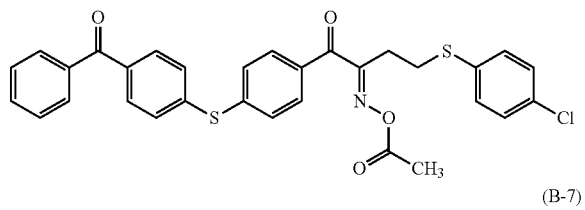
(B-6)

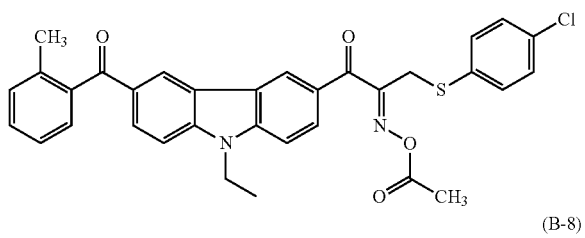
(B-7)

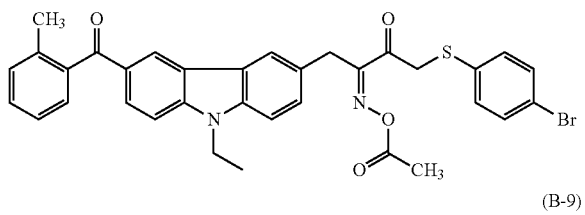
(B-8)

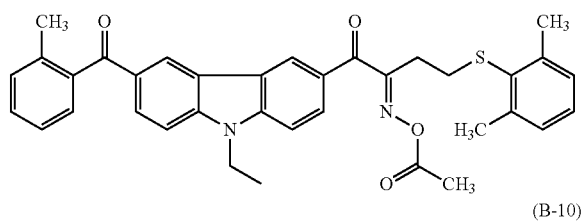
(B-9)

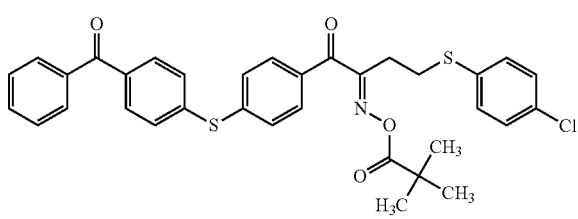
(B-10)

The oxime compound is a compound having a maximum absorption wavelength in the wavelength region of 350 to 500 nm, preferably a compound having an absorption wavelength in the wavelength region of 360 to 480 nm, more preferably a compound having high absorbance at wavelengths of 365 nm and 455 nm.

In view of sensitivity, the molar extinction coefficient at a wavelength of 365 nm or 405 nm of the oxime compound is preferably from 1,000 to 300,000, more preferably from 2,000 to 300,000, still more preferably from 5,000 to 200,000.

The molar extinction coefficient of the compound may be measured using a known method but specifically, for example, the molar extinction coefficient is preferably measured at a concentration of 0.01 g/L by using an ethyl acetate solvent in an ultraviolet-visible spectrophotometer (Carry-5 spectrophotometer, manufactured by Varian Inc.).

As the radical photopolymerization initiator for use in the present invention, two or more kinds of compounds may be used in combination, if desired.

The content of the photopolymerization initiator is preferably from 0.1 to 10 mass %, more preferably from 0.3 to 5 mass %, still more preferably from 0.4 to 4 mass %, based on the entire solid content of the photosensitive transparent composition of the present invention.

The photosensitive transparent composition may contain a sensitizer for the purpose of enhancing the radical generating efficiency of the radical initiator and shifting the photosensitive wavelength to the longer wavelength side. The sensitizer which can be used in the present invention is preferably a sensitizer capable of sensitizing the radical photopolymerization initiator by an electron transfer mechanism or an energy transfer mechanism.

Examples of the sensitizer for use in the photosensitive transparent composition include the compounds described in paragraphs [0101] to [0154] of JP-A-2008-32803.

In view of light absorption efficiency to the deep part and the initiation-decomposition efficiency, the content of the sensitizer in the photosensitive transparent composition is, in terms of the solid content, preferably 0.1 to 20 mass %, more preferably 0.5 to 15 mass %.

One sensitizer may be used alone, or two or more sensitizers may be used in combination.

[2] (B) Polymerizable Compound

The photosensitive transparent composition of the present invention contains a polymerizable compound.

Here, the polymerizable compound is a compound capable of bringing about polymerization by the effect of an active species. Examples of the active species include a radical, an acid and a base.

In the case where the active species is a radical, a compound having a terminal ethylenically unsaturated bond as a polymerizable group is usually used as the polymerizable compound.

In the case where the active species is an acid such as sulfonic acid, phosphoric acid, sulfinic acid, carboxylic acid, sulfuric acid and sulfuric acid monoester, for example, a compound having a cyclic ether group such as epoxy group, oxetanyl group and tetrahydrofuranyl group, or a vinylbenzene group is used as the polymerizable compound.

In the case where the active species is a base such as amino compound, for example, a compound having a cyclic ether group such as epoxy group, oxetanyl group and tetrahydrofuranyl group, or a vinylbenzene group is used as the polymerizable compound.

The polymerizable compound is preferably selected from compounds preferably having at least one terminal ethylenically unsaturated bond, more preferably two or more terminal ethylenically unsaturated bonds. Such compounds are widely known in this industrial field, and these compounds can be used in the present invention without any particular limitation. The compound may be in any of chemical forms such as monomer, prepolymer (that is, dimer, trimer or oligomer) and a mixture or multimer thereof. As for the polymerizable compound used in the present invention, one compound may be used alone, or two or more compounds may be used in combination.

More specifically, examples of the monomer and a prepolymer thereof include an unsaturated carboxylic acid (such as acrylic acid, methacrylic acid, itaconic acid, crotonic acid, isocrotonic acid and maleic acid), its esters and amides, and a multimer thereof. Esters of an unsaturated carboxylic acid and an aliphatic polyhydric alcohol compound, amides of an unsaturated carboxylic acid and an aliphatic polyvalent amine compound, and a multimer thereof are preferred. For example, an addition reaction product of unsaturated carboxylic acid esters or amides having a nucleophilic substituent such as hydroxyl group, amino group and mercapto group, with monofunctional or polyfunctional isocyanates or epoxies, and a dehydration condensation reaction product with a monofunctional or polyfunctional carboxylic acid, may be also suitably used. Furthermore, an addition reaction product of unsaturated carboxylic acid esters or amides having an electrophilic substituent such as isocyanate group and epoxy group, with monofunctional or polyfunctional alcohols, amines or thiols, and a substitution reaction product of unsaturated carboxylic acid esters or amides having a leaving substituent such as halogen group and tosyloxy group, with monofunctional or polyfunctional alcohols, amines or thiols, are also preferred. As other examples, compounds where the above-described unsaturated carboxylic acid is replaced by an unsaturated phosphonic acid, a vinylbenzene derivative such as styrene, a vinyl ether, an allyl ether or the like, may be also used.

As for specific compounds thereof, the compounds described in paragraphs 0095 to 0108 of JP-A-2009-288705 may be suitably used also in the present invention.

An ethylenically unsaturated group-containing compound having, as a polymerizable monomer, at least one addition-polymerizable ethylene group and having a boiling point of 100° C. or more under normal pressure is also preferred as the polymerizable compound. Examples thereof include a monofunctional acrylate or methacrylate such as polyethylene glycol mono(meth)acrylate, polypropylene glycol mono(meth)acrylate and phenoxyethyl(meth)acrylate; a polyfunctional acrylate or methacrylate such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol(meth)acrylate, trimethylolpropane tri(acryloyloxypropyl)ether, tri(acryloyloxyethyl)isocyanurate, compound obtained by adding ethylene oxide or propylene oxide to a polyfunctional alcohol (e.g., glycerin, trimethylolethane) and (meth)acrylating the adduct, urethane(meth)acrylates described in JP-B-48-41708, JP-B-50-6034 and JP-A-51-37193, polyester acrylates described in JP-A-48-64183, JP-B-49-43191 and JP-B-52-30490, and epoxy acrylates as a reaction product of epoxy resin and (meth)acrylic acid; and a mixture thereof.

Other examples include a polyfunctional (meth)acrylate obtained by reacting a polyfunctional carboxylic acid with a compound having a cyclic ether group and an ethylenically unsaturated group, such as glycidyl(meth)acrylate.

As other preferred polymerizable compounds, the compounds having a fluorene ring and a bifunctional or higher functional ethylenically polymerizable group, described in JP-A-2010-160418, JP-A-2010-129825 and Japanese Patent 4,364,216, and a cardo resin may be also used.

As the compound having a boiling point of 100° C. or more under normal pressure and having at least one addition-polymerizable ethylenically unsaturated group, the compounds described in paragraphs [0254] to [0257] of JP-A-2008-292970 are also preferred.

In addition, radical polymerizable monomers represented by the following formulae (MO-1) to (MO-5) may be suitably used. In the formulae, when T is an oxyalkylene group, R is bonded to the terminal on the carbon atom side.

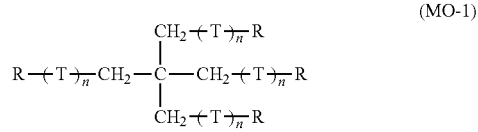
(MO-1)

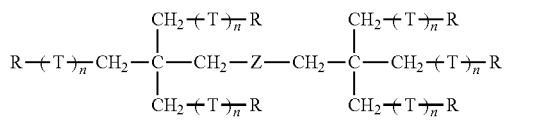
(MO-2)

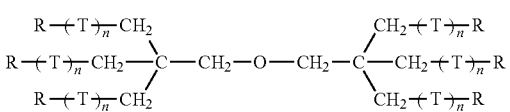
(MO-3)

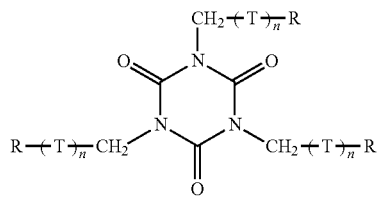
(MO-4)

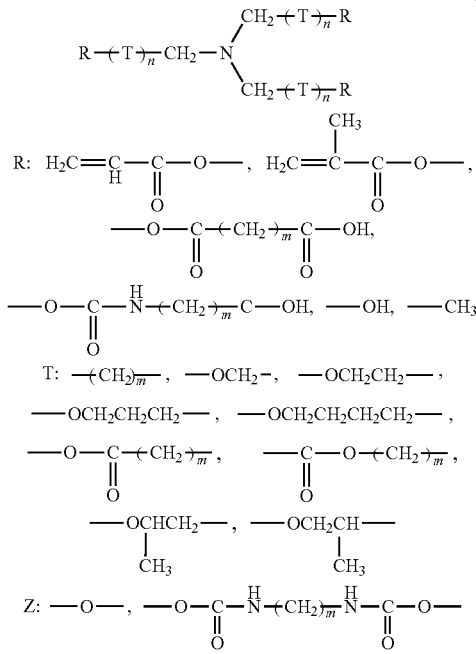
(MO-5)

In the formulae, n is from 0 to 14 and m is from 1 to 8. Each R or T may be the same as or different from every other R or T present in one molecule.

In each of the radical polymerizable monomers represented by formulae (MO-1) to (MO-5), at least one of the plurality of Rs represents a group represented by —OC(=O)CH=CH$_2$ or —OC(=O)C(CH$_3$)=CH$_2$.

As for specific examples of the radical polymerizable monomers represented by formulae (MO-1) to (MO-5), the compounds described in paragraphs 0248 to 0251 of JP-A-2007-269779 may be suitably used also in the present invention.

Compounds obtained by adding an ethylene oxide or a propylene oxide to the above-described polyfunctional alcohol and (meth)acrylating the adduct, described as formulae (1) and (2) together with their specific examples in JP-A-10-62986, may be also used as the polymerizable compound.

Above all, preferred polymerizable compounds are dipentaerythritol hexaacrylate (as a commercial product, KAYARAD D-330, produced by Nippon Kayaku Co., Ltd.), dipentaerythritol tetraacrylate (as a commercial product, KAYARAD D-320, produced by Nippon Kayaku Co., Ltd.), dipentaerythritol penta(meth)acrylate (as a commercial product, KAYARAD D-310, produced by Nippon Kayaku Co., Ltd.), dipentaerythritol hexa(meth)acrylate (as a commercial product, KAYARAD DPHA, produced by Nippon Kayaku Co., Ltd.), and structures where the (meth)acryloyl group of the compounds above is bonded through an ethylene glycol or propylene glycol residue. Their oligomer types may be also used.

The polymerizable compound may have an acid group such as carboxyl group, sulfonic acid group and phosphoric acid group, and suitable examples thereof include acid group-containing ethylenically unsaturated compounds. The acid group-containing ethylenically unsaturated compounds can be obtained, for example, by a method of (meth)acrylating a part of hydroxy groups in the polyfunctional alcohol and converting the remaining hydroxyl groups into a carboxy group through an addition reaction with an acid anhydride.

An ethylenic compound having an unreacted carboxyl group as in the case of the mixture above may be directly used, but, if desired, a non-aromatic carboxylic anhydride may be reacted with a hydroxyl group of the ethylenic compound to introduce an acid group. In this case, specific examples of the non-aromatic carboxylic anhydride include tetrahydrophthalic anhydride, alkylated tetrahydrophthalic anhydride, hexahydrophthalic anhydride, alkylated hexahydrophthalic anhydride, succinic anhydride, and maleic anhydride.

In the present invention, the acid group-containing monomer is preferably a polyfunctional monomer which is an ester of an aliphatic polyhydroxy compound and an unsaturated carboxylic acid and obtained by reacting a non-aromatic carboxylic anhydride with an unreacted hydroxyl group of an aliphatic polyhydroxy compound, more preferably the ester above where the aliphatic polyhydroxy compound is pentaerythritol and/or dipentaerythritol. Examples of the commercial product thereof include polybasic acid-modified acryl oligomers M-510 and M-520 produced by Toagosei Co., Ltd.

One of these monomers may be used alone, but since it is difficult in view of production to use a single compound, two or more monomers may be mixed and used. Also, as the monomer, an acid group-free polyfunctional monomer and an acid group-containing monomer may be used in combination, if desired.

The acid value of the acid group-containing polyfunctional monomer is preferably from 0.1 to 40 mg-KOH/g, more preferably from 5 to 30 mg-KOH/g. If the acid value of the polyfunctional monomer is too low, the solubility characteristics for developer are reduced, whereas if it is excessively high, production or handling becomes difficult, and the photopolymerization performance drops to impair the curability such as surface smoothness of pixel. Accordingly, in the case where two or more polyfunctional monomers differing in the acid group are used in combination or where an acid group-free polyfunctional monomer is used in combination, it is necessary to adjust the monomers such that the acid value as the entire polyfunctional monomer falls in the range above.

It is also preferred that the polymerizable compound for use in the present invention is at least one compound selected from the group consisting of the compounds represented by the following formulae (i) and (ii):

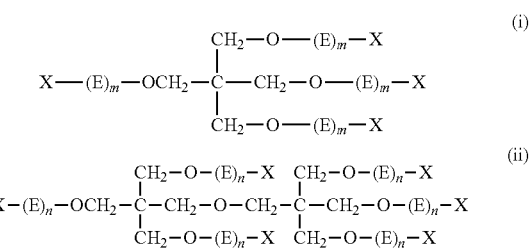

In formulae (i) and (ii), each E independently represents —(($CH_2$)$_y$$CH_2$O)— or —(($CH_2$)$_y$CH($CH_3$)O)—, each y independently represents an integer of 0 to 10, and each X independently represents an acryloyl group, a methacryloyl group, a hydrogen atom or a carboxyl group.

In formula (i), the total number of acryloyl groups and methacryloyl groups is 3 or 4, each m independently represents an integer of 0 to 10, and the total of respective m is an integer of 0 to 40, provided that when the total of respective m is 0, any one X is a carboxyl group.

In formula (ii), the total number of acryloyl groups and methacryloyl group is 5 or 6, each n independently represents an integer of 0 to 10, and the total of respective n is an integer of 0 to 60, provided that when the total of respective n is 0, any one X is a carboxyl group.

In formula (i), m is preferably an integer of 0 to 6, more preferably an integer of 0 to 4, the total of respective m is preferably an integer of 2 to 40, more preferably an integer of 2 to 16, still more preferably an integer of 4 to 8.

In formula (ii), n is preferably an integer of 0 to 6, more preferably an integer of 0 to 4, the total of respective n is preferably an integer of 3 to 60, more preferably an integer of 3 to 24, still more preferably an integer of 6 to 12.

In a preferred embodiment of —(($CH_2$)$_y$$CH_2$O)— or —(($CH_2$)$_y$CH($CH_3$)O)— in formula (i) or (ii), the terminal on the oxygen atom side is bonded to X.

One of the compounds represented by formulae (i) and (ii) may be used alone, or two or more thereof may be used in combination. In particular, an embodiment where all of 6 Xs in formula (ii) are an acryloyl group is preferred.

The total content of the compound represented by formula (i) or (ii) in the polymerizable compound is preferably 20 mass % or more, more preferably 50 mass % or more.

The compound represented by formula (i) or (ii) can be synthesized through a step of binding a ring-opened skeleton of ethylene oxide or propylene oxide to pentaerythritol or dipentaerythritol by a ring-opening addition reaction, and a step of introducing a (meth)acryloyl group into the terminal hydroxyl group of the ring-opened skeleton by reacting, for example, (meth)acryloyl chloride, which are conventionally known steps. Each process is a well-known process and the compound represented by formula (i) or (ii) can be easily synthesized by one skilled in the art.

Among the compounds represented by formulae (i) and (ii), a pentaerythritol derivative and/or a dipentaerythritol derivative are preferred.

Specific examples of the compounds include the compounds represented by the following formulae (a) to (f) (hereinafter, sometimes referred to as Compounds (a) to (f)), with Compounds (a), (b), (e) and (f) being preferred.

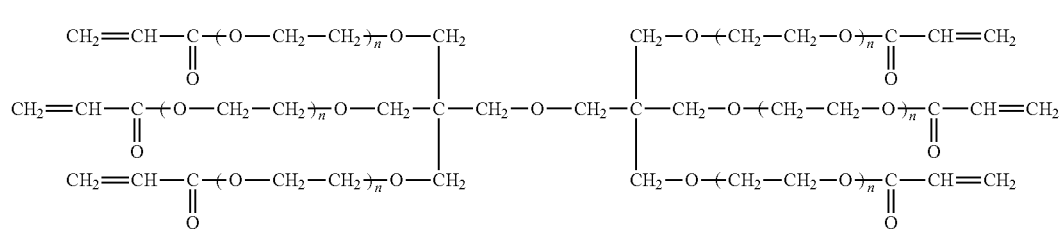
(a)
(the total of respective n is 6)
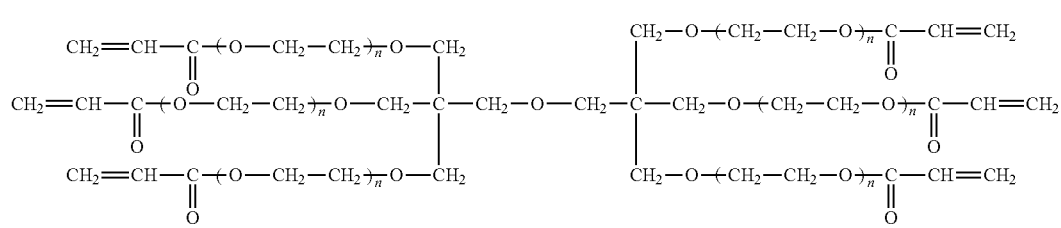
(b)
(the total of respective n is 12)
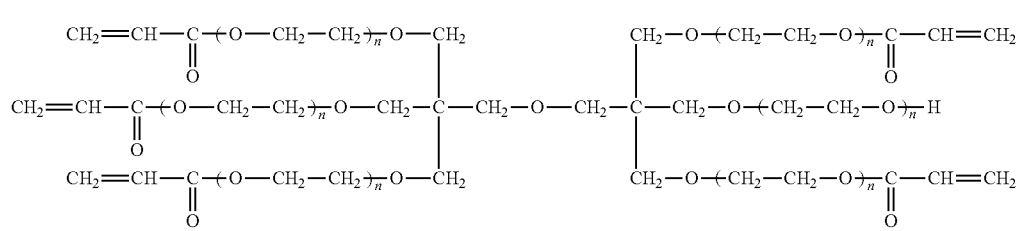
(c)
(the total of respective n is 12)
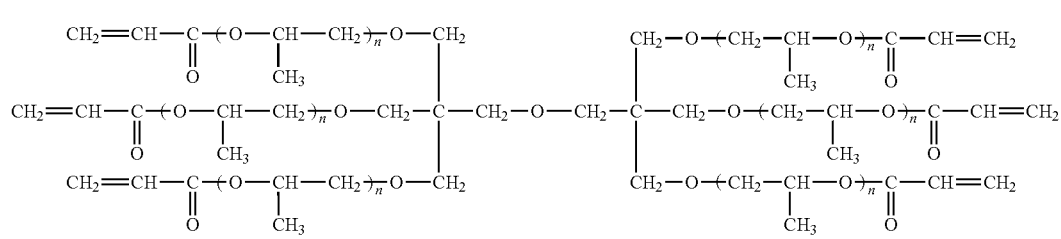
(d)
(the total of respective n is 6)
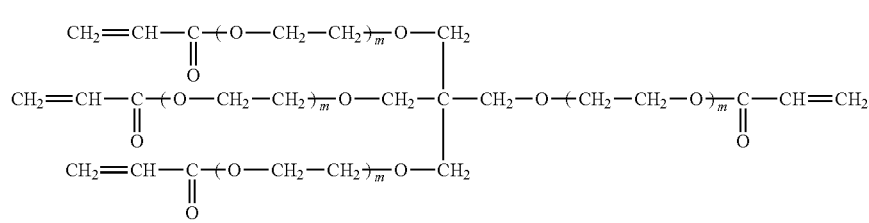
(e)
(the total of respective m is 4)
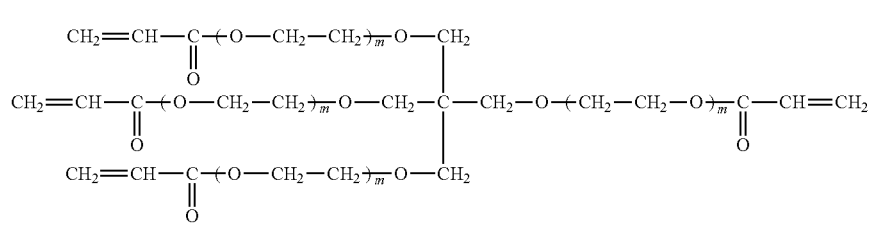
(f)
(the total of respective m is 12)

Examples of the commercial product of the polymerizable compounds represented by formulae (i) and (ii) include a tetrafunctional acrylate having four ethyleneoxy chains, SR-494, produced by Sartomer Company, Inc.; and a hexafunctional acrylate having six pentyleneoxy chains, DPCA-60, and a trifunctional acrylate having three isobutyleneoxy chains, TPA-330, both produced by Nippon Kayaku Co., Ltd.

Furthermore, urethane acrylates described in JP-B-48-41708, JP-A-51-37193, JP-B-2-32293 and JP-B-2-16765, and urethane compounds having an ethylene oxide-based skeleton described in JP-B-58-49860, JP-B-56-17654, JP-B-62-39417 and JP-B-62-39418, are also suitable as the polymerizable compound. In addition, by using, as the polymerizable compound, addition-polymerizable compounds having an amino structure or a sulfide structure in the molecule described in JP-A-63-277653, JP-A-63-260909 and JP-A-1-105238, a curable composition with a very excellent photosensitive speed can be obtained.

Examples of the commercial product of the polymerizable compound include urethane oligomers UAS-10, UAB-140 (produced by Sanyo Kokusaku Pulp Co., Ltd.), UA-7200 (produced by Shin-Nakamura Chemical Co., Ltd.), DPHA-40H (produced by Nippon Kayaku Co., Ltd.), UA-306H, UA-306T, UA-3061, AH-600, T-600, and AI-600 (produced by Kyoeisha Chemical Co., Ltd.).

As for the polymerizable compound, details of the structure and the use method such as single or combination use and added amount may be arbitrarily set according to the design of final performance of the photosensitive transparent composition. For example, in view of sensitivity, a structure having a large unsaturated group content per molecular is preferred, and in many cases, a bifunctional or higher functional structure is preferred. From the standpoint of increasing the strength of the cured film, a trifunctional or higher functional compound is preferred, and a method where compounds differing in the functional number or differing in the polymerizable group (for example, an acrylic acid ester, a methacrylic acid ester, a styrene-based compound and a vinyl ether-based compound) are used in combination to control both the sensitivity and the strength, is also effective. Furthermore, a combination use of trifunctional or higher functional polymerizable compounds differing in the ethylene oxide chain length is preferred, because the developability of the photosensitive transparent composition can be controlled and excellent pattern formation is obtained. The selection and use method of the polymerizable compound are also important factors for the compatibility and dispersibility with other components (for example, a photopolymerization initiator and an alkali-soluble resin) contained in the photosensitive transparent composition. For example, the compatibility can be sometimes enhanced by using a low-purity compound or using two or more kinds of compounds in combination. Also, a specific structure may be selected with the purpose of improving the adherence to a hard surface of a support or the like.

Specific examples of the polymerizable compound are illustrated below, but the present invention is not limited thereto.

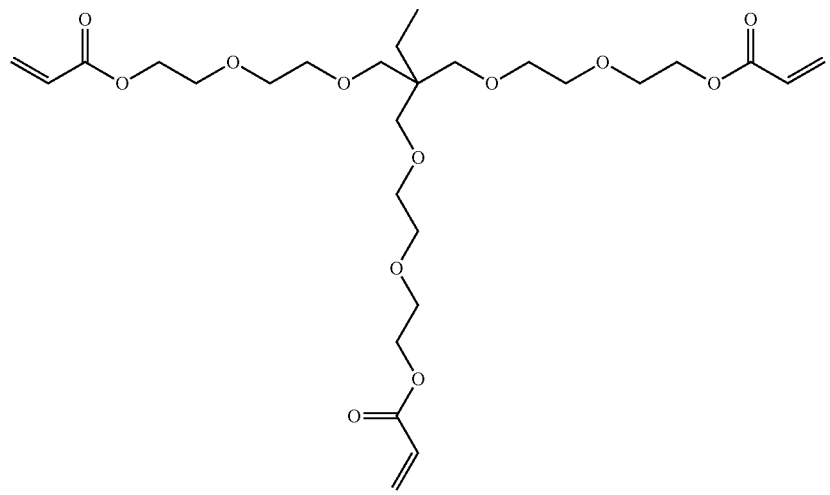

M-1

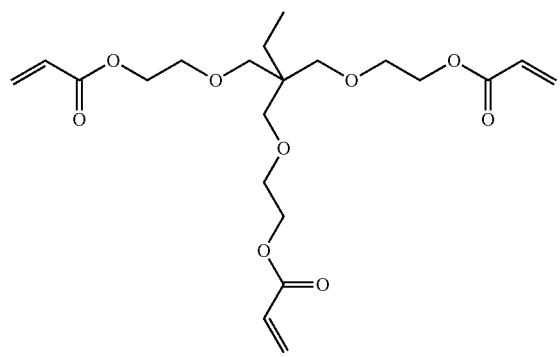

M-2

-continued
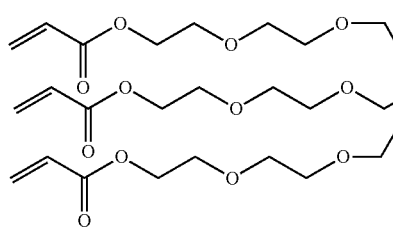
M-3
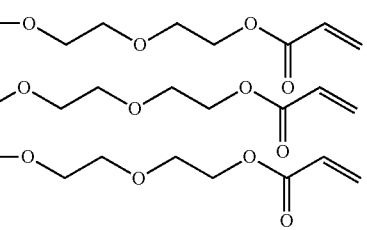
M-4
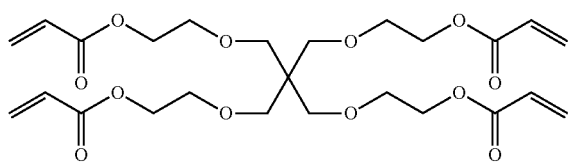
M-5
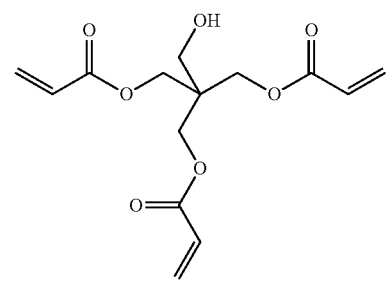
M-6
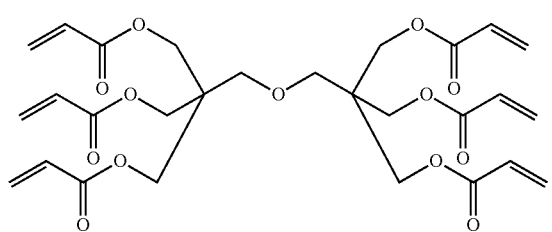
M-7
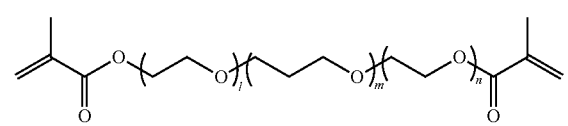
$(l + n \approx 6, m \approx 12)$
M-8
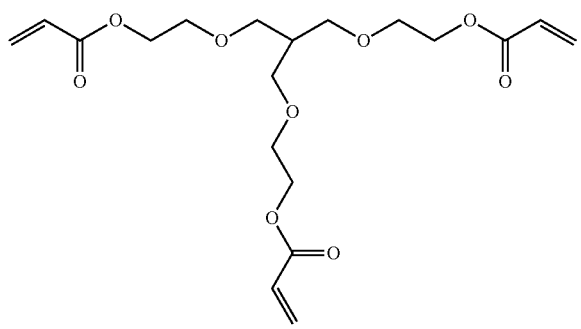
M-9
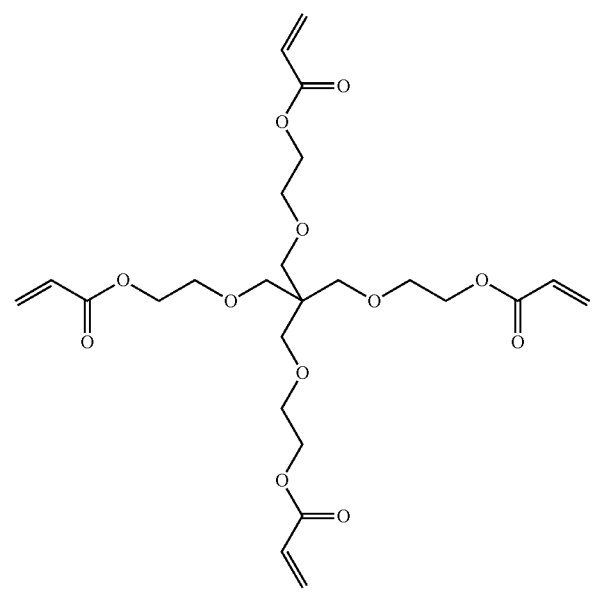
M-10
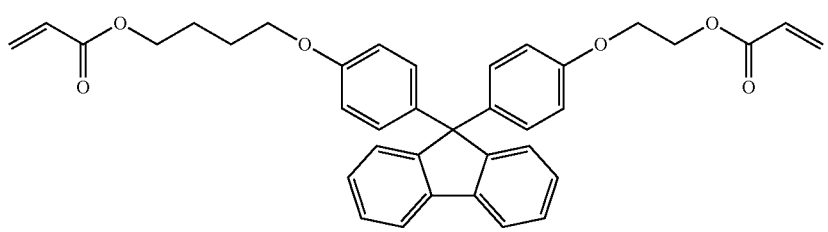

M-11

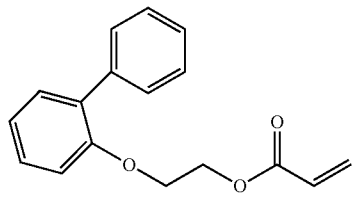

M-12

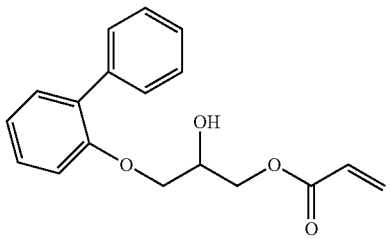

As for the polymerizable compound, one kind of a compound may be used, or two or more kinds of compounds may be used in combination.

The content of the polymerizable compound in the photosensitive transparent composition of the present invention is preferably from 0.1 to 90 mass %, more preferably from 1.0 to 80 mass %, still more preferably from 2.0 to 70 mass %, based on the solid content in the photosensitive transparent composition.

[3] (C) Alkali-Soluble Resin

The photosensitive transparent composition of the present invention further contains an alkali-soluble resin.

The alkali-soluble resin can be appropriately selected from alkali-soluble resins which are a linear organic high molecular polymer and contain at least one group capable of promoting alkali solubility in the molecule (preferably the molecule where an acryl-based copolymer or a styrene-based copolymer is the main chain). In view of heat resistance, a polyhydroxystyrene-based resin, a polysiloxane-based resin, an acrylic resin, an acrylamide-based resin and an acryl/acrylamide copolymer resin are preferred, and in view of developability control, an acrylic resin, an acrylamide-based resin and an acryl/acrylamide copolymer resin are preferred.

Examples of the group capable of promoting alkali solubility include an acid group, an alcoholic hydroxyl group, a pyrrolidone group and an alkylene oxide group, with an acid group being preferred.

The acid group is not particularly limited, but examples thereof include a carboxyl group, an active methylene group, a phosphoric acid group, a sulfonic acid group, a phenolic hydroxyl group and a carboxylic anhydride group. A group soluble in an organic solvent and developable with an aqueous weakly alkali solution is preferred, and a carboxyl group is particularly preferred. Only one of these acid groups may be used, or two or more thereof may be used.

In the production of the alkali-soluble resin, for example, a method by a known radical polymerization process may be applied. One skilled in the art can easily set the polymerization conditions when producing the alkali-soluble resin by the radical polymerization process, such as temperature, pressure, kind and amount of radical initiator, and kind of solvent, and the conditions may be also experimentally determined.

The linear organic high molecular polymer used as the alkali-soluble resin is preferably a polymer having a carboxylic acid in the side chain, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin such as novolak resin, an acidic cellulose derivative having a carboxylic acid in the side chain, and a resin obtained by adding an acid anhydride to a polymer having a hydroxyl group. In particular, a copolymer of a (meth)acrylic acid and another monomer copolymerizable therewith is suitable as the alkali-soluble resin. The another monomer copolymerizable with the (meth)acrylic acid includes, for example, an alkyl(meth)acrylate, an aryl(meth)acrylate, and a vinyl compound. Examples of the alkyl(meth)acrylate and aryl(meth)acrylate include methyl(meth)acrylate, ethyl(meth)acrylate, propyl(meth)acrylate, butyl(meth)acrylate, isobutyl(meth)acrylate, pentyl(meth)acrylate, hexyl(meth)acrylate, octyl(meth)acrylate, phenyl(meth)acrylate, benzyl(meth)acrylate, tolyl(meth)acrylate, naphthyl(meth)acrylate, and cyclohexyl(meth)acrylate. Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, a polymethyl methacrylate macromonomer, and an N-substituted maleimide monomer described in JP-A-10-300922, such as N-phenylmaleimide and N-cyclohexylmaleimide. As for the another monomer copolymerizable with the (meth)acrylic acid, only one kind of a monomer may be used, or two or more kinds of monomers may be used.

As the alkali-soluble resin, an alkali-soluble resin having, as a monomer component, a compound represented by the following Formula (ED) (hereinafter, sometimes referred to as an "ether dimer") is also preferably used.

Formula (ED):

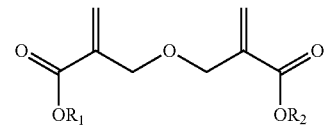

In formula (ED), each of $R_1$ and $R_2$ independently represents a hydrogen atom or a hydrocarbon group. The hydrocarbon group as $R_1$ and $R_2$ is preferably a hydrocarbon group having a carbon number of 1 to 25 and may further have a substituent.

Thanks to this resin, the photosensitive transparent composition of the present invention can form a cured film very excellent in the transparency as well as in the heat resistance. In formula (ED) showing an ether dimer, the hydrocarbon group represented by $R^1$ and $R^2$ having a carbon number of 1 to 25, which may have a substituent, is not particularly limited, but examples thereof include a linear or branched alkyl group such as methyl, ethyl, n-propyl, isopropyl, n-butyl, isobutyl, tert-butyl, tert-amyl, stearyl, lauryl and 2-ethylhexyl; an aryl group such as phenyl; an alicyclic group such as cyclohexyl, tert-butylcyclohexyl, dicyclopentadienyl, tricyclodecanyl, isobornyl, adamantyl and 2-methyl-2-adamantyl; an alkoxy-substituted alkyl group such as 1-methoxyethyl and 1-ethoxyethyl; and an aryl group-substituted alkyl group such as benzyl. Among these, a substituent of primary or secondary carbon, which is less likely to leave by the effect of acid or heat, such as methyl, ethyl, cyclohexyl and benzyl, is preferred in view of heat resistance.

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(tert-butyl)-2,2'-[oxybis(methylene)bis-2-propenoate, di(tert-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, biphenyl-2,2'-[oxybis(methylene)]bis-2-propenoate, dicyclohexyl-2,2'-[oxybis(methylene)]bis-2-propenoate, di(tert-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, and di(2-methyl-2-adamantyl)-2,2'-[oxybis(methylene)]bis-2-propenoate. Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are preferred. Only one of these ether dimers may be used, or two or more thereof may be used. The structure derived from the compound represented by formula (ED) may be copolymerized with another monomer.

Also, an alkali-soluble resin having a polymerizable group may be used for enhancing the crosslinking efficiency in the photosensitive transparent composition of the present invention. As the alkali-soluble resin having a polymerizable group, for example, an alkali-soluble resin containing, in the side chain, an allyl group, a (meth)acryl group or an allyloxyalkyl group is useful. Examples of the polymer containing a polymerizable group include DIANAL NR Series (produced by Mitsubishi Rayon Co., Ltd.), Photomer 6173 (COOH-containing polyurethane acrylic oligomer, produced by Diamond Shamrock Co., Ltd.), Viscoat R-264, KS Resist-106 (both produced by Osaka Organic Chemical Industry Ltd.), CYCLOMER P Series, PLACCEL CF200 Series (all produced by Daicel Chemical Industries, Ltd.), and Ebecryl 3800 (produced by Daicel-UCB Company Ltd.). Preferred examples of the alkali-soluble resin having a polymerizable group include a urethane-modified polymerizable double bond-containing acrylic resin obtained by previously reacting an isocyanate group and an OH group while leaving one unreacted isocyanate group, and reacting a (meth)acryloyl group-containing compound and a carboxyl group-containing acrylic resin; an unsaturated group-containing acrylic resin obtained by reacting a carboxyl group-containing acrylic resin and a compound having both an epoxy group and a polymerizable double bond; an acid pendant-type epoxy acrylate resin; a polymerizable double bond-containing acrylic resin obtained by reacting an OH group-containing acrylic resin and a polymerizable double bond-containing dibasic acid anhydride; a resin obtained by reacting an OH group-containing acrylic resin and a compound having an isocyanate and a polymerizable group; and a resin obtained by applying a basic treatment to a resin containing, in the side chain, an ester group having a leaving group such as halogen atom and sulfonate group at the α- or β-position, described in JP-A-2002-229207 and JP-A-2003-335814.

As the alkali-soluble resin, in particular, a benzyl(meth)acrylate/(meth)acrylic acid copolymer and a multi-copolymer composed of benzyl(meth)acrylate/(meth)acrylic acid/another monomer are preferred. Other examples include a copolymer of 2-hydroxyethyl methacrylate; and a 2-hydroxypropyl(meth)acrylate/polystyrene macromonomer/benzyl methacrylate/methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, and a 2-hydroxyethyl methacrylate/polystyrene macromonomer/benzyl methacrylate/methacrylic acid copolymer, which are described in JP-A-7-140654.

The acid value of the alkali-soluble resin is preferably from 30 to 200 mgKOH/g, more preferably from 50 to 150 mgKOH/g, and most preferably from 70 to 120 mgKOH/g.

The weight average molecular weight (Mw) of the alkali-soluble resin is preferably from 2,000 to 50,000, more preferably from 5,000 to 30,000, and most preferably from 7,000 to 20,000.

The content of the alkali-soluble resin in the photosensitive transparent composition is preferably from 1 to 60 mass %, more preferably from 2 to 50 mass %, still more preferably from 3 to 40 mass %, based on the entire solid content of the composition.

Specific examples of the alkali-soluble resin include Resins (E-1) to (E-8) illustrated below, but the present invention is not limited thereto. The numerical value attached to each unit indicates the mol fraction of each unit in the resin molecule.

E-1

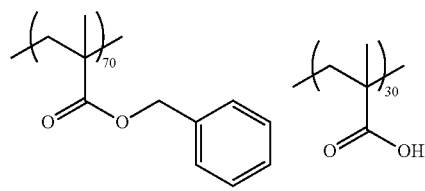

Mw = 30000

-continued
E-2
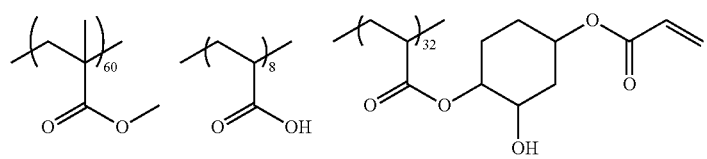
Mw = 14000
E-3
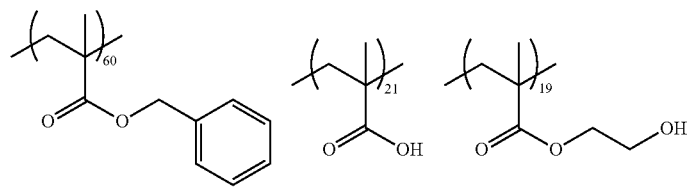
Mw = 14000
E-4
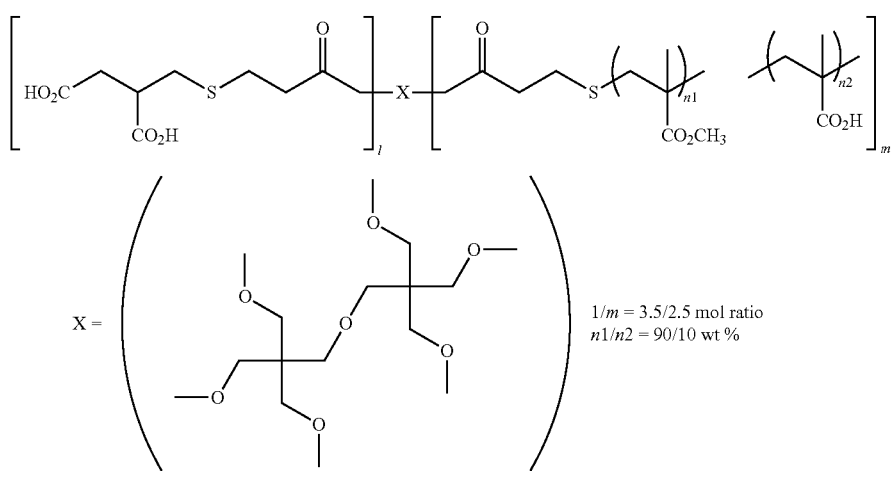
$l/m = 3.5/2.5$ mol ratio
$n1/n2 = 90/10$ wt %
Mw = 20000
E-5
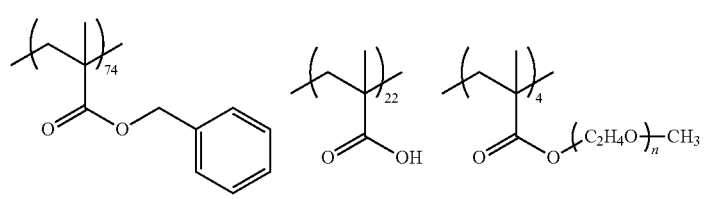
$n = 9$
Mw = 10000
E-6
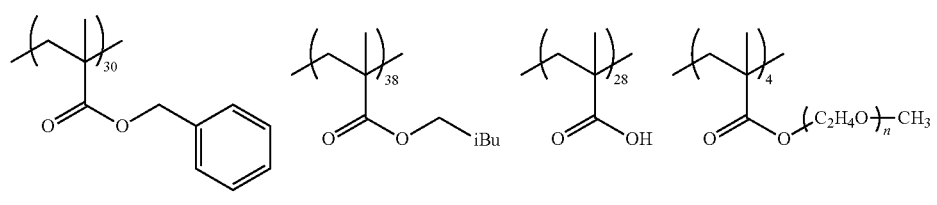
$n = 9$
Mw = 10000

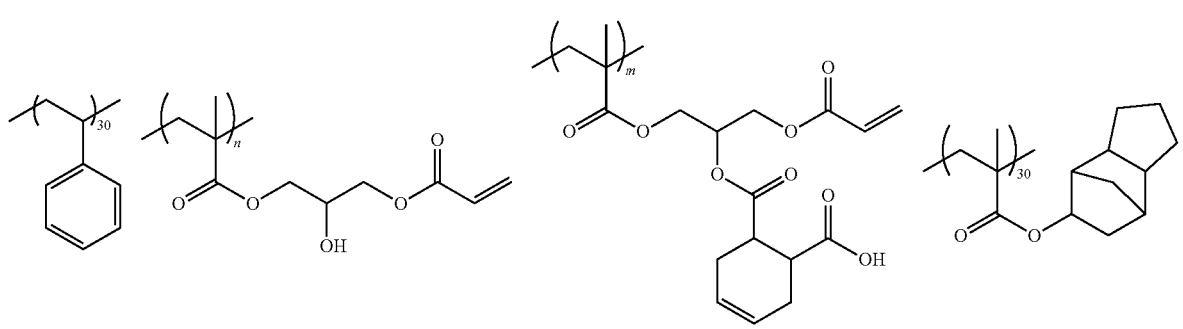

E-7

$n + m = 40$ $Mw = 9000$

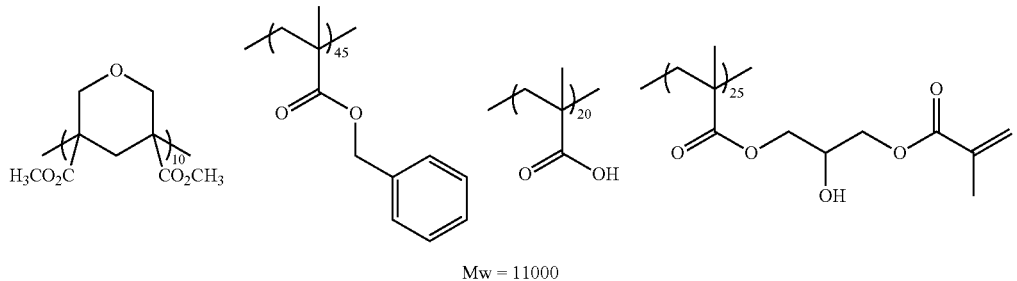

E-8

$Mw = 11000$

[4] (D) Inorganic Fine Particle

The photosensitive transparent composition of the present invention preferably contains an inorganic fine particle, and thanks to this inorganic fin particle, the refractive index for light at a wavelength of 633 nm of the cured film obtained from the photosensitive transparent composition can be easily adjusted to fall in the range of 1.60 to 1.90.

The inorganic fine particle preferably contains oxides of one member or two or more members selected from the group consisting of Si, Ti, Zr, Al and Sn, more preferably oxides of one member or two or more members selected from Ti, Al and Sn, still more preferably oxides of one member or two or more members selected from Ti and Al.

Specific examples of the oxide include $TiO_2$, $Al_2O_3$, $SiO_2$, SnO and $SnO_2$.

The production method of the inorganic fine particle is described, for example, in JP-A-10-81517 and JP-A-2001-26423.

The inorganic fine particle preferably has an average particle diameter of 1 to 200 nm, more preferably from 10 to 100 nm.

The average particle diameter of the inorganic fine particle can be determined from a photograph obtained by observing dispersed particles through a transmission electron microscope. The projected area of a particle is determined, and the equivalent-circle diameter is obtained therefrom and defined as the average particle diameter (usually, 300 or more particles are measured to determine the average particle diameter).

The refractive index of the inorganic fine particle is preferably from 1.6 to 2.8, more preferably from 1.7 to 2.7, and most preferably from 1.8 to 2.7.

The primary particle diameter of the inorganic fine particle is preferably from 1 to 100 nm, more preferably from 1 to 60 nm.

The inorganic fine particle may be either crystalline or amorphous and may be a monodisperse particle or may be even an aggregate particle as long as the predetermined particle diameter is satisfied. The particle is most preferably in a spherical shape but may be also in a beaded shape, a shape with a major axis/short axis ratio of 1 or more, or an indefinite shape.

The specific surface area of the inorganic fine particle is preferably from 10 to 2,000 $m^2/g$, more preferably from 20 to 1,800 $m^2/g$, and most preferably from 40 to 1,500 $m^2/g$.

As the inorganic fine particle, a commercially available product may be preferably used.

Examples of the commercial product which can be used include TTO Series (e.g., TTO-51(A), TTO-51(C)), TTO-S and V Series (e.g., TTO-S-1, TTO-S-2, TTO-V-3) produced by Ishihara Sangyo Kaisha Ltd.; and MT Series (e.g., MT-01, MT-05) produced by Tayca Corporation.

In the case of adding the inorganic fine particle to the photosensitive transparent composition in the form of a liquid dispersion containing the inorganic fine particle and a dispersant (the dispersant is described in detail later), the content of the inorganic fine particle in the inorganic fine particle liquid dispersion is preferably from 10 to 50 mass %, more preferably from 15 to 40 mass %, still more preferably from 15 to 30 mass %.

The content of the inorganic fine particle is preferably from 10 to 95 mass %, more preferably from 20 to 90 mass %, still more preferably from 30 to 80 mass %, based on the entire solid content of the photosensitive transparent composition.

In the case of forming a film by using the photosensitive transparent composition, the coated weight of the inorganic fine particle is preferably from 1 to 100 $mg/m^2$, more preferably from 5 to 80 $mg/m^2$, still more preferably from 10 to 60 $mg/m^2$. When the coated weight is 1 $mg/m^2$ or more, the refractive index for light at a wavelength of 633 nm of the cured film obtained from the photosensitive transparent composition of the present invention can be easily adjusted to be 1.60 or more, and when the coated weight is 100 mg/m$^2$ or less, the film can be prevented from formation of fine unevenness on the surface to deteriorate the integrated reflectance.

[5] (E) Dispersant

The photosensitive transparent composition of the present invention, particularly in the case of containing the above-described inorganic fine particle, preferably further contains a dispersant from the standpoint of enhancing the dispersibility of the inorganic fine particle.

The dispersant which can be used in the present invention includes a polymer dispersant [for example, polyamidoamine and a salt thereof, polycarboxylic acid and a salt thereof, a high molecular weight unsaturated acid ester, a modified polyurethane, a modified polyester, a modified poly(meth)acrylate, a (meth)acrylic copolymer and a naphthalenesulfonic acid-formalin condensate], and a surfactant such as polyoxyethylene alkyl phosphoric acid ester, polyoxyethylene alkylamine and alkanolamine.

The polymer dispersant may be classified into a linear polymer, a terminal-modified polymer, a graft polymer and a block polymer, on the basis of the structure.

Examples of the terminal-modified polymer having an anchor moiety to the surface include polymers having a phosphoric acid group at the terminal described in JP-A-3-112992 and JP-T-2003-533455, polymers having a sulfonic acid group at the terminal described in JP-A-2002-273191, polymers having an organic dye partial skeleton or a heterocyclic ring described in JP-A-9-77994, and polymers produced by modifying an oligomer or polymer having a hydroxyl group or an amino group at one terminal, with an acid anhydride described in JP-A-2008-29901. A polymer in which two or more anchor moieties (e.g., acid group, basic group, organic dye partial skeleton, heterocyclic ring) to the infrared-blocking material surface are introduced into the polymer terminal, described in JP-A-2007-277514, is excellent in the dispersion stability and is also preferred.

Examples of the graft polymer having an anchor moiety to the surface include reaction products of a poly(lower alkyleneimine) and a polyester described in JP-A-54-37082, JP-T-8-507960 and JP-A-2009-258668, reaction products of a polyallylamine and a polyester described in JP-A-9-169821, amphoteric dispersant resins having a basic group and an acidic group described in JP-A-2009-203462, copolymers of a macromonomer and a nitrogen atom-containing monomer described in JP-A-10-339949 and JP-A-2004-37986, graft polymers having an organic dye partial skeleton or a heterocyclic ring described in JP-A-2003-238837, JP-A-2008-9426 and JP-A-2008-81732, and copolymers of a macromonomer and an acid group-containing monomer described in JP-A-2010-106268.

As for the macromonomer used when producing a graft polymer having an anchor moiety to the surface by radical polymerization, a known macromonomer may be used, and examples thereof include MACROMONOMER AA-6 (a polymethyl methacrylate with the terminal group being a methacryloyl group), AS-6 (a polystyrene with the terminal group being a methacryloyl group), AN-6S (a copolymer of a styrene and an acrylonitrile with the terminal group being a methacryloyl group) and AB-6 (a polybutyl acrylate with the terminal group being a methacryloyl group), all produced by Toagosei Ltd.; PLACCEL FM5 (a 5 molar equivalent adduct of ε-caprolactone with 2-hydroxyethyl methacrylate) and FA10L (a 10 molar equivalent adduct of ε-caprolactone with 2-hydroxyethyl acrylate), both produced by Daicel Chemical Industries, Ltd.; and a polyester-based macromonomer described in JP-A-2-272009. Among these, a polyester-based macromonomer is flexible and excellent in solvent affinity and is preferred in view of dispersibility and dispersion stability of the inorganic fine particle in the photosensitive transparent composition as well as developability of the polymerizable composition using the inorganic fine particle, and a polyester-based macromonomer represented by the polyester-based macromonomer described in JP-A-2-272009 is most preferred.

As for the block polymer having an anchor moiety to the surface, the block polymers described, for example, in JP-A-2003-49110 and JP-A-2009-52010 are preferred.

The dispersant which can be used may be appropriately selected, for example, from known dispersants and surfactants.

Specific examples thereof include "Disperbyk-101 (polyamidoamine phosphate), 107 (carboxylic acid ester), 110 (copolymer containing acid group), 130 (polyamide), 161, 162, 163, 164, 165, 166, 170 (high-molecular copolymer)", and "BYK-P104, P105 (high-molecular-weight unsaturated polycarboxylic acid)", all produced by BYK Chemie; "EFKA 4047, 4050-4010-4165 (polyurethane-based), EFKA 4330-4340 (block copolymer), 4400-4402 (modified polyacrylate), 5010 (polyester amide), 5765 (high-molecular-weight polycarboxylate), 6220 (fatty acid polyester), and 6745 (phthalocyanine derivative)", all produced by EFKA; "Ajispur PB821, PB822, PB880, and PB881" produced by Ajinomoto Fine Techno Co., Inc.; "Flowlen TG-710 (urethane oligomer)" and "Polyflow No. 50E, and No. 300 (acrylic copolymer)", all produced by Kyoeisha Chemical Co., Ltd.; "Disperon KS-860, 873 SN, 874, #2150 (aliphatic polyvalent carboxylic acid), #7004 (polyetherester), DA-703-50, DA-705, and DA-725" produced by Kusumoto Chemicals Ltd.; "Demol RN, N (naphthalenesulfonic acid-formalin polycondensate), MS, C, SN-B (aromatic sulfonic acid-formalin polycondensate)", "Homogenol L-18 (high-molecular polycarboxylic acid)", "Emulgen 920, 930, 935, 985 (polyoxyethylene nonylphenyl ether)", and "Acetamine 86 (stearylamine acetate), all produced by Kao Corporation; "Solsperse 5000 (phthalocyanine derivative), 13240 (polyester amine), 3000, 17000, 27000 (polymer having a functional moiety in the end part), 24000, 28000, 32000, 38500 (graft polymer)", all produce by Lubrizol Japan Ltd.; "Nikkol T106 (polyoxyethylene sorbitan monooleate), MYS-IEX (polyoxyethylene monostearate)", both produced by Nikko Chemicals Co., Ltd.; Hinoact T-8000E, produced by Kawaken Fine Chemicals Co., Ltd.; Organosiloxane Polymer KP341, produced by Shin-Etsu Chemical Co., Ltd.; "W001, cationic surfactant", a nonionic surfactant such as polyoxyethylene lauryl ether, polyoxyethylene stearyl ether, polyoxyethylene oleyl ether, polyoxyethylene octyl phenyl ether, polyoxyethylene nonylphenyl ether, polyethylene glycol dilaurate, polyethylene glycol distearate and sorbitan fatty acid esters, and an anionic surfactant such as "W004, W005 and W017", all produced by Yusho Co., Ltd.; "EFKA-46, EFKA-47, EFKA-47EA, EFKA Polymer 100, EFKA Polymer 400, EFKA Polymer 401 and EFKA Polymer 450", all produced by Morishita & Co., Ltd.; a polymer dispersant such as "Disperse Aid 6, Disperse Aid 8, Disperse Aid 15 and Disperse Aid 9100", all produced by San Nopco Ltd.; "Adeka Pluronic L31, F38, L42, L44, L61, L64, F68, L72, P95, F77, P84, F87, P94, L101, P103, F108, L121 and P-123", all produced by ADEKA Corporation; and "IONET (trade name) S-20", produced by Sanyo Chemical Industries, Co., Ltd.

One of these dispersants may be used alone, or two or more thereof may be used in combination. As for the dispersant of the present invention, the terminal-modified polymer, graft polymer or block polymer having an anchor moiety to the surface of the infrared-blocking material may be also used in combination with an alkali-soluble resin. Examples of the alkali-soluble resin include a (meth)acrylic acid copolymer, an itaconic acid copolymer, a crotonic acid copolymer, a maleic acid copolymer, a partially esterified maleic acid copolymer, an acidic cellulose derivative having a carboxylic acid in the side chain, and a resin obtained by modifying a hydroxyl group-containing polymer with an acid anhydride, and among these, a (meth)acrylic acid copolymer is preferred. Also, N-substituted maleimide monomer copolymers described in JP-A-10-300922, ether dimer copolymers described in JP-A-2004-300204, and polymerizable group-containing alkali-soluble resins described in JP-A-7-319161 are preferred.

In view of dispersibility, developability and depositability, the following resins described in JP-A-2010-106268 are preferred. In particular, a polymer dispersant having a polyester chain in the side chain is preferred in view of dispersibility, and a resin having an acid group and a polyester chain is preferred in view of dispersibility and resolution of a pattern formed by photolithography. As for the acid group in the dispersant, in view of adsorptivity, an acid group having a pKa of 6 or less is preferred, and a carboxylic acid, a sulfonic acid and a phosphoric acid are more preferred.

Dispersant resins described in JP-A-2010-106268 which are preferably used in the present invention are described below.

The dispersant is preferably a graft copolymer having a graft chain selected from a polyester structure, a polyether structure and a polyacrylate structure, in which the number of atoms excluding hydrogen atom is from 40 to 10,000, and the graft copolymer preferably contains at least a structural unit represented by any of the following formulae (1) to (4), more preferably at least a structural unit represented by any of the following formulae (1A), (2A), (3) and (4).

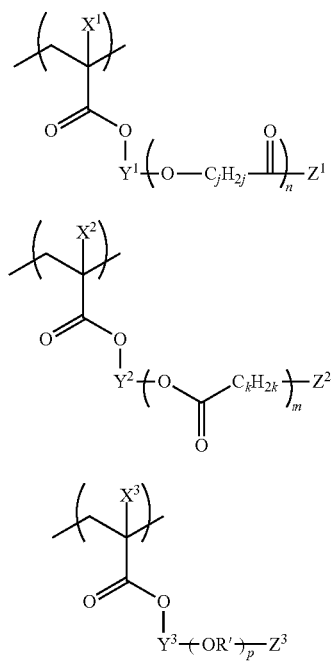

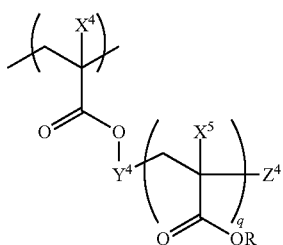

In formulae (1) to (4), each of $X^1$, $X^2$, $X^3$, $X^4$ and $X^5$ independently represents a hydrogen atom or a monovalent organic group and, in view of restriction on the synthesis, is preferably a hydrogen atom or an alkyl group having a carbon number of 1 to 12, more preferably a hydrogen atom or a methyl group, still more preferably a methyl group.

In formulae (3), R' represents a branched or linear alkylene group (preferably having a carbon number of 1 to 10, more preferably 2 or 3).

In formulae (1) to (4), each of $Y^1$, $Y^2$, $Y^3$ and $Y^4$ independently represents a divalent linking group and is not particularly limited in its structure. Specific examples thereof include linking groups of the following formulae (Y-1) to (Y-20). In the structures below, A and B indicate bonds to the left terminal group and the right terminal group, respectively, in formulae (1) to (4). Among the structures shown below, in view of easy synthesis, (Y-2) and (Y-13) are preferred.

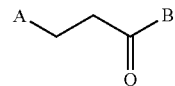

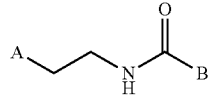

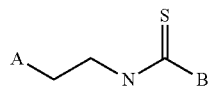

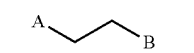

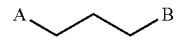

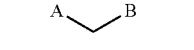

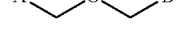

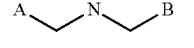

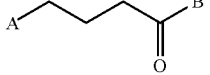

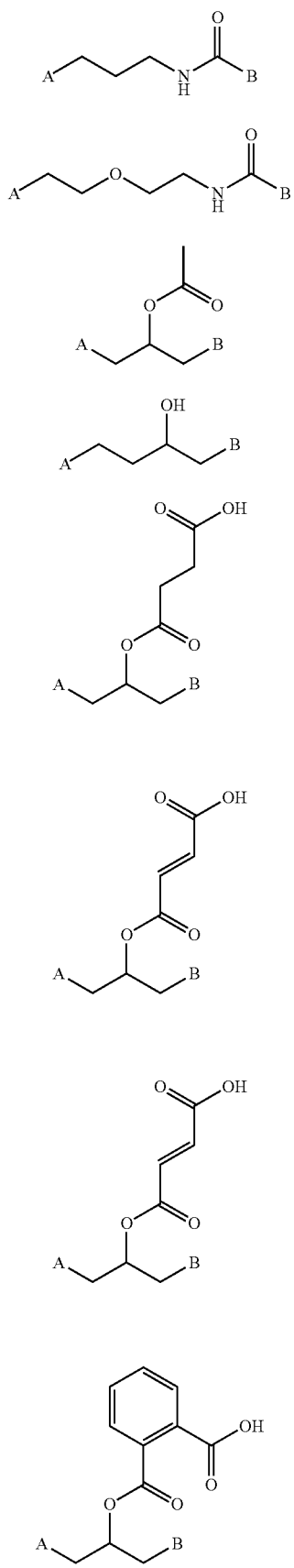

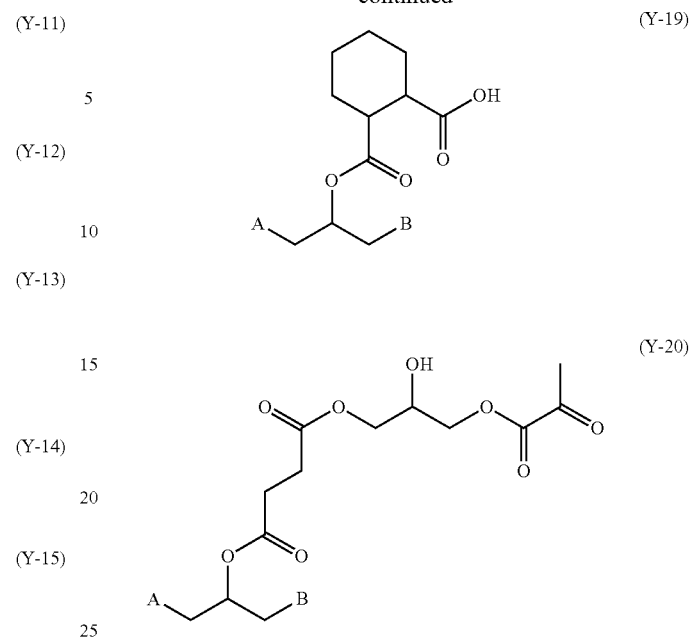

In formulae (1) to (4), each of $Z^1$, $Z^2$, $Z^3$ and $Z^4$ independently represents a hydrogen atom or a monovalent substituent, and the structure of the substituent is not particularly limited. Specific examples thereof include an alkyl group, a hydroxyl group, an alkoxy group, an aryloxy group, a heteroaryloxy group, an alkylthioether group, an arylthioether group, a heteroarylthioether group and an amino group. Among these, from the standpoint of enhancing the dispersibility, those having a steric repulsion effect are preferred, and an alkyl group having a carbon number of 5 to 24 is preferred. Above all, a branched alkyl group having a carbon number of 5 to 24 or a cyclic alkyl group having a carbon number of 5 to 24 is preferred.

In formulae (1) to (4), each of n, m, p and q each represents an integer of 1 to 500.

In formulae (1) and (2), each of j and k independently represents an integer of 2 to 8. In view of dispersion stability and developability, each of j and k in formulae (1) and (2) is preferably an integer of 4 to 6, and most preferably 5.

In formula (4), R represents a hydrogen atom or a monovalent organic group and is not particularly limited in its structure but is preferably a hydrogen atom, an alkyl group, an aryl group or a heteroaryl group, more preferably a hydrogen atom or an alkyl group. When R is an alkyl group, the alkyl group is preferably a linear alkyl group having a carbon number of 1 to 20, a branched alkyl group having a carbon number of 3 to 20, or a cyclic alkyl group having a carbon number of 5 to 20, more preferably a linear alkyl group having a carbon number of 1 to 20, still more preferably a linear alkyl group having a carbon number of 1 to 6.

As for R in formula (4), two or more Rs differing in the structure may be mixed and used in the specific resin.

In view of dispersion stability and developability, the structural unit represented by formula (1) is preferably a structural unit represented by the following formula (1A).

Also, in view of dispersion stability and developability, the structural unit represented by formula (2) is preferably a structural unit represented by the following formula (2A).

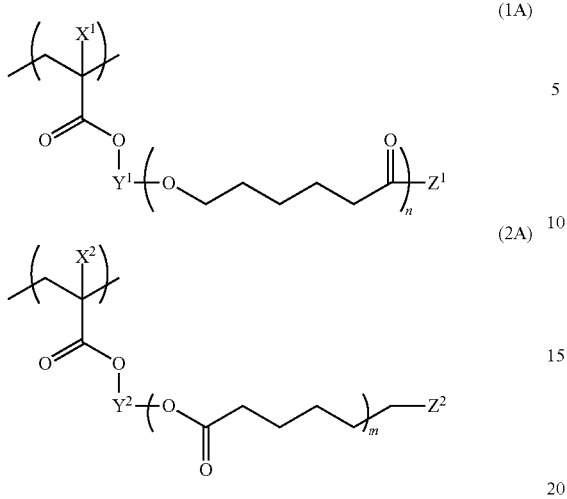

(1A)

(2A)

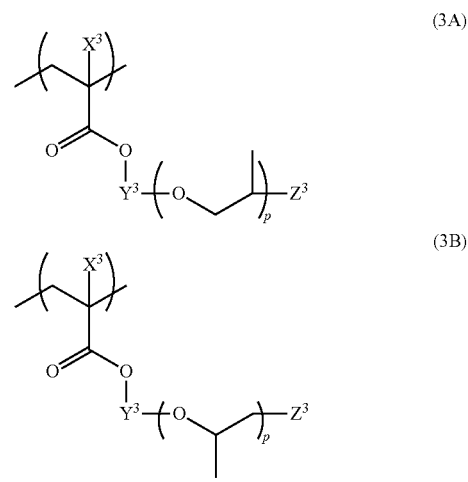

(3A)

(3B)

In formula (1A), $X^1$, $Y^1$, $Z^1$ and n have the same meanings as $X^1$, $Y^1$, $Z^1$ and n in formula (1), and preferred ranges are also the same.

In formula (2A), $X^2$, $Y^2$, $Z^2$ and m have the same meanings as $X^2$, $Y^2$, $Z^2$ and m in formula (2), and preferred ranges are also the same.

Furthermore, the structural unit represented by formula (3) is preferably a structural unit represented by the following formula (3A) or (3B):

In formulae (3A) and (3B), $X^3$, $Y^3$, $Z^3$ and p have the same meanings as $X^3$, $Y^3$, $Z^3$ and p in formula (3), and preferred ranges are also the same.

Specific examples include the compounds illustrated below. In the compounds illustrated below, the numerical value attached to each structural unit (the numerical value attached to the repeating unit of the main chain) indicates the content [% by mass; shown as "wt %"] of the structural unit. The numerical value attached to the repeating unit of the side chain indicates the number of repetitions of the repeating unit.

(Exemplified Compound 1)

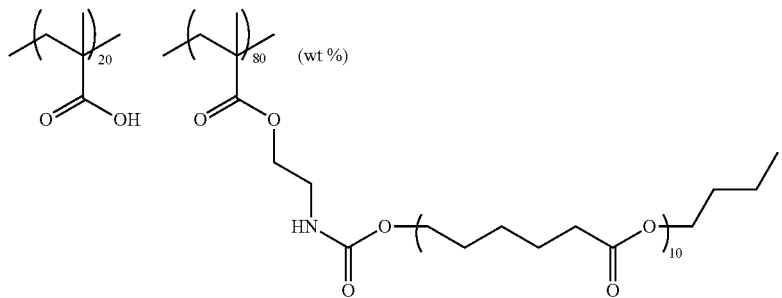

(Exemplified Compound 2)

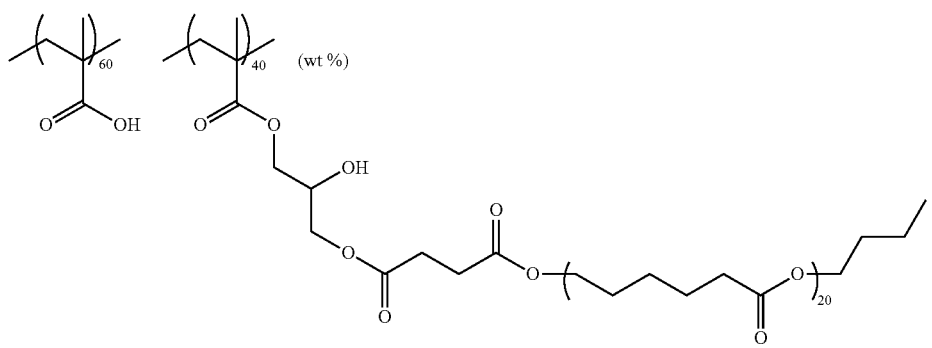

-continued
(Exemplified Compound 3)
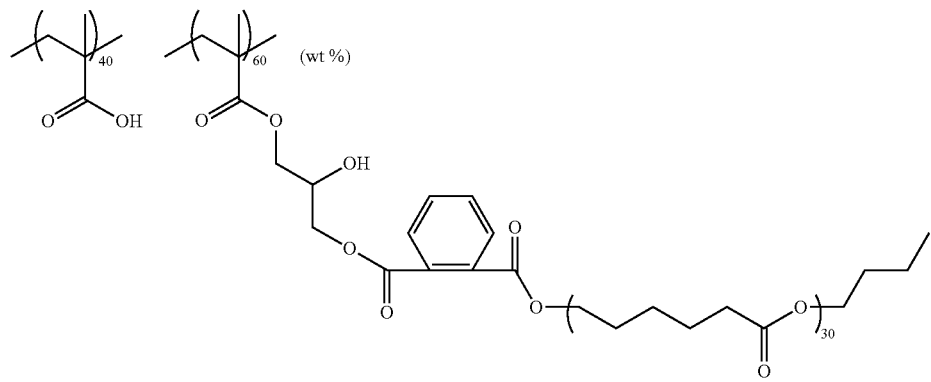
(Exemplified Compound 4)
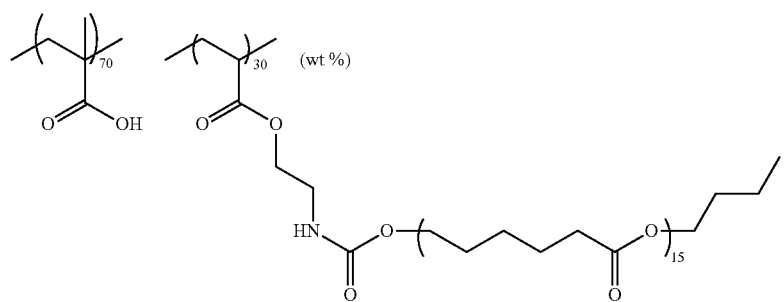
(Exemplified Compound 5)
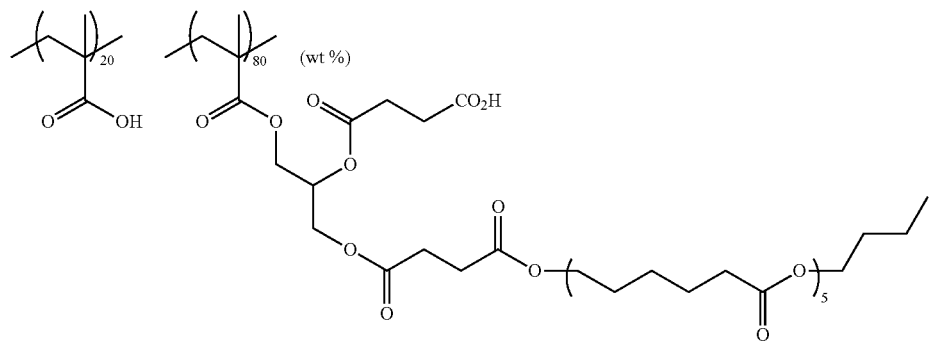
(Exemplified Compound 6)
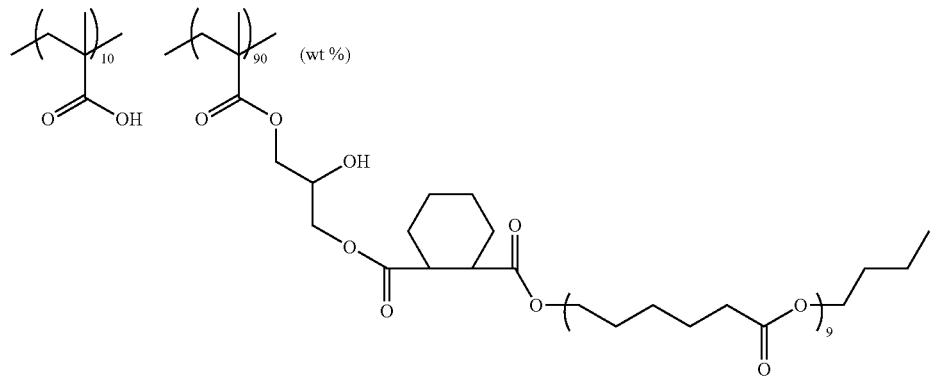

-continued
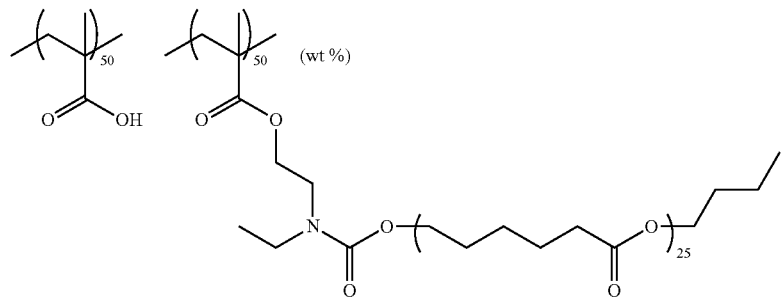
(Exemplified Compound 7)
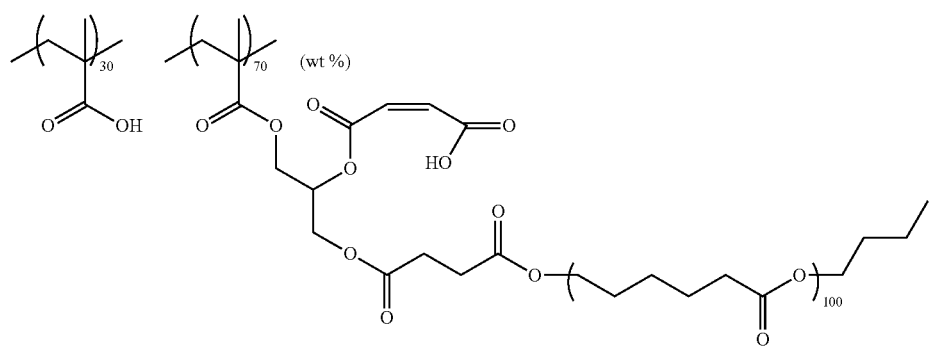
(Exemplified Compound 8)
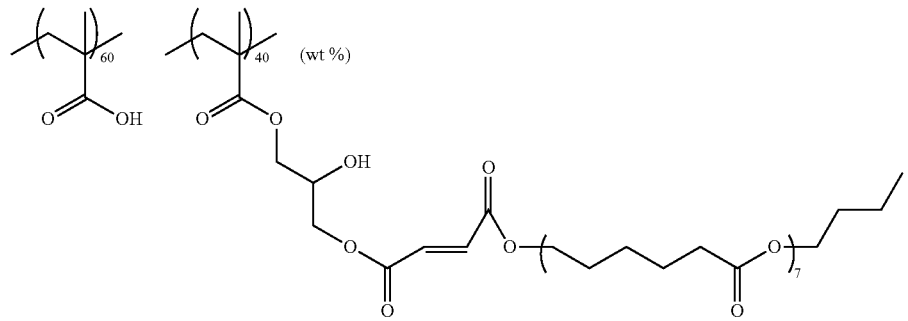
(Exemplified Compound 9)
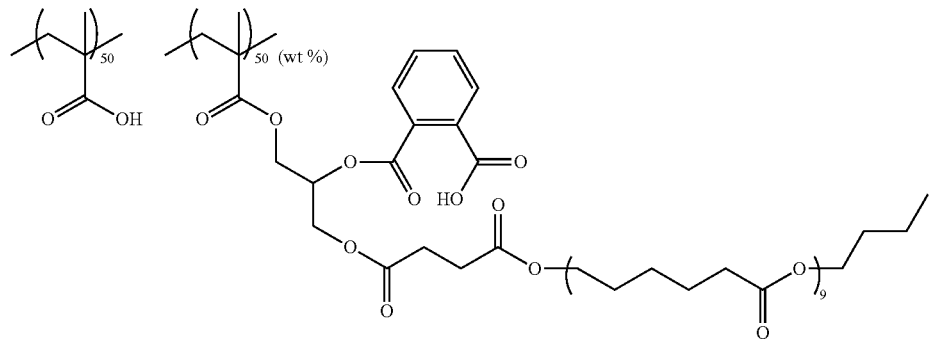
(Exemplified Compound 10)

(Exemplified Compound 11)
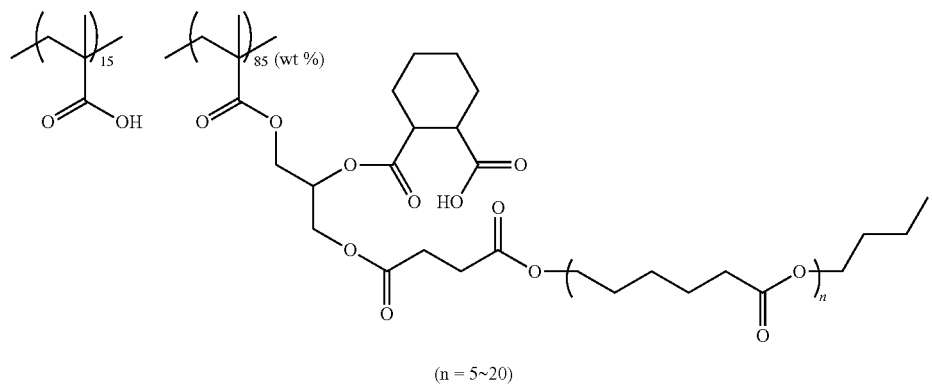
(n = 5~20)
(Exemplified Compound 12)
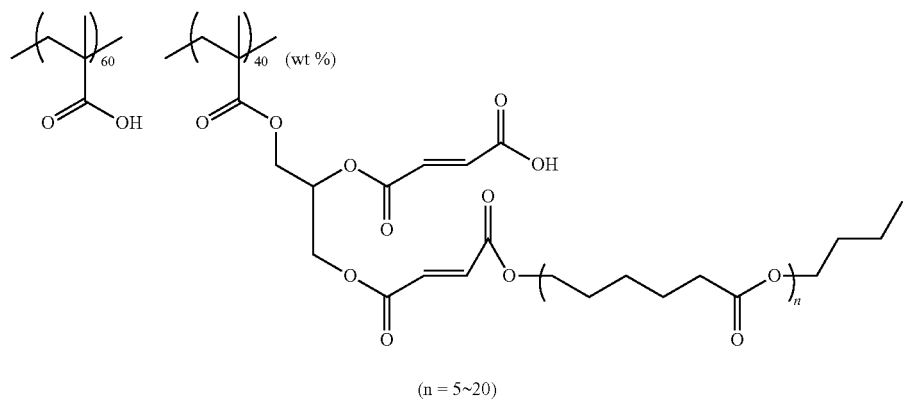
(n = 5~20)
(Exemplified Compound 13)
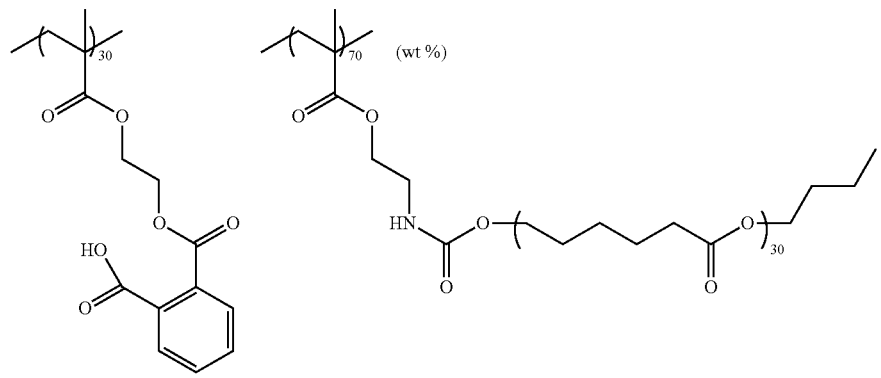
(Exemplified Compound 14)             (Exemplified Compound 15)
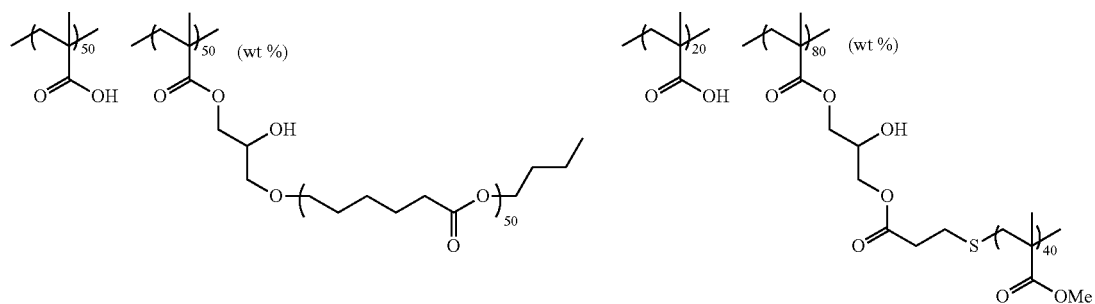

(Exemplified Compound 16)
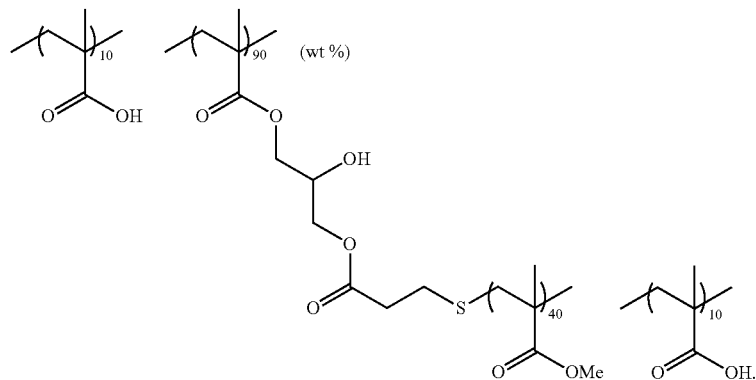
(Exemplified Compound 20)
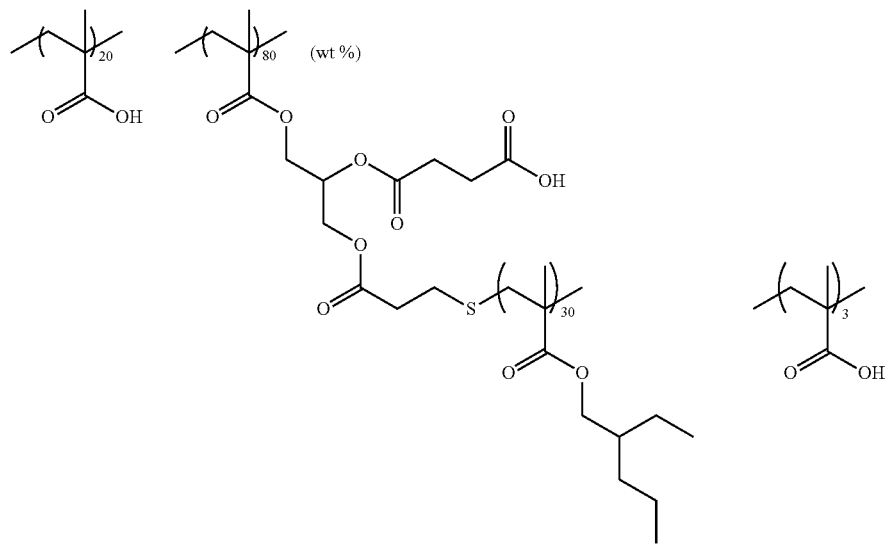
(Exemplified Compound 21) (Exemplified Compound 22)
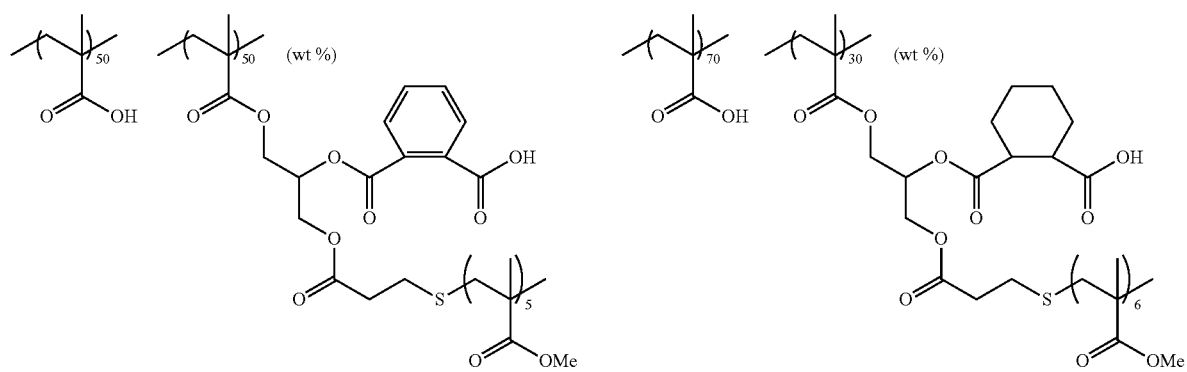

-continued
(Exemplified Compound 23)
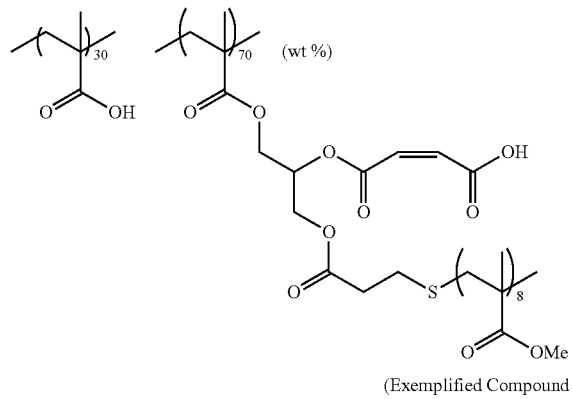
(Exemplified Compound 24)
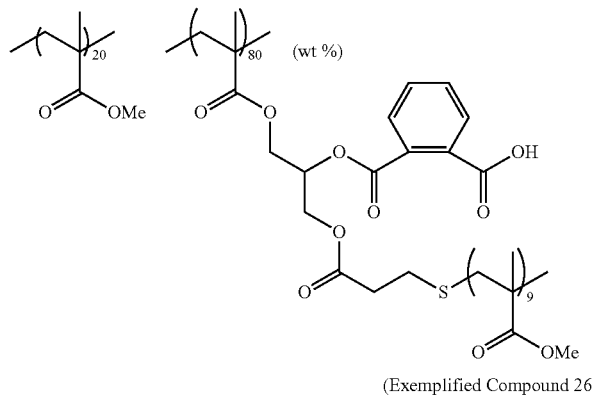
(Exemplified Compound 25)
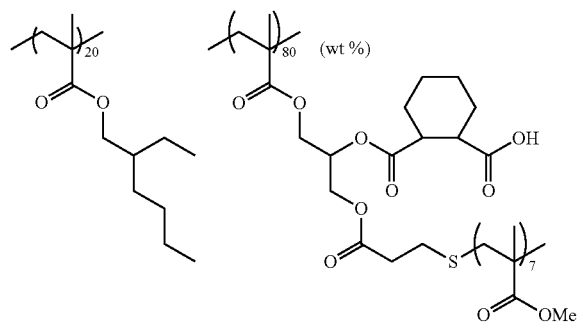
(Exemplified Compound 26)
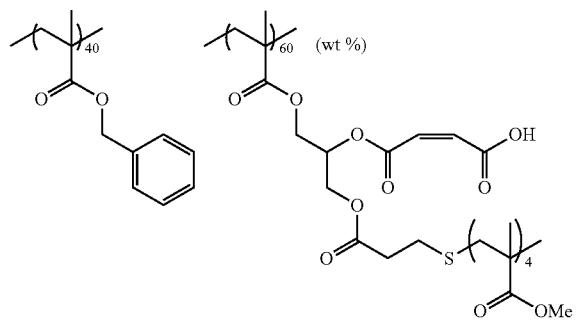
(Exemplified Compound 27)
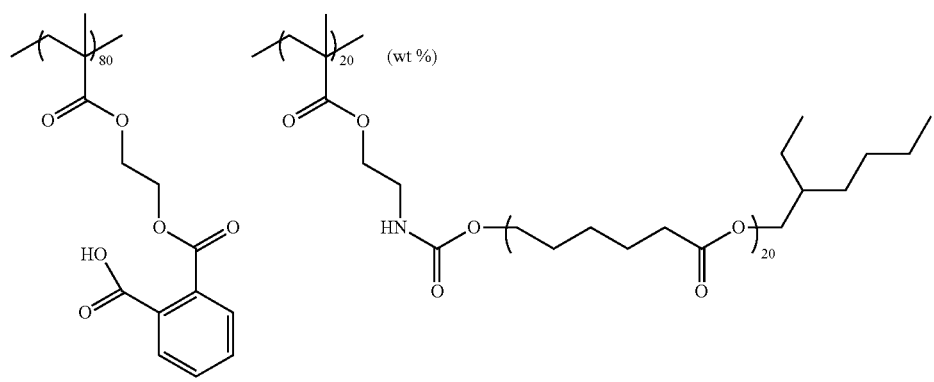
(Exemplified Compound 28)
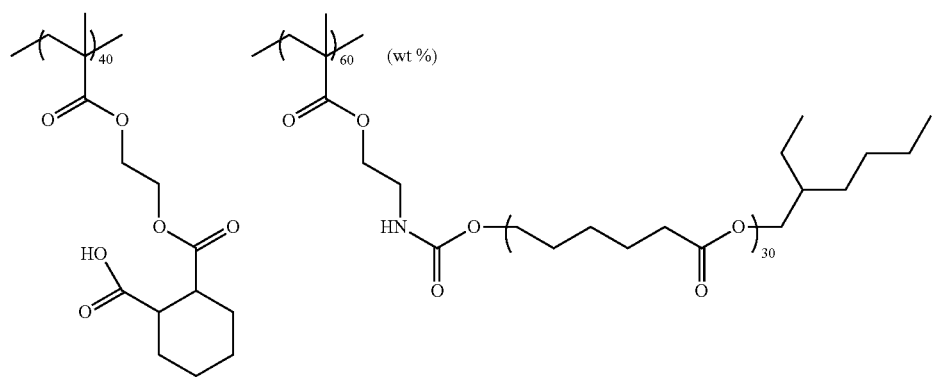

(Exemplified Compound 29)
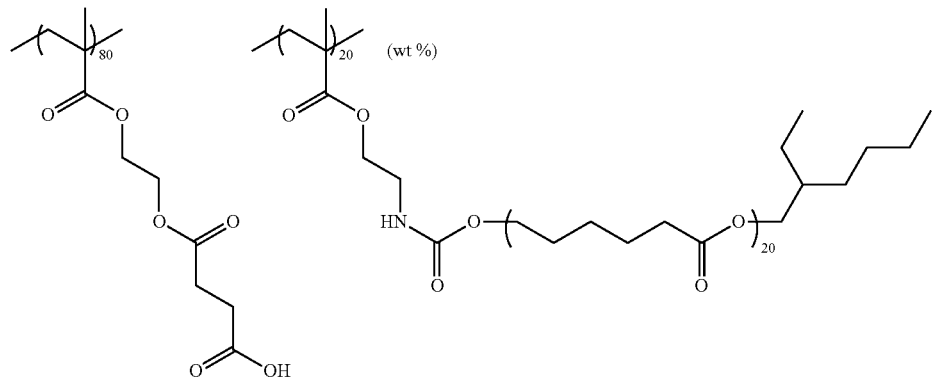
(Exemplified Compound 30)
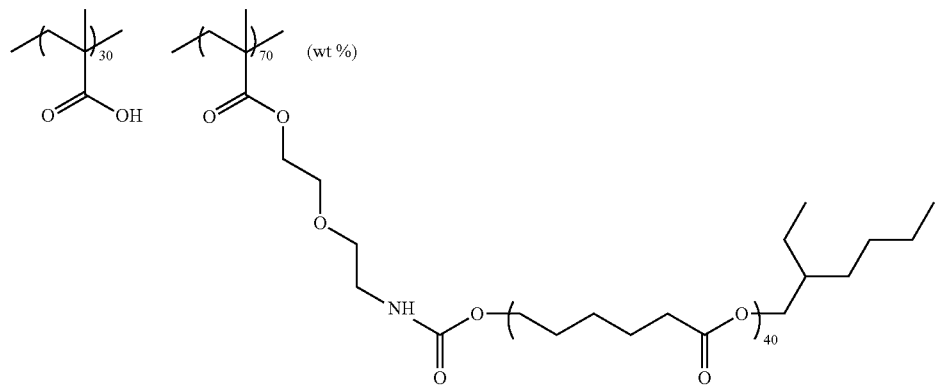
(Exemplified Compound 31)
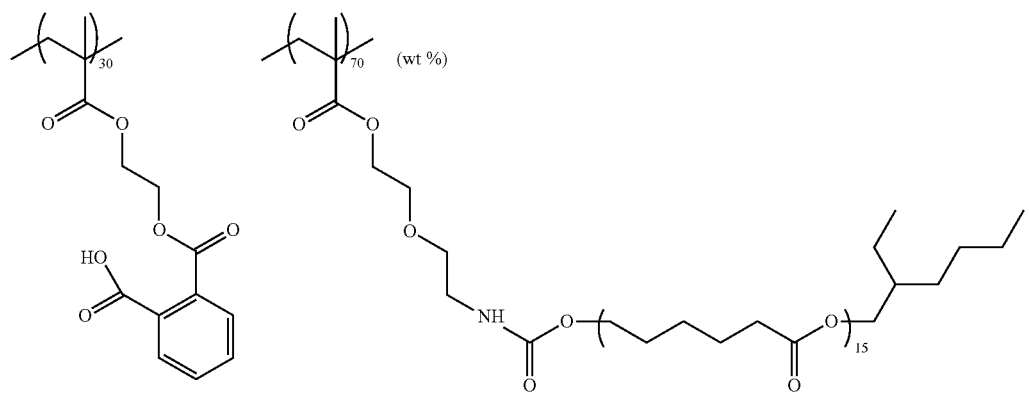
(Exemplified Compound 32)
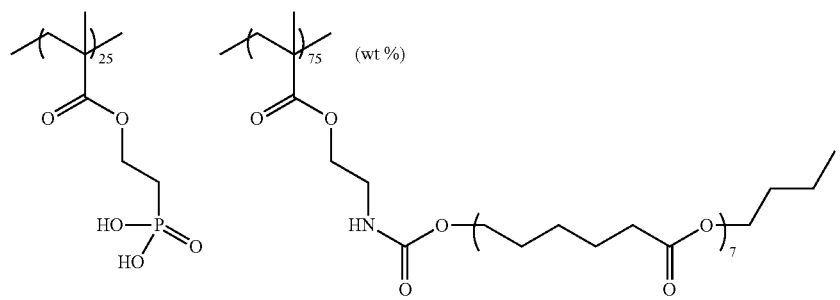

-continued
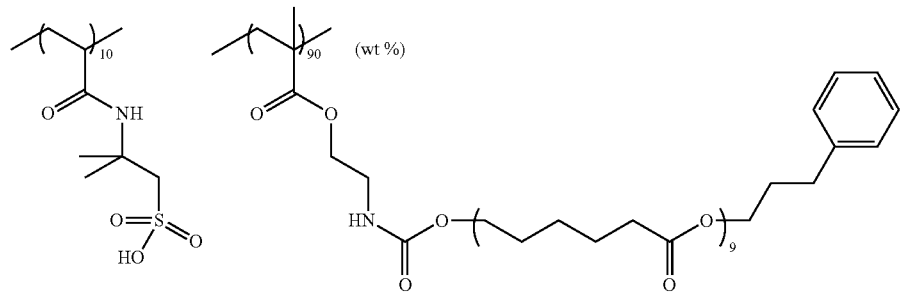
(Exemplified Compound 33)
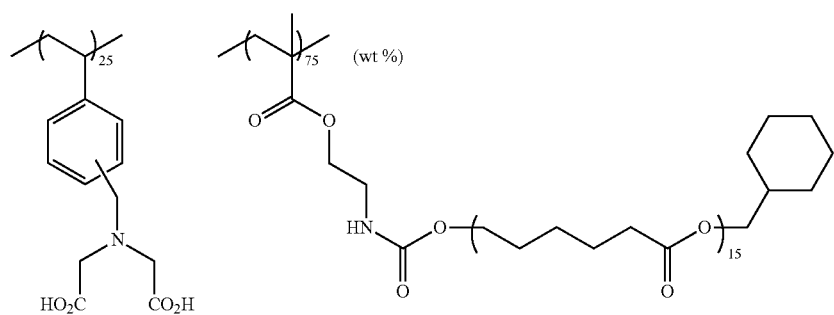
(Exemplified Compound 34)
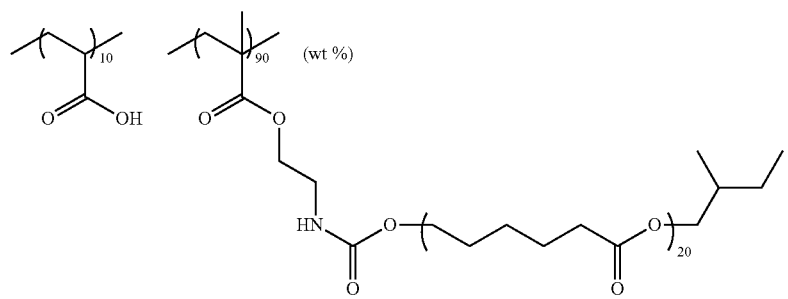
(Exemplified Compound 35)
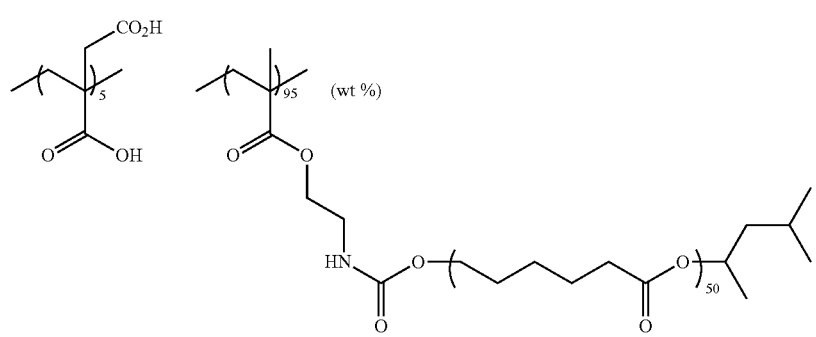
(Exemplified Compound 36)

-continued
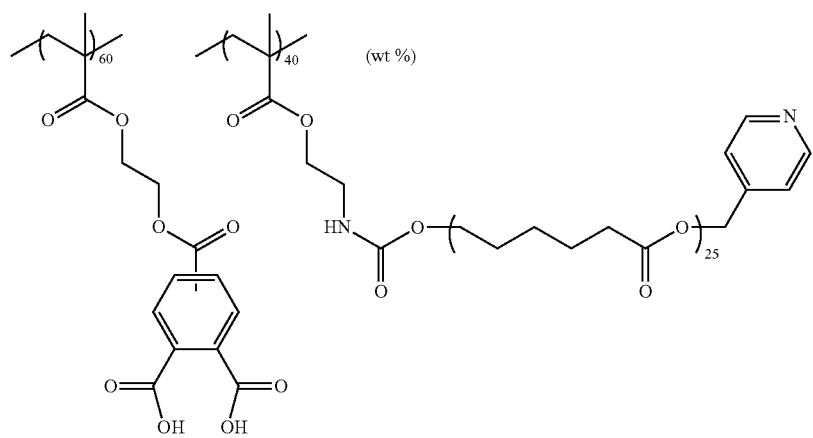
(Exemplified Compound 37)
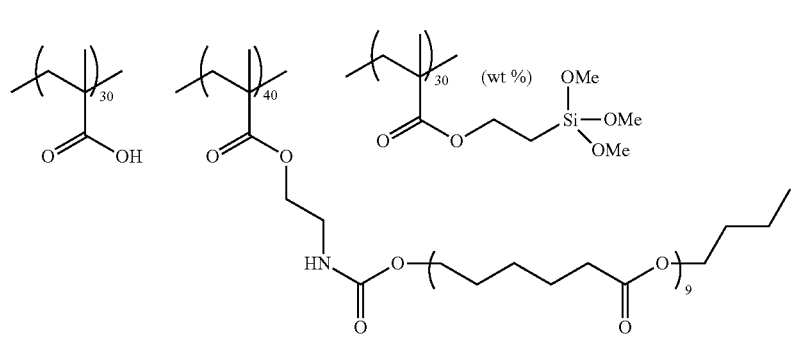
(Exemplified Compound 38)
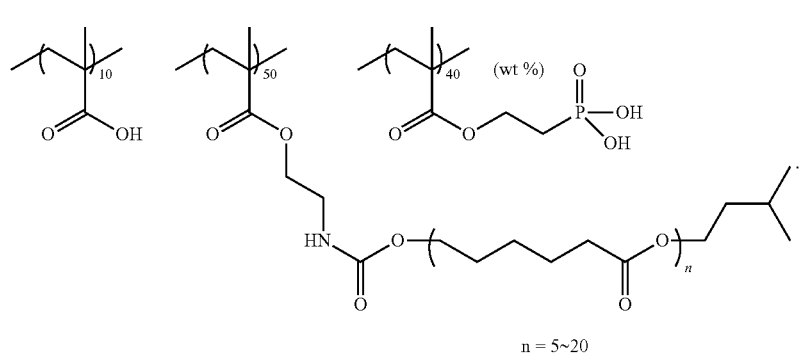
n = 5~20
(Exemplified Compound 39)
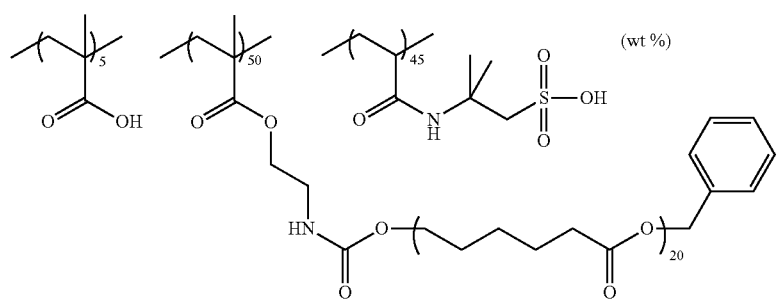
(Exemplified Compound 40)

-continued
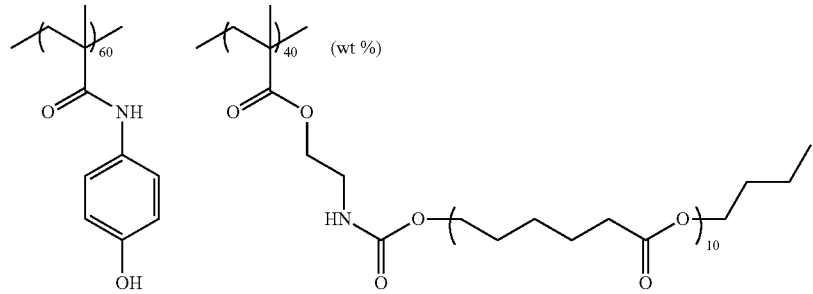
(Exemplified Compound 41)
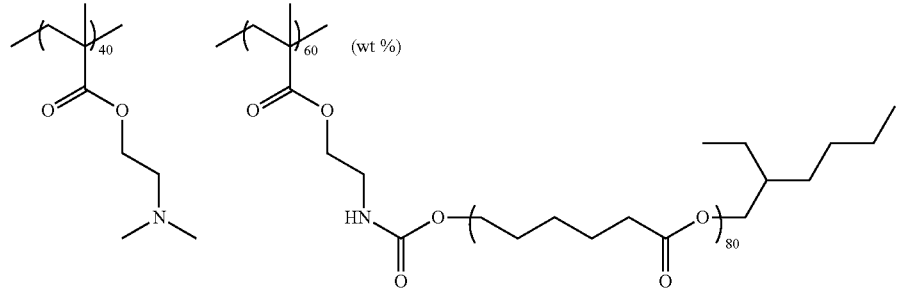
(Exemplified Compound 42)
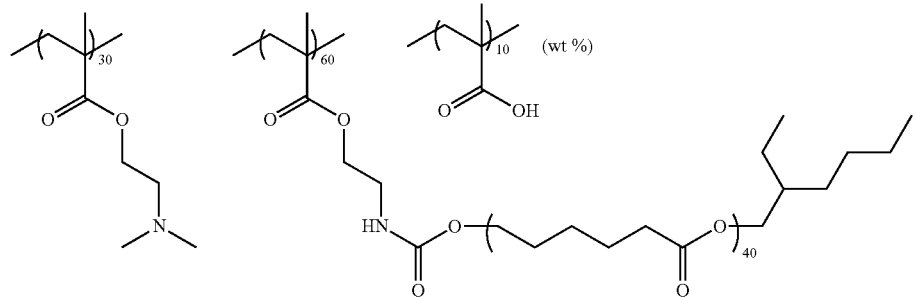
(Exemplified Compound 43)
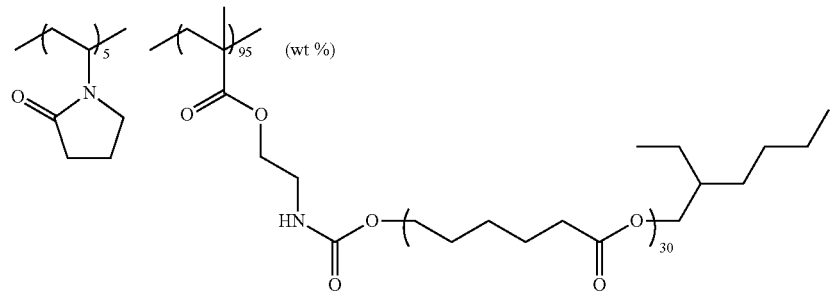
(Exemplified Compound 44)
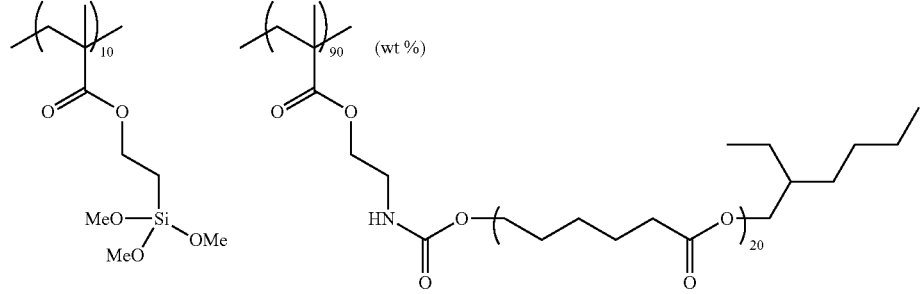
(Exemplified Compound 45)

(Exemplified Compound 46)
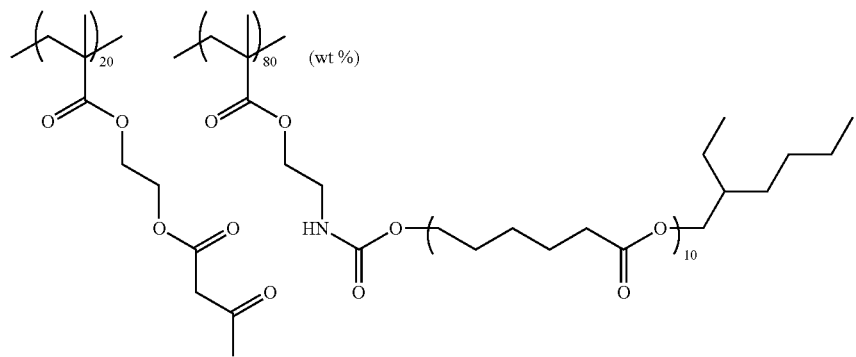
(Exemplified Compound 47) (Exemplified Compound 48)
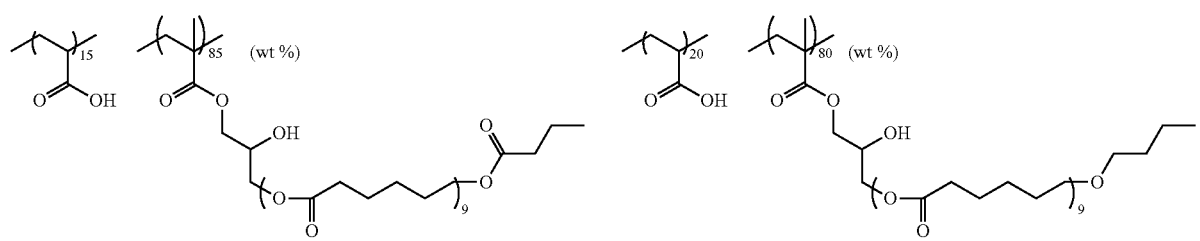
(Exemplified Compound 49) (Exemplified Compound 50)
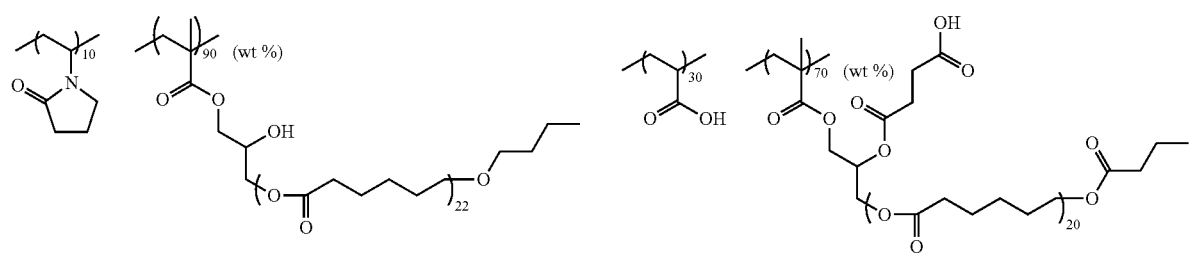
(Exemplified Compound 51)
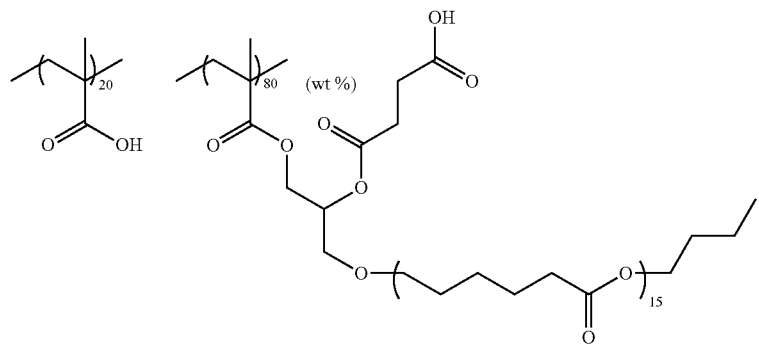

(Exemplified Compound 52)
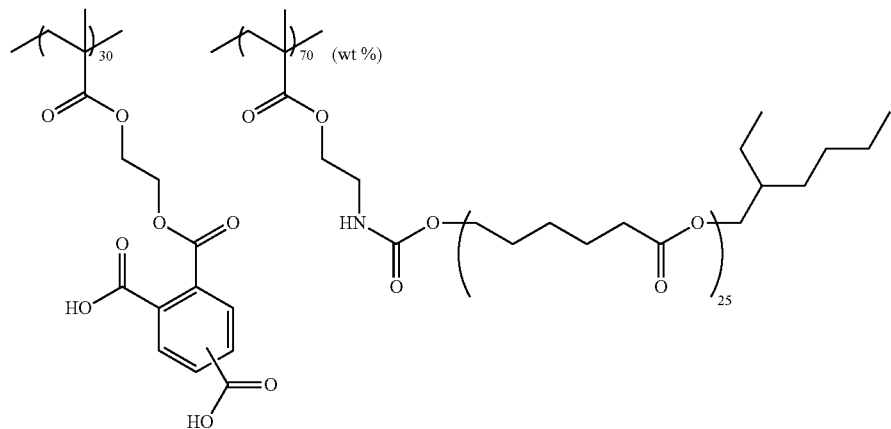
(Exemplified Compound 53)
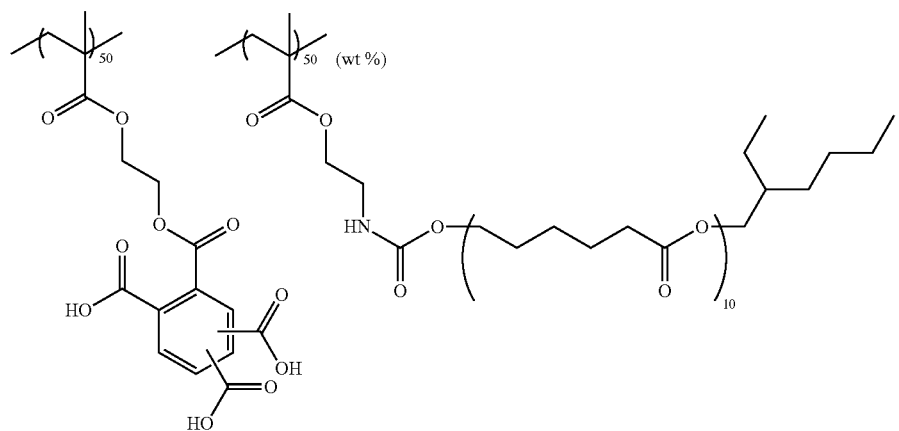
(Exemplified Compound 54)
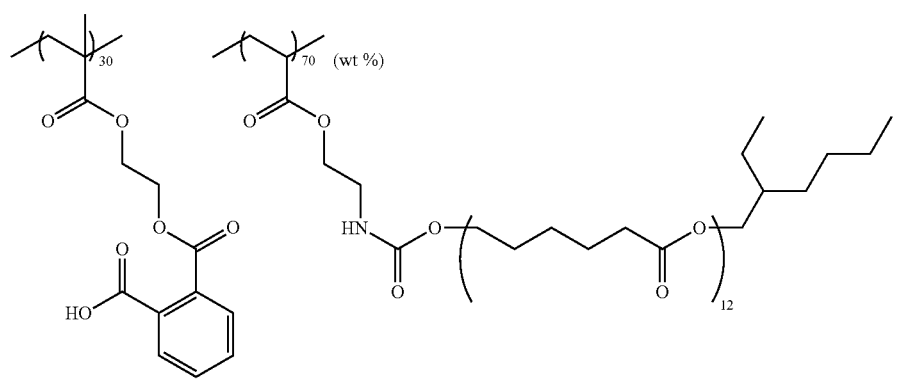
(Exemplified Compound 55)
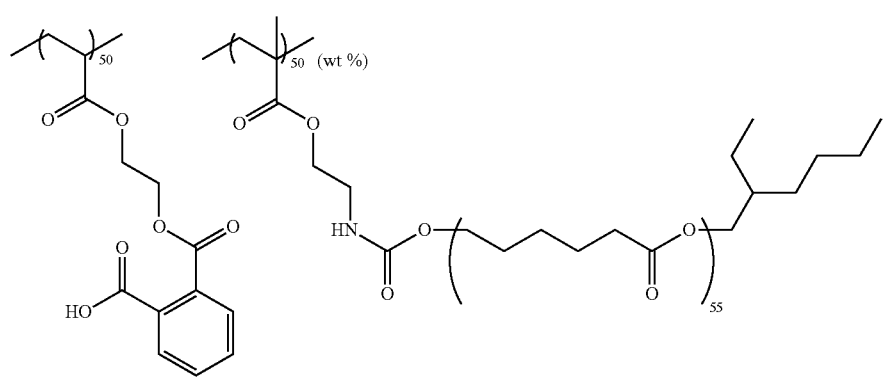

(Exemplified Compound 56)
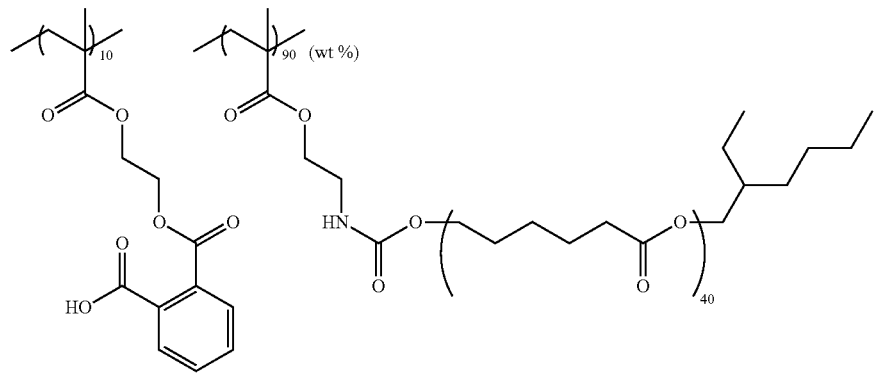
(Exemplified Compound 57)
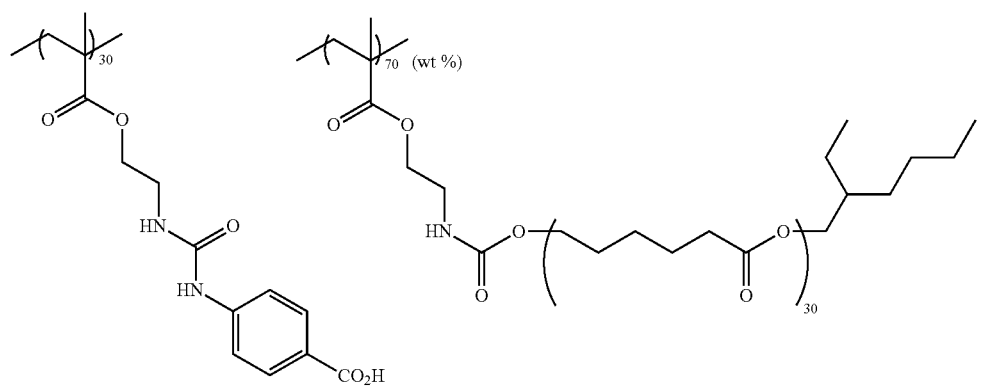
(Exemplified Compound 58)
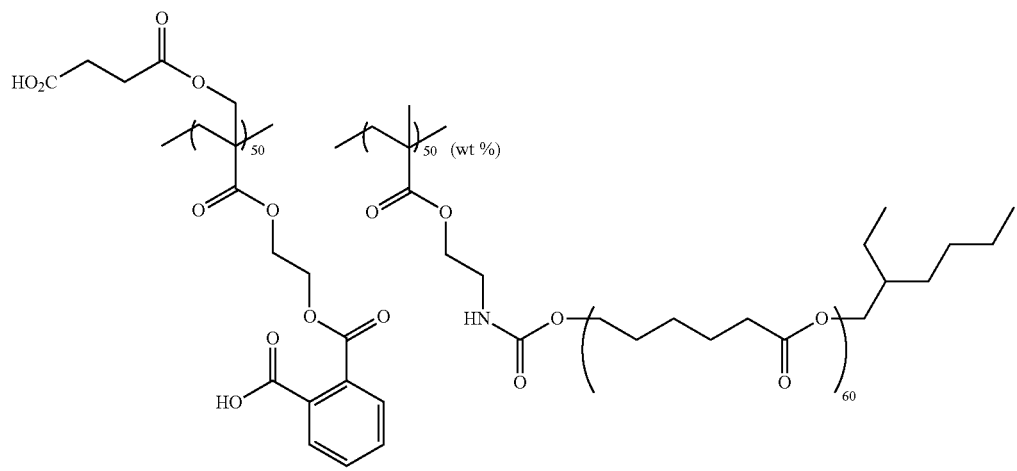
(Exemplified Compound 59)
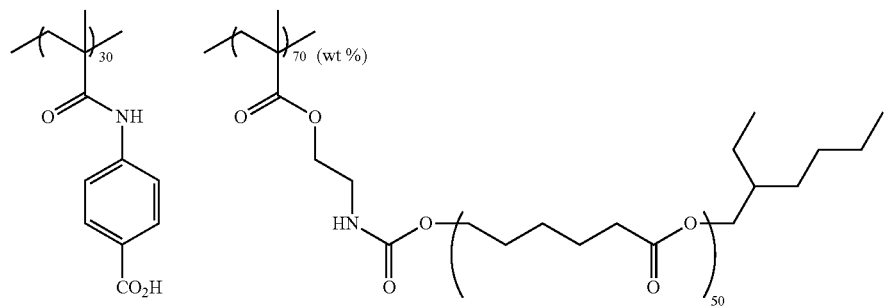

(Exemplified Compound 60)
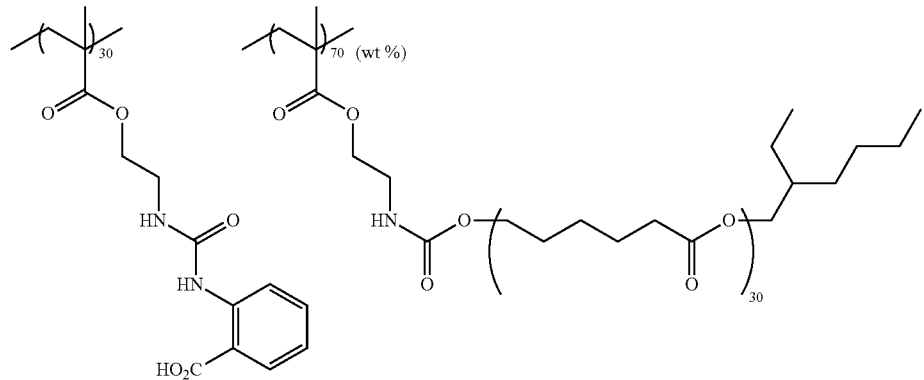
(Exemplified Compound 61)
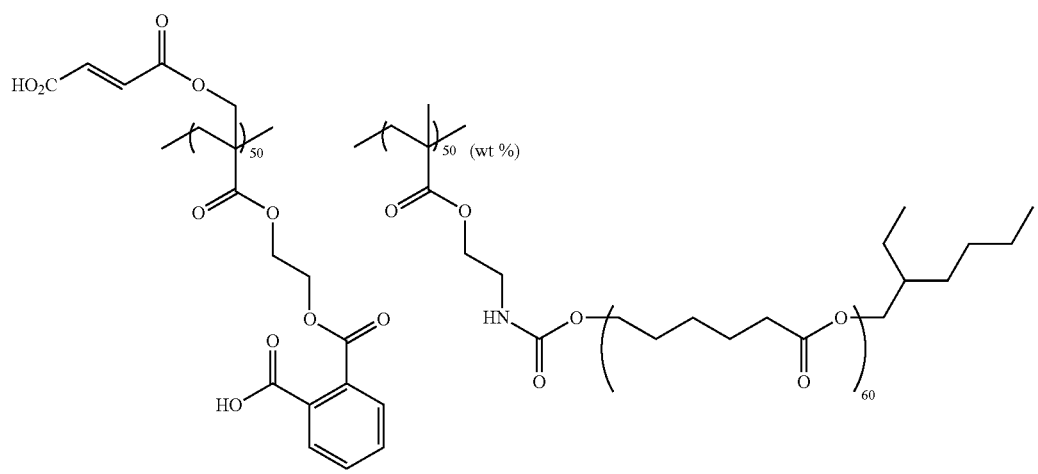
(Exemplified Compound 62)
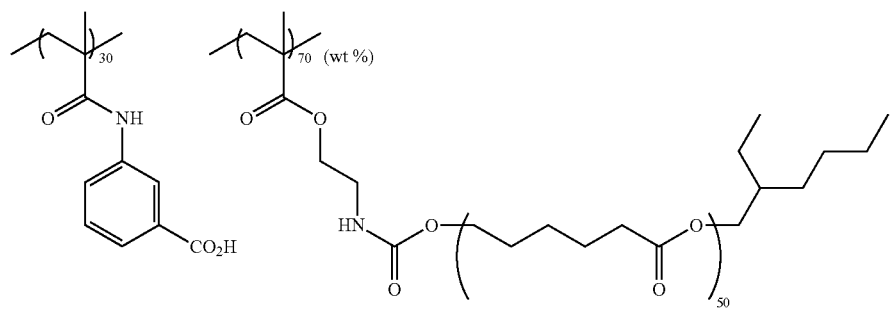
(Exemplified Compound 63)
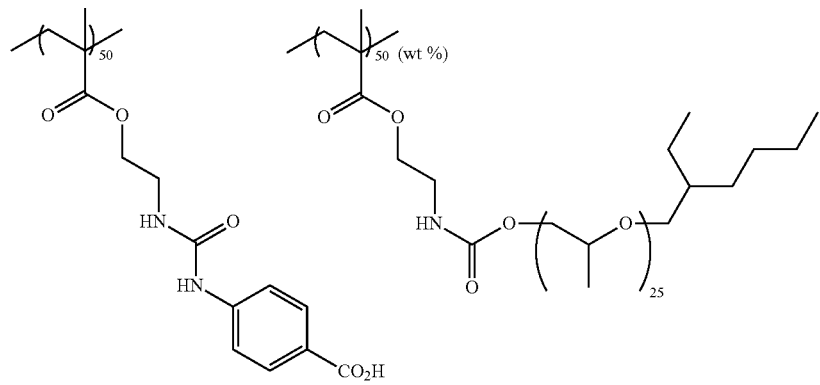

(Exemplified Compound 64)
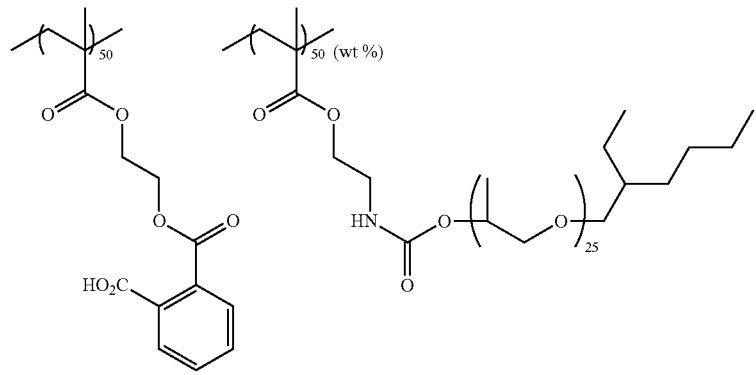
(Exemplified Compound 65) (Exemplified Compound 66)
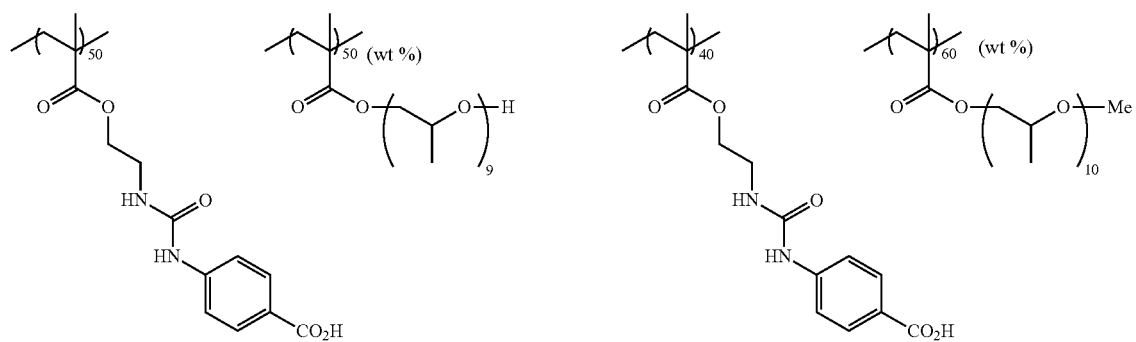
(Exemplified Compound 67)
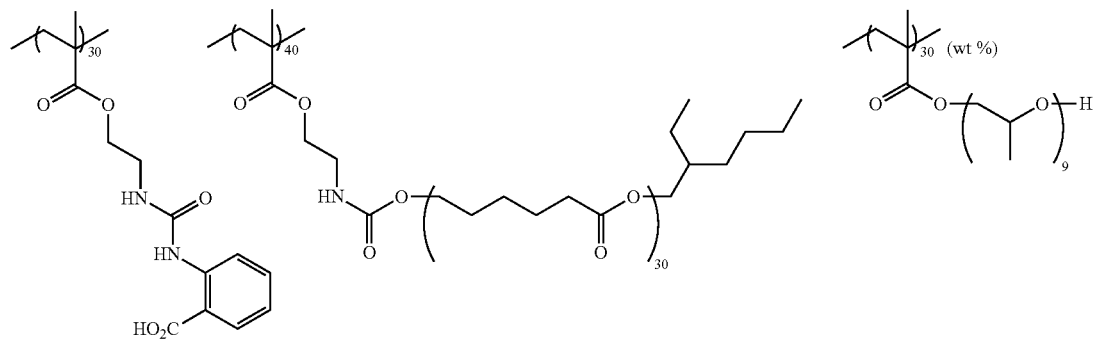
(Exemplified Compound 68)
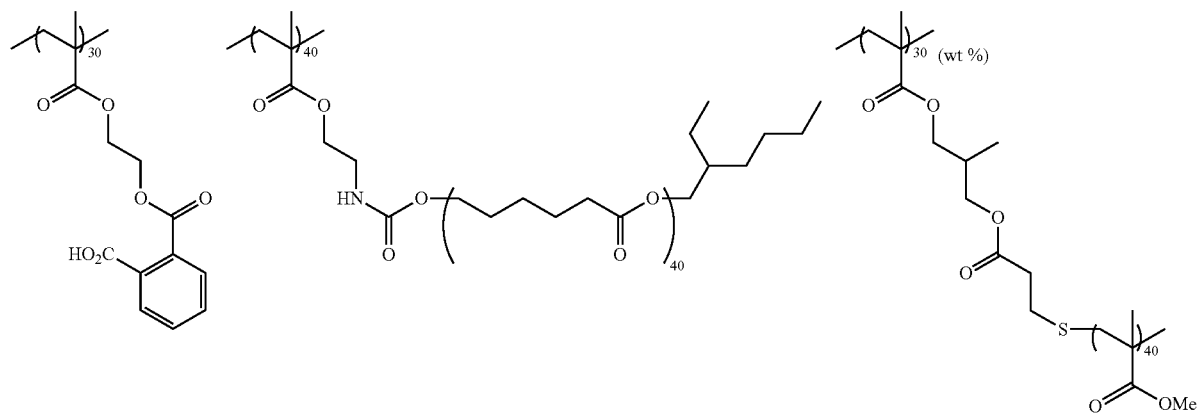

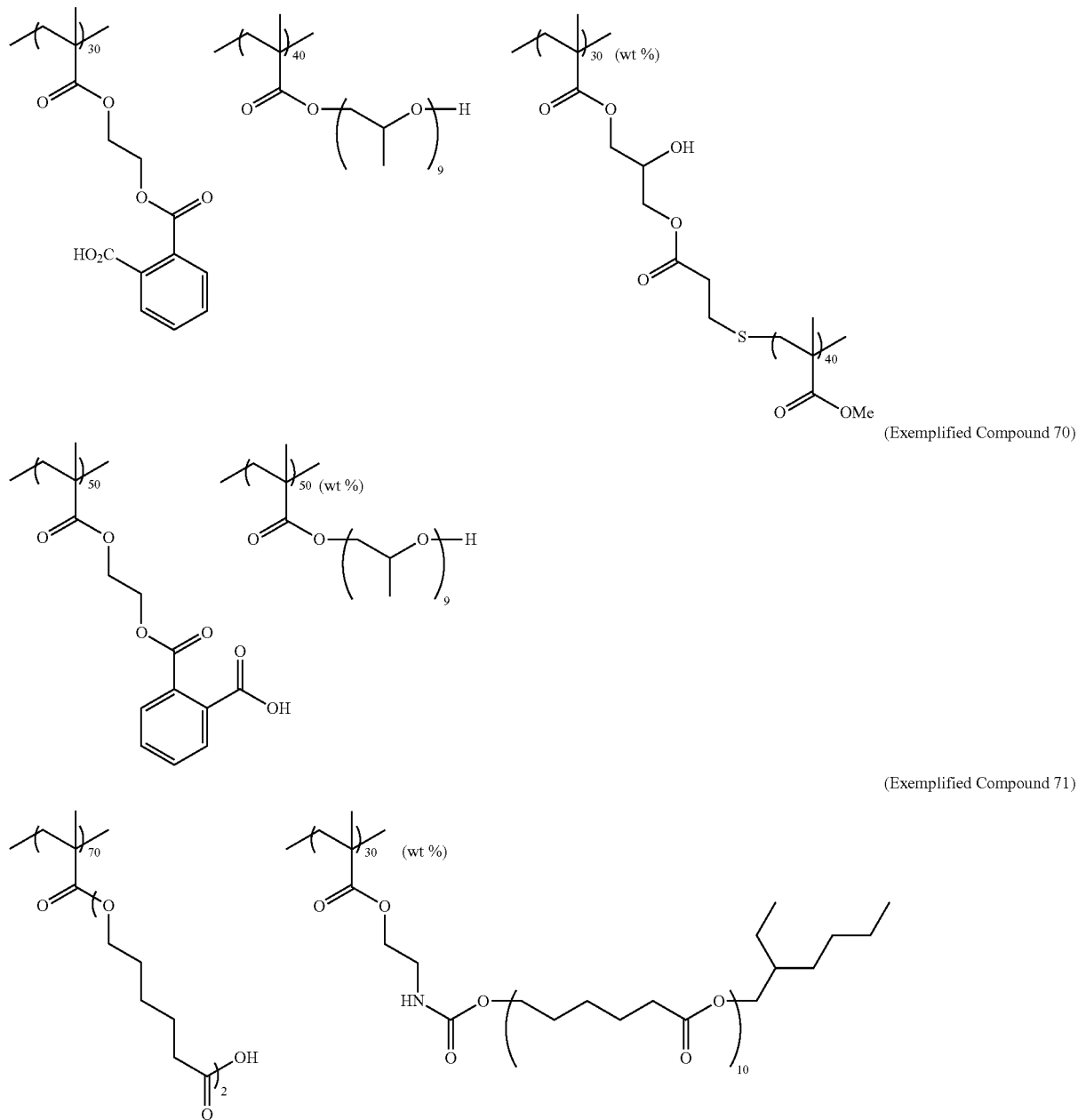

(Exemplified Compound 69)

(Exemplified Compound 70)

(Exemplified Compound 71)

In the case of using the dispersant, from the standpoint of enhancing the dispersibility, it is preferred to prepare a dispersion composition of the inorganic fine particle and the dispersant by using an appropriate solvent and blend the dispersion composition in the photosensitive transparent composition.

The photosensitive transparent composition may or may not contain the dispersant, but in the case of containing the dispersant, the content thereof in the dispersion composition is preferably from 1 to 90 mass %, more preferably from 3 to 80 mass %, still more preferably from 4 to 40 mass %, based on the entire solid content by mass of the inorganic fine particle in the dispersion composition.

[6] (F) Organic Solvent

The photosensitive transparent composition of the present invention may be generally formed using an organic solvent. Basically, the organic solvent is not particularly limited as long as the solubility of each component and the coatability of the colored curable composition are satisfied, but the organic solvent is preferably selected by taking into consideration the solubility of alkali-soluble resin, the coatability and the safety in particular.

Preferred examples of the organic solvent include esters such as ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetate (e.g., methyl oxyacetate, ethyl oxyacetate, butyl oxyacetate (e.g., methyl methoxyacetate, ethyl methoxyacetate, butyl methoxyacetate, methyl ethoxyacetate, ethyl ethoxyacetate)), 3-oxypropionic acid alkyl esters (e.g., methyl 3-oxypropionate, ethyl 3-oxypropionate (e.g., methyl 3-methoxypropionate, ethyl 3-methoxypropionate, methyl 3-ethoxypropionate, ethyl 3-ethoxypropionate)), 2-oxypropionic acid alkyl esters (e.g., methyl 2-oxypropionate, ethyl 2-oxypropionate, propyl 2-oxypropionate (e.g., methyl 2-methoxypropionate, ethyl 2-methoxypropionate, propyl 2-methoxypropionate, methyl 2-ethoxypropionate, ethyl 2-ethoxypropionate)), methyl 2-oxy-2-methylpropionate, ethyl 2-oxy-2-methylpropionate (e.g., methyl 2-methoxy-2-methylpropionate, ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate; ketones such as methyl ethyl ketone, cyclohexanone, 2-heptanone and 3-heptanone; and aromatic hydrocarbons such as toluene and xylene.

From the standpoint of, for example, improving the solubility of the alkali-soluble resin or the coated surface profile, an embodiment of mixing two or more of these organic solvents is also preferred. In this case, a mixed solvent composed of two or more solvents selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether and propylene glycol methyl ether acetate, is more preferred.

In view of coatability, the content of the organic solvent in the photosensitive transparent composition is preferably an amount to give a composition having an entire solid content concentration of 5 to 80 mass %, more preferably from 5 to 60 mass %, still more preferably from 10 to 50 mass %.

[7] Additives

In the photosensitive transparent composition of the present invention, additives such as surfactant, adherence accelerator, polymerization inhibitor, ultraviolet absorber, antioxidant and aggregation inhibitor may be added within the range not impairing the characteristics (e.g., heat resistance, mechanical strength, coatability, adherence) of the film obtained using the composition.

<Surfactant>

From the standpoint of more enhancing the coatability, various surfactants may be added to the photosensitive transparent composition of the present invention. As the surfactant, various surfactants such as fluorine-containing surfactant, nonionic surfactant, cationic surfactant, anionic surfactant and silicone-containing surfactant may be used.

In particular, when the photosensitive transparent composition of the present invention contains a fluorine-containing surfactant, the liquid characteristics (particularly fluidity) of a coating solution prepared is more enhanced, so that the coating thickness uniformity or the liquid saving can be more improved.

That is, in the case of forming a film by using a coating solution to which the photosensitive transparent composition containing a fluorine-containing surfactant is applied, the interface tension between the coating surface and the coating solution is reduced, whereby wettability to the coating surface is improved and the coatability on the coating surface is enhanced. This is effective in that even when a thin film of about several µm is formed with a small liquid volume, a film less suffering thickness unevenness and having a uniform thickness can be more suitably performed.

The fluorine content in the fluorine-containing surfactant is preferably from 3 to 40 mass %, more preferably from 5 to 30 mass %, still more preferably from 7 to 25 mass %. The fluorine-containing surfactant having a fluorine content in the range above is effective in view of thickness uniformity of the coated film and liquid saving and also exhibits good solubility in the photosensitive transparent composition.

Examples of the fluorine-containing surfactant include Megaface F171, Megaface F172, Megaface F173, Megaface F176, Megaface F177, Megaface F141, Megaface F142, Megaface F143, Megaface F144, Megaface R30, Megaface F437, Megaface F475, Megaface F479, Megaface F482, Megaface F554, Megaface F780, Megaface F781 (all produced by DIC Corp.), Florad FC430, Florad FC431, Florad FC171 (all produced by Sumitomo 3M Ltd.), Surflon S-382, Surflon SC-101, Surflon SC-103, Surflon SC-104, Surflon SC-105, Surflon SC-1068, Surflon SC-381, Surflon SC-383, Surflon S393, Surflon KH-40 (all produced by Asahi Glass Co., Ltd.), and Solsperse 20000 (produced by The Lubrizol Corporation).

Specific examples of the nonionic surfactant include glycerol, trimethylolpropane, trimethylolethane, their ethoxylates and propoxylates (e.g. glycerol propoxylate, glycerin ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid ester (such as Pluronic L10, L31, L61, L62, 10R5, 17R2, 25R2, Tetronic 304, 701, 704, 901, 904 and 150R1, all produced by BASF).

Specific examples of the cationic surfactant include a phthalocyanine derivative (EFKA-745, trade name, produced by Morishita Sangyo K.K.), organosiloxane polymer KP341 (produced by Shin-Etsu Chemical Co., Ltd.), (meth)acrylic acid-based (co)polymer Polyflow No. 75, No. 90, No. 95 (produced by Kyoeisha Chemical Co., Ltd.), and W001 (produced by Yusho Co., Ltd.).

Specific examples of the anionic surfactant include W004, W005 and W017 (all produced by Yusho Co., Ltd.).

Examples of the silicone-containing surfactant include "Toray Silicone DC3PA", "Toray Silicone SH7PA", "Toray Silicone DC11PA", "Toray Silicone SH21PA", "Toray Silicone SH28PA", "Toray Silicone SH29PA", "Toray Silicone SH30PA", "Toray Silicone SH8400" (all produced by Dow Corning Toray Silicone Co., Ltd.), "TSF-4440", "TSF-4300", "TSF-4445", "TSF-4460", "TSF-4452" (all produced by Momentive Performance Materials), "KP341", "KF6001", "KF6002" (all produced by Shin-Etsu Silicone Co., Ltd.), "BYK307", "BYK323", and BYK330 (produced by Byk Chemie).

Only one surfactant may be used, or two or more kinds of surfactants may be combined.

The photosensitive transparent composition may or may not contain a surfactant but in the case of containing a surfactant, the amount added thereof is preferably from 0.001 to 2.0 mass %, more preferably from 0.005 to 1.0 mass %, based on the entire mass of the photosensitive transparent composition.

<Adherence Accelerator>

The photosensitive transparent composition of the present invention may contain any adherence accelerator within the range not impairing the object of the present invention. Examples of the adherence accelerator include 3-glycidyloxypropyltrimethoxysilane, 1-methacryloxypropylmethyldimethoxysilane, 3-aminoglycidyloxypropyltriethoxysilane, 3-glycidyloxypropylmethyldimethoxysilane, and 3-aminopropyltrimethoxysilane. In addition, the compounds described in paragraph [0048] of JP-A-2008-243945 may be used.

The photosensitive transparent composition of the present invention may or may not contain an adherence accelerator and in the case of containing an adherence accelerator, the preferred amount used thereof is not particularly limited but usually, is preferably 10 mass % or less, more preferably from 0.005 to 5 mass %, based on the entire solid content in the composition.

<Polymerization Inhibitor>

In the photosensitive transparent composition of the present invention, a small amount of a polymerization inhibitor is preferably added so as to inhibit unnecessary thermal polymerization of a polymerizable compound during production or storage of the photosensitive transparent composition.

Examples of the polymerization inhibitor which can be used in the present invention include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), and N-nitrosophenylhydroxyamine cerous salt.

The amount of the polymerization inhibitor added is preferably from about 0.01 to about 5 mass % based on the mass of the entire composition.

<Ultraviolet Absorber>

The photosensitive transparent composition of the present invention preferably contains an ultraviolet absorber, and thanks to the ultraviolet absorber, a pattern having a more excellent (precise) profile can be obtained.

As the ultraviolet absorber, salicylate-based, benzophenone-based, benzotriazole-based, substituted acrylonitrile-based and triazine-based ultraviolet absorbers may be used.

Examples of the salicylate-based ultraviolet absorber include phenyl salicylate, p-octylphenyl salicylate and p-tert-butylphenyl salicylate. Examples of the benzophenone-based ultraviolet absorber include 2,2'-dihydroxy-4-methoxybenzophenone, 2,2'-dihydroxy-4,4'-dimethoxybenzophenone, 2,2',4,4'-tetrahydroxybenzophenone, 2-hydroxy-4-methoxybenzophenone, 2,4-dihydroxybenzophenone, and 2-hydroxy-4-octoxybenzophenone. Examples of the benzotriazole-based ultraviolet absorber include 2-(2'-hydroxy-3',5'-di-tert-buylphenol)-5-chlorobenzotriazole, 2-(2'-hydroxy-3'-tert-butyl-5'-methylphenyl)-5-chlorobenzotriazole, 2-(2'-hydroxy-3'-tert-amyl-5'-isobutylphenyl)-5-chlorobenzotriazole, 2-(2'-hydroxy-3'-isobutyl-5'-methylphenyl)-5-chlorobenzotriazole, 2-(2'-hydroxy-3'-isobutyl-5'-propylphenyl)-5-chlorobenzotriazole, 2-(2'-hydroxy-3',5'-di-tert-butylphenyl)benzotriazole, 2-(2'-hydroxy-5'-methylphenyl)benzotriazole, and 2-[2'-hydroxy-5'-(1,1,3,3-tetramethyl)phenyl]benzotriazole.

Examples of the substituted acrylonitrile-based ultraviolet absorber include ethyl 2-cyano-3,3-diphenylacrylate and 2-ethylhexyl 2-cyano-3,3-diphenylmethacrylate. Examples of the triazine-based ultraviolet absorber include a mono(hydroxyphenyl)triazine compound such as 2-[4-[(2-hydroxy-3-dodecyloxypropyl)oxy]-2-hydroxyphenyl]-4,6-bis(2,4-dimethylphenyl)-1,3,5-triazine, 2-[4-[(2-hydroxy-3-tridecyloxypropyl)oxy]-2-hydroxyphenyl]-4,6-bis(2,4-dimethylphenyl)-1,3,5-triazine, and 2-(2,4-dihydroxyphenyl)-4,6-bis(2,4-dimethylphenyl)-1,3,5-triazine; a bis(hydroxyphenyl)triazine compound such as 2,4-bis(2-hydroxy-4-propyloxyphenyl)-6-(2,4-dimethylphenyl)-1,3,5-triazine, 2,4-bis(2-hydroxy-3-methyl-4-propyloxyphenyl)-6-(4-methylphenyl)-1,3,5-triazine, and 2,4-bis(2-hydroxy-3-methyl-4-hexyloxyphenyl)-6-(2,4-dimethylphenyl)-1,3,5-triazine; and a tris(hydroxyphenyl)triazine compound such as 2,4-bis(2-hydroxy-4-butoxyphenyl)-6-(2,4-dibutoxyphenyl)-1,3,5-triazine, 2,4,6-tris(2-hydroxy-4-octyloxyphenyl)-1,3,5-triazine, and 2,4,6-tris[2-hydroxy-4-(3-butoxy-2-hydroxypropyloxy)phenyl]-1,3,5-triazine.

Specific examples of the ultraviolet absorber are illustrated below, but the present invention is not limited thereto.

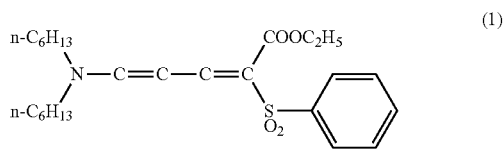

(1)

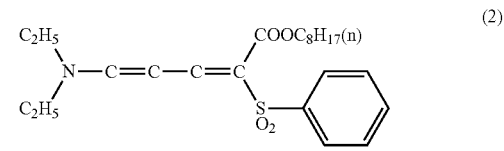

(2)

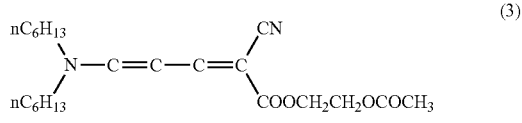

(3)

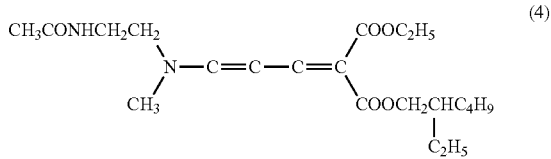

(4)

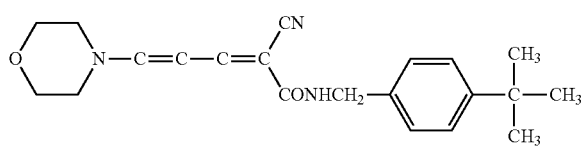

(5)

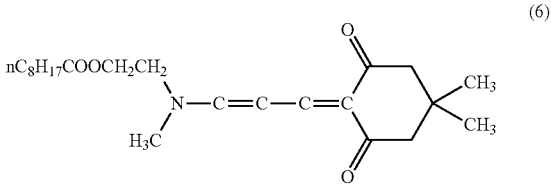

(6)

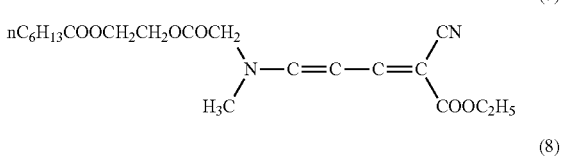

(7)

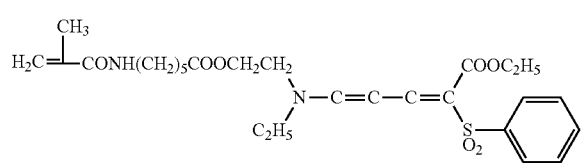

(8)

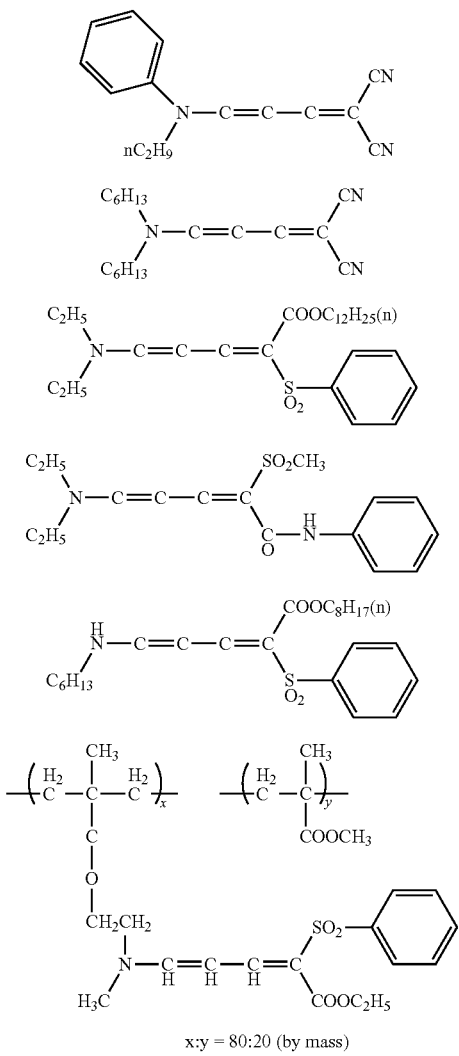

In the present invention, one of these various ultraviolet absorbers may be used alone, or two or more thereof may be used in combination.

The photosensitive composition may or may not contain an ultraviolet absorber but in the case of containing an ultraviolet absorber, the content thereof is preferably from 0.001 to 5 mass %, more preferably from 0.01 to 3 mass %, based on the entire solid content by mass of the photosensitive transparent composition of the present invention.

In the foregoing pages, respective components of the photosensitive transparent composition of the present invention are described, and the photosensitive composition may be a solution obtained by dissolving the components in the above-described organic solvent or may be a sold material not containing an organic solvent.

As described above, the photosensitive transparent composition of the present invention has a property that the cured film obtained from the photosensitive transparent composition has a refractive index of 1.60 to 1.90 for light at a wavelength of 633 nm.

The physical property that the refractive index for light at a wavelength of 633 nm of the cured film is from 1.60 to 1.90 may be achieved by any means as long as the photosensitive transparent composition contains (A) a photopolymerization initiator, (B) a polymerizable compound and (C) an alkali-soluble resin, but this property is suitably achieved, for example, by adjusting the kind or content of the polymerizable compound (B) and the alkali-soluble resin (C) or by not only incorporating an inorganic fine particle into the photosensitive transparent composition but also adjusting the kind or content of the inorganic fine particle.

In particular, when an inorganic fine particle is incorporated into the photosensitive transparent composition and the inorganic fine particle is an inorganic fine particle containing oxides of one member or two or more members selected from the group consisting of Si, Ti, Zr, Al and Sn, the above-described physical property can be more easily achieved.

The composition of the present invention is a transparent composition, more specifically, a composition having a property such that when a cured film with a thickness of 1 μm is formed from the composition, the light transmittance in the thickness direction of the cured film becomes 90% or more over the entire wavelength region of 400 to 700 nm.

The physical property of the light transmittance above may be achieved by any means as long as the composition contains (A) a photopolymerization initiator, (B) a polymerizable compound and (C) an alkali-soluble resin, but this property is suitably achieved, for example, by adjusting the kind or content of (B) the polymerizable compound and (C) the alkali-soluble resin. In the case where the photosensitive transparent composition of the present invention contains an inorganic fine particle, the physical property of the light transmittance above can be suitably achieved, for example, by adjusting the particle diameter of the inorganic fine particle or by not only adding a dispersant but also adjusting the kind or amount added of the dispersant.

With respect to the composition of the present invention, the light transmittance above being 90% or more over the entire wavelength region of 400 to 700 nm is necessary for the white color filter pixel contained in the color filter to satisfactorily fulfill the function as a white filter pixel (that is, necessary so as to capture an image with high sensitivity in an image sensor).

The light transmittance above is preferably 95% or more, more preferably 99% or more, and most preferably 100%, over the entire wavelength region of 400 to 700 nm.

The composition of the present invention contains substantially no colorant (the content of the colorant is preferably 0 mass % based on the entire solid content of the composition). Incidentally, the above-described inorganic fine particle and ultraviolet absorber are not included in the colorant as used herein.

The photosensitive transparent composition of the present invention is used for a color filter of a solid-state imaging device, more specifically, for a white filter pixel in a color filter of a solid-state imaging device.

In the photosensitive transparent composition of the present invention, the content of metals as impurities is preferably sufficiently small. The metal concentration in the composition can be measured with high sensitivity by ICP-MS or the like. In this case, the content of metals except for transition metals is preferably 300 ppm or less, more preferably 100 ppm or less.

The production method of the photosensitive transparent composition is not particularly limited and in the case of containing an organic solvent, respective components of the composition are added to an organic solvent and stirred, whereby the composition is obtained.

The composition above is preferably used for film formation after removing insoluble matters, gelled components and the like by filtration through a filter. The pore size of the filter used is preferably from 0.05 to 2.0 µm, more preferably from 0.05 to 1.0 µm, and most preferably from 0.05 to 0.5 µm. The material of the filter is preferably polytetrafluoroethylene, polyethylene, polypropylene or nylon, more preferably polytetrafluoroethylene, polyethylene or nylon.

[8] Color Filter of Solid-State Imaging Device and Production Method Thereof

The production method of a color filter of a solid-state imaging device (hereinafter, sometimes referred to as a color filter for a solid-state imaging device) of the present invention includes coating the above-described photosensitive transparent composition for a color filter of a solid-state imaging device of the present invention to form a coated layer (photosensitive transparent composition layer) (hereinafter, sometimes referred to as a "photosensitive transparent composition layer-forming step"), exposing the coated layer (hereinafter, sometimes referred to as an "exposure step"), and developing it to form a pattern, thereby obtaining a cured film as a white filter pixel in a color filter of a solid-state imaging device.

Also, the color filter for a solid-state imaging device of the present invention is a color filter produced by the production method of a color filter for a solid-state imaging device of the present invention.

The color filter for a solid-state imaging device of the present invention is sufficient if it has at least a transparent (white) pattern (white filter pixel) produced by the production method of a color filter for a solid-state imaging device of the present invention. As for the specific form of the color filter for a solid-state imaging device of the present invention, for example, a multicolor color filter form, where the transparent pattern is combined with other colored patterns (for example, a color filter of four or more colors having at least a transparent pattern, a red pattern, a blue pattern and a green pattern), is suitable.

Hereinafter, the color filter for a solid-state imaging device is sometimes simply referred to as a "color filter".

<Photosensitive Transparent Composition Layer-Forming Step>

In the photosensitive transparent composition layer-forming step, the photosensitive transparent composition of the present invention is preferably applied on a support to form the photosensitive transparent composition layer.

As the support usable in this step, for example, a solid-state imaging device substrate where an imaging element (light-receiving element) such as CCD (Charge Coupled Device) and CMOS (Complementary Metal-Oxide Semiconductor) is provided on a substrate (for example, a silicon substrate) may be used.

In the present invention, the transparent pattern may be formed on the imaging element-formed surface side (front surface) or the imaging element non-formed surface side (back surface) of the solid-state imaging device substrate.

A light-shielding film may be provided between respective imaging elements in the solid-state imaging device substrate or on the back surface of the solid state imaging device substrate.

Also, if desired, an undercoat layer may be provided on the support so as to improve adherence to a layer thereabove, prevent diffusion of a substance or flatten the substrate surface.

As for the method to provide the photosensitive transparent composition layer of the present invention on the support, various coating methods such as slit coating, inkjet method, spin coating, cast coating, roll coating and screen printing method can be applied.

The film thickness of the photosensitive transparent composition layer is preferably from 0.1 to 10 µm, more preferably from 0.2 to 5 µm, still more preferably from 0.2 to 3 µm.

The photosensitive transparent composition layer coated on the support may be dried (prebaked) at a temperature of 50 to 140° C. for 10 to 300 seconds by using a hot plate, an oven or the like.

<Exposure Step>

In the exposure step, the photosensitive transparent composition layer formed in the photosensitive transparent composition layer-forming step is, for example, patternwise exposed through a mask having a predetermined pattern by using an exposure apparatus such as stepper.

The radiation (light) usable for exposure means light including, for example, visible light, ultraviolet ray, far ultraviolet ray and X-ray, and in particular, an ultraviolet ray such as g-line and i-line is preferably used (more preferably i-line). The irradiation dose (exposure dose) is preferably from 30 to 1,500 mJ/cm$^2$, more preferably from 50 to 1,000 mJ/cm$^2$, and most preferably from 80 to 500 mJ/cm$^2$.

<Development Step>

Subsequently, an alkali developing treatment is performed, whereby the photosensitive transparent composition layer in the portion not irradiated with light in the exposure step is eluted into an aqueous alkali solution and only a photocured portion remains.

As the developer, an organic alkali developer causing no damage on the underlying imaging element, circuit and the like is preferred. The development temperature is usually from 20 to 30° C., and the development time is conventionally from 20 to 90 seconds. In order to more remove the scum, in recent years, the development is sometimes performed for 120 to 180 seconds. Furthermore, in order to more enhance the scum removability, a step of shaking off the developer every 60 seconds and newly supplying the developer is repeated several times in some cases.

Examples of the alkali agent used for the developer include an organic alkaline compound such as aqueous ammonia, ethylamine, diethylamine, dimethylethanolamine, tetramethylammonium hydroxide, tetraethylammonium hydroxide, choline, pyrrole, piperidine, and 1,8-diazabicyclo-[5,4,0]-7-undecene. An aqueous alkaline solution obtained by diluting such an alkali agent with pure water to a concentration of 0.001 to 10 mass %, preferably from 0.01 to 1 mass %, is preferably used as the developer.

Incidentally, an inorganic alkali may be also used for the developer, and preferred examples of the inorganic alkali include sodium hydroxide, potassium hydroxide, sodium carbonate, sodium hydrogencarbonate, sodium silicate, and sodium metasilicate.

In the case of using a developer composed of the aqueous alkaline solution above, the film is generally washed (rinsed) with pure water after development.

After drying the film, a heat treatment (post-baking) is preferably performed. In the case of forming a multicolor pattern, the steps above are sequentially repeated for each color to produce a cured film, whereby a color filter is obtained.

The post-baking is a heat treatment performed after development so as to complete the curing, and a heat curing treatment is usually preformed at from 100 to 240° C., preferably from 200 to 240° C.

The post-baking treatment can be performed in a continuous or batch system on the coated film after development by using a heating device such as hot plate, convection oven (hot air circulating drier) and high-frequency heater under the above-described conditions.

Incidentally, the production method of the present invention may include, if desired, as a step other than those described above, the steps known to the production method of a color filter for a solid-state imaging device. For example, after performing the above-described photosensitive transparent composition layer-forming step, exposure step and development step, a curing step of curing the formed transparent pattern by heating and/or exposure may be included, if desired.

In the case of using the photosensitive transparent composition of the present invention, contamination or the like may be caused, for example, due to clogging of the piping part or the nozzle in the ejection part of the coating apparatus or due to attachment, precipitation or drying of the photosensitive transparent composition or inorganic particle in the coating machine. In order to efficiently clean the contamination brought about by the photosensitive transparent composition of the present invention, the solvent described above with respect to the composition of the present invention is preferably used as a cleaning solution. The cleaning solutions described, for example, in JP-A-7-128867, JP-A-7-146562, JP-A-8-278637, JP-A-2000-273370, JP-A-2006-85140, JP-A-2006-291191, JP-A-2007-2101, JP-A-2007-2102 and JP-A-2007-281523 may be also suitably used as the cleaning solution for cleaning and removing the photosensitive transparent composition of the present invention.

Among these, an alkylene glycol monoalkyl ether carboxylate and an alkylene glycol monoalkyl ether are preferred.

One of these solvents may be used alone, or two or more thereof may be mixed and used. In the case of mixing two or more solvents, a solvent having a hydroxyl group and a solvent not having a hydroxyl group are preferably mixed. The mass ratio of the solvent having a hydroxyl group to the solvent not having a hydroxyl group is from 1/99 to 99/1, preferably from 10/90 to 90/10, more preferably from 20/80 to 80/20. A mixed solvent of propylene glycol monomethyl ether acetate (PGMEA) and propylene glycol monomethyl ether (PGME) in a ratio of 60/40 is particularly preferred. Incidentally, in order to encourage the cleaning solution to permeate the contamination, the surfactant described above with respect to the composition of the present invention may be added to the cleaning solution.

In the color filter for a solid-state imaging device of the present invention, the white filter pixel contained in the color filter is obtained using the photosensitive transparent composition of the present invention and therefore, even when one side of the white filter pixel has a size of about 1 μm, a pattern having an excellent pattern profile is formed with high resolution in a state of the development scum being reduced. Also, the white filter pixel in the color filter has a refractive index of 1.60 to 1.90 for light at a wavelength of 633 nm.

Accordingly, when the color filter for a solid-state imaging device of the present invention is mounted in an image sensor, a high-quality image can be captured with high sensitivity in the imaging sensor.

The color filter for a solid-state imaging device of the present invention can be suitably used for a solid-state imaging device such as CCD and CMOS and is suited particularly for CCD, CMOS or the like of high resolution exceeding 1,000,000 pixels. The color filter for a solid-state imaging device of the present invention can be used as a color filter disposed, for example, between a light-receiving part of each pixel constituting CCD or CMOS and a microlens for collecting light.

The film thickness of the colored pattern (colored pixel) in the color filter for a solid-state imaging device is preferably 2.0 μm or less, more preferably 1.0 μm or less. The term "colored" in the colored pattern (colored pixel) as used herein is a concept including transparent (white).

Also, the size (pattern width) of the colored pattern (colored pixel) is preferably 2.5 μm or less, more preferably 2.0 μm or less, still more preferably 1.7 μm or less.

[Solid-State Imaging Device]

The solid-state imaging device of the present invention comprises the above-described color filter for a solid-state imaging device of the present invention. The configuration of the solid-state imaging device of the present invention is not particularly limited as long as it is a configuration comprising the color filter for a solid-state imaging device of the present invention and functioning as a solid-state imaging device, but examples thereof include the following configuration.

This is a configuration having, on a support, a plurality of photodiodes constituting the light-receiving area of a solid-state imaging device (e.g., CCD image sensor, CMOS image sensor) and a transfer electrode composed of polysilicon or the like; having a light-shielding film composed of tungsten or the like on the photodiodes and the transfer electrode, which is open only in the light-receiving part of the photodiode; having a device protective film composed of silicon nitride or the like, which is formed on the light-shielding film to cover the entire light-shielding film surface and the light-receiving part of the photodiode; and having the color filter for a solid-state imaging device of the present invention on the device protective film.

Also, the configuration may be, for example, a configuration having a light collection device (for example, a microlens; in the following, the same applies) on the above-described device protective layer but below the color filter (on the side close to the support), or a configuration having a light collection device on the color filter.

Examples

The present invention is described in greater detail below by referring to Examples but as long as the purport of the present invention is observed, the present invention is not limited to the following Examples. Incidentally, unless otherwise indicated, the "parts" and "%" are on the mass basis.

The components shown in Table 1 below were dissolved in the solvent shown in Table 1, and the resulting solution was filtered through a tetrafluoroethylene-made filter having a pore size of 0.2 μm to prepare photosensitive transparent compositions of Examples 1 to 43 and Comparative Examples 1 to 3 each having the solid content concentration shown in Table 1.

In Table 1, the symbols in the alkali-soluble resin, polymerizable compound, photopolymerization initiator, dispersant and ultraviolet absorber correspond to those used above in specific examples of respective components.

As for the inorganic fine particle, the following commercial products were used.

Silicon Oxide-Titanium Oxide Composite Particle 1):
OPTOLAKE, produced by Catalysts & Chemicals Ind. Co., Ltd.

Silicon Oxide-Titanium Oxide Composite Particle 2):
MT-03 produced by Tayca Corporation (average primary particle diameter: 10 nm).

Aluminum Oxide-Titanium Oxide Composite Particle 3):
MT-05 produced by Tayca Corporation (average primary particle diameter: 10 nm).

Titanium Oxide Particle 4):
MT-02 produced by Tayca Corporation (average primary particle diameter: 10 nm).

Zirconium Oxide Particle 5):
  produced by Kojundo Chemical Laboratory Co., Ltd.
Tin Oxide-Zirconium Oxide Composite Particle 6):
  produced by Kojundo Chemical Laboratory Co., Ltd.
Titanium Oxide Particle 7):
  TTO-51C produced by Ishihara Sangyo Kaisha Ltd. (average primary particle diameter: 15 nm).
Titanium Oxide Particle 8):
  TTO-51A produced by Ishihara Sangyo Kaisha Ltd. (average primary particle diameter: 15 nm).
Aluminum Oxide Particle 9):
  NANOBYK-3601 produced by BYK Chemie (particle diameter: 40 nm, particle content: 30 mass %, dispersion solvent: tripropylene glycol diacrylate).
Aluminum Oxide Particle 10):
  NANOBYK-3602 produced by BYK Chemie (particle diameter: 40 nm, particle content: 30 mass %, dispersion solvent: hexanediol diacrylate).
Surface-Treated Aluminum Oxide Particle 11):
  NANOBYK-3610 produced by BYK Chemie (particle diameter: 20 nm, particle content: 30 mass %, dispersion solvent: methoxypropyl acetate).
Surface-Treated Silica Particle 12):
  NANOBYK-3650 produced by BYK Chemie (particle diameter: 20 nm, particle content: 25 mass %, dispersion solvent: a mixed solvent of methoxypropyl acetate and methoxypropanol).
Surface-Treated Silica Particle 13):
  NANOBYK-3651 produced by BYK Chemie (particle diameter: 20 nm, particle content: 20 mass %, dispersion solvent: a mixed solvent of methoxypropyl acetate and methoxypropanol).
Surface-Treated Silica Particle 14):
  NANOBYK-3652 produced by BYK Chemie (particle diameter: 20 nm, particle content: 25 mass %, dispersion solvent: a mixed solvent of methoxypropyl acetate and methoxypropanol).

As for the photopolymerization initiator, in addition to Compounds (B-1) to (B-10) illustrated above, IRGACURE-907 produced by CIBA Japan was used.

As for the ultraviolet absorber, Compounds (1) to (14) illustrated above were used.

As for the alkali-soluble resin, Compounds (E-1) to (E-8) illustrated above were used.

As for the dispersant, in addition to Compounds (D-1) to (D-13) illustrated later, Disperbyk-110, Disperbyk-111, Disperbyk-112, Disperbyk-116, Disperbyk-130, Disperbyk-140, Disperbyk-142, Disperbyk-145, Disperbyk-161, Disperbyk-162, Disperbyk-163, Disperbyk-164, Disperbyk-166, Disperbyk-167, Disperbyk-168, Disperbyk-170, Disperbyk-171, Disperbyk-180, Disperbyk-182, Disperbyk-183, Disperbyk-184, and Disperbyk-185 (all, dispersants produced by BYK Chemie) were used.

TABLE 1

|  | Inorganic Particle | mass % | Alkali-Soluble Resin | mass % |
| --- | --- | --- | --- | --- |
| Example 1 | Silicon Oxide-Titanium Oxide Composite Particle 1) | 60 | (E-1) | 18 |
| Example 2 | Silicon Oxide-Titanium Oxide Composite Particle 2) | 40 | (E-2) | 25 |
| Example 3 | Aluminum Oxide-Titanium Oxide Composite Particle 3) | 30 | (E-3) | 28 |
| Example 4 | Zirconium Oxide Particle 5) | 55 | (E-4) | 18 |
| Example 5 | Titanium Oxide Particle 4) | 60 | (E-5) | 15 |
| Example 6 | Tin Oxide-Zirconium Oxide Composite Particle 6) | 40 | (E-6) | 23 |
| Example 7 | Titanium Oxide Particle 8) | 50 | (E-7) | 18 |
| Example 8 | Aluminum Oxide Particle 9) | 60 | (E-8) | 14 |
| Example 9 | Aluminum Oxide Particle 10) | 70 | (E-1) | 5 |
| Example 10 | Surface-Treated Aluminum Oxide Particle 11) | 60 | (E-2) | 9 |
| Example 11 | Zirconium Oxide Particle 5) | 60 | (E-3) | 12 |
| Example 12 | Surface-Treated Silica Particle 13) | 40 | (E-4) | 25 |
| Example 13 | Surface-Treated Silica Particle 14) | 30 | (E-5) | 32 |
| Example 14 | Titanium Oxide Particle 7) | 55 | (E-6) | 17 |
| Example 15 | Surface-Treated Aluminum Oxide Particle 11) | 30 | (E-7) | 35 |
| Example 16 | Surface-Treated Silica Particle 12) | 45 | (E-8) | 25 |
| Example 17 | Surface-Treated Silica Particle 14) | 35 | (E-1) | 34 |
| Example 18 | Zirconium Oxide Particle 5) | 45 | (E-2) | 28 |
| Example 19 | Titanium Oxide Particle 4) | 60 | (E-3) | 9 |
| Example 20 | Titanium Oxide Particle 7) | 50 | (E-4) | 14 |
| Example 21 | Titanium Oxide Particle 8) | 55 | (E-5) | 11 |
| Example 22 | Silicon Oxide-Titanium Oxide Composite Particle 1) | 60 | (E-6) | 8 |
| Example 23 | Aluminum Oxide Particle 10) | 60 | (E-7) | 7 |
| Example 24 | Surface-Treated Aluminum Oxide Particle 11) | 35 | (E-8) | 19 |
| Example 25 | Zirconium Oxide Particle 5) | 40 | (E-1) | 16 |
| Example 26 | Titanium Oxide Particle 4) | 30 | (E-2) | 30 |
| Example 27 | Tin Oxide-Zirconium Oxide Composite Particle 6) | 45 | (E-3) | 17 |
| Example 28 | Titanium Oxide Particle 8) | 55 | (E-4) | 11 |
| Example 29 | Aluminum Oxide Particle 9) | 59 | (E-5) | 9 |
| Example 30 | Aluminum Oxide Particle 10) | 60 | (E-6) | 13 |
| Example 31 | Surface-Treated Aluminum Oxide Particle 11) | 57 | (E-7) | 20 |
| Example 32 | Surface-Treated Silica Particle 12) | 50 | (E-8) | 29 |
| Example 33 | Surface-Treated Silica Particle 13) | 50 | (E-5) | 32 |
| Example 34 | Titanium Oxide Particle 4) | 30 | (E-6) | 28 |
| Example 35 | Tin Oxide-Zirconium Oxide Composite Particle 6) | 45 | (E-7) | 21 |
| Example 36 | Tin Oxide-Zirconium Oxide Composite Particle 6) | 40 | (E-8) | 17 |
| Example 37 | Silicon Oxide-Titanium Oxide Composite Particle 1) | 60 | (E-8) | 4 |
| Example 38 | Silicon Oxide-Titanium Oxide Composite Particle 2) | 40 | (E-8) | 15 |
| Example 39 | Aluminum Oxide-Titanium Oxide Composite Particle 3) | 30 | (E-1) | 23 |
| Example 40 | Zirconium Oxide Particle 5) | 55 | (E-2) | 16 |

TABLE 1-continued

| | | | | |
|---|---|---|---|---|
| Example 41 | Titanium Oxide particle 4) | 60 | (E-8) | 7 |
| Example 42 | Tin Oxide-Zirconium Oxide Composite Particle 6) | 40 | (E-1) | 14 |
| Example 43 | Titanium Oxide Particle 8) | 50 | (E-2) | 20 |
| Comparative Example 1 | Silicon Oxide-Titanium Oxide Composite Particle 1) | 50 | | |
| Comparative Example 2 | Tin Oxide-Zirconium Oxide Composite Particle 6) | 45 | | |
| Comparative Example 3 | Aluminum Oxide Particle 9) | 45 | | |

| | Polymerizable Compound | mass % | Photopolymerization Initiator | mass % | Dispersant | mass % |
|---|---|---|---|---|---|---|
| Example 1 | (M-1) | 21.6 | (B-1) | 0.400 | | |
| Example 2 | (M-2) | 32.5 | (B-2) | 2.500 | | |
| Example 3 | (M-3) | 39.2 | (B-3) | 2.800 | | |
| Example 4 | (M-4) | 25.2 | (B-4) | 1.800 | | |
| Example 5 | (M-5) | 22.5 | (B-5) | 2.500 | | |
| Example 6 | (M-6) | 36.8 | (B-6) | 0.200 | | |
| Example 7 | (M-7) | 30.6 | (B-7) | 1.400 | | |
| Example 8 | (M-8) | 25.2 | (B-8) | 0.800 | | |
| Example 9 | (M-9) | 9.5 | (B-9) | 1.500 | (D-1) | 14.00 |
| Example 10 | (M-10) | 18.0 | (B-10) | 0.400 | (D-2) | 12.60 |
| Example 11 | (M-11) | 13.2 | (B-1) | 1.600 | (D-3) | 13.20 |
| Example 12 | (M-12) | 25.0 | (B-2) | 2.000 | (D-4) | 8.00 |
| Example 13 | (M-1) | 28.8 | (B-3) | 2.000 | (D-5) | 7.20 |
| Example 14 | (M-2) | 13.6 | (B-4) | 0.650 | (D-6) | 13.75 |
| Example 15 | (M-3) | 24.5 | (B-5) | 1.200 | (D-7) | 7.80 |
| Example 16 | (M-4) | 15.0 | (B-6) | 0.950 | (D-8) | 12.15 |
| Example 17 | (M-5) | 17.0 | (B-7) | 2.200 | (D-9) | 9.80 |
| Example 18 | (M-6) | 11.2 | (B-8) | 2.700 | (D-10) | 13.05 |
| Example 19 | (M-7) | 10.8 | (B-9) | 2.199 | (D-11) | 18.00 |
| Example 20 | (M-8) | 18.2 | (B-10) | 2.297 | (D-12) | 15.50 |
| Example 21 | (M-9) | 15.4 | (B-1) | 0.992 | (D-13) | 17.60 |
| Example 22 | (M-10) | 12.0 | (B-2) | 0.798 | Disperbyk-110 | 19.20 |
| Example 23 | (M-11) | 11.2 | (B-3) | 1.391 | Disperbyk-111 | 20.40 |
| Example 24 | (M-1) | 32.3 | (B-4) | 1.797 | Disperbyk-112 | 11.90 |
| Example 25 | (M-2) | 28.8 | (B-5) | 0.796 | Disperbyk-116 | 14.40 |
| Example 26 | (M-3) | 27.0 | (B-1) | 1.593 | Disperbyk-130 | 11.40 |
| Example 27 | (M-4) | 18.7 | (B-2) | 2.170 | Disperbyk-140 | 17.10 |
| Example 28 | (M-5) | 11.0 | (B-3) | 1.540 | Disperbyk-142 | 21.45 |
| Example 29 | (M-6) | 6.3 | (B-4) | 2.000 | Disperbyk-145 | 23.60 |
| Example 30 | (M-7) | 10.4 | (B-5) | 3.200 | Disperbyk-161 | 11.40 |
| Example 31 | (M-8) | 10.0 | (B-6) | 1.240 | Disperbyk-162 | 10.26 |
| Example 32 | (M-9) | 11.6 | (B-7) | 0.396 | Disperbyk-163 | 9.00 |
| Example 33 | (M-10) | 9.6 | (B-8) | 0.330 | Disperbyk-164 | 8.00 |
| Example 34 | (M-11) | 33.6 | (B-9) | 0.894 | Disperbyk-166 | 7.50 |
| Example 35 | (M-12) | 25.2 | (B-10) | 2.498 | Disperbyk-167 | 6.30 |
| Example 36 | (M-9) | 23.8 | (B-1) | 2.300 | Disperbyk-168 | 16.80 |
| Example 37 | (M-10) | 6.0 | (B-2) | 2.200 | Disperbyk-170 | 25.80 |
| Example 38 | (M-1) | 25.5 | (B-4) | 0.800 | Disperbyk-171 | 17.20 |
| Example 39 | (M-2) | 41.4 | (B-5) | 1.096 | Disperbyk-180 | 4.50 |
| Example 40 | (M-3) | 14.4 | (B-1) | 0.780 | Disperbyk-182 | 13.75 |
| Example 41 | (M-1) | 11.9 | (B-4) | 0.094 | Disperbyk-183 | 21.00 |
| Example 42 | (M-2) | 25.2 | (B-5) | 2.798 | Disperbyk-184 | 18.00 |
| Example 43 | (M-3) | 18.0 | (B-1) | 0.998 | Disperbyk-185 | 11.00 |
| Comparative Example 1 | tetramethylolmethane triacrylate | 49.2 | IRGACURE 907 | 0.800 | | |
| Comparative Example 2 | pentaerythritol tetraacrylate | 54.0 | IRGACURE 907 | 1.000 | | |
| Comparative Example 3 | (M-10) | 53.0 | (B-10) | 2.000 | | |

| | Ultraviolet Absorber | mass % | Solid Content Concentration (mass %) | Solvent |
|---|---|---|---|---|
| Example 1 | | | 20 | cyclohexanone |
| Example 2 | | | 22 | propylene glycol monomethyl ether acetate |
| Example 3 | | | 23 | propylene glycol monomethyl ether acetate |
| Example 4 | | | 25 | ethyl lactate |
| Example 5 | | | 24 | ethyl lactate |
| Example 6 | | | 21 | cyclohexanone |
| Example 7 | | | 22 | cyclohexanone |
| Example 8 | | | 23 | propylene glycol monoethyl ether |
| Example 9 | | | 25 | propylene glycol monoethyl ether |
| Example 10 | | | 24 | ethylbenzene |
| Example 11 | | | 21 | ethylbenzene |
| Example 12 | | | 20 | Ethyl-3-ethoxypropionate |
| Example 13 | | | 25 | Ethyl-3-ethoxypropionate |
| Example 14 | | | 24 | butyl acetate |
| Example 15 | (1) | 1.500 | 21 | methyl ethyl ketone |
| Example 16 | (2) | 1.900 | 20 | butyl acetate |
| Example 17 | (3) | 2.000 | 21 | methyl-3-methoxypropionate |

TABLE 1-continued

| | | | | |
|---|---|---|---|---|
| Example 18 | (4) | 0.050 | 20 | methyl ethyl ketone |
| Example 19 | (5) | 0.001 | 25 | ethyl glycol acetate |
| Example 20 | (6) | 0.003 | 22 | methyl-3-methoxypropionate |
| Example 21 | (7) | 0.008 | 23 | cyclohexanone |
| Example 22 | (1) | 0.002 | 25 | ethyl glycol acetate |
| Example 23 | (2) | 0.009 | 24 | cyclohexanone |
| Example 24 | (3) | 0.003 | 21 | propylene glycol monomethyl ether acetate |
| Example 25 | (4) | 0.004 | 22 | ethyl lactate |
| Example 26 | (5) | 0.007 | 23 | ethyl lactate |
| Example 27 | (6) | 0.030 | 25 | cyclohexanone |
| Example 28 | (7) | 0.010 | 24 | cyclohexanone |
| Example 29 | (8) | 0.100 | 21 | propylene glycol monoethyl ether |
| Example 30 | (9) | 2.000 | 20 | ethyl-3-ethoxypropionate |
| Example 31 | (10) | 1.500 | 21 | ethyl-3-ethoxypropionate |
| Example 32 | (11) | 0.004 | 22 | butyl acetate |
| Example 33 | (12) | 0.070 | 23 | methyl ethyl ketone |
| Example 34 | (13) | 0.006 | 25 | butyl acetate |
| Example 35 | (13) | 0.002 | 20 | methyl-3-methoxypropionate |
| Example 36 | (8) | 0.100 | 21 | methyl ethyl ketone |
| Example 37 | (9) | 2.000 | 20 | ethyl glycol acetate |
| Example 38 | (10) | 1.500 | 21 | ethyl lactate |
| Example 39 | (11) | 0.004 | 24 | cyclohexanone |
| Example 40 | (12) | 0.070 | 21 | cyclohexanone |
| Example 41 | (13) | 0.006 | 22 | propylene glycol monoethyl ether |
| Example 42 | (13) | 0.002 | 23 | ethyl-3-ethoxypropionate |
| Example 43 | (13) | 0.002 | 22 | ethyl-3-ethoxypropionate |
| Comparative Example 1 | | | 21 | ethyl lactate |
| Comparative Example 2 | | | 20 | cyclohexanone |
| Comparative Example 3 | | | 21 | ethyl-3-ethoxypropionate |

The chemical structural formula, the content (mass %) of each repeating unit constituting the main chain, the number of atoms of graft chain (side chain), and the mass average molecular weight of each of Dispersants (D-1) to (D-13) are shown below. In the Compounds illustrated, the numerical value attached to the repeating moiety of the side chain indicates the number of repetitions of the repeating moiety.

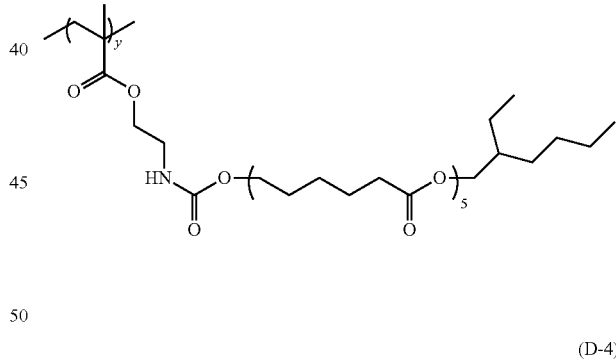

(D-1)

(D-2)

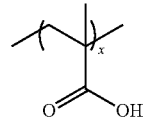

(D-3)

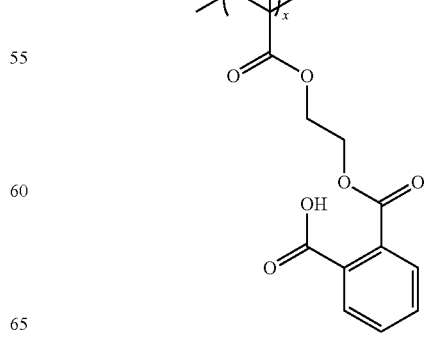

(D-4)

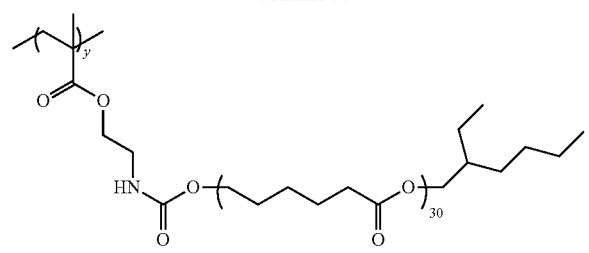
(D-5)
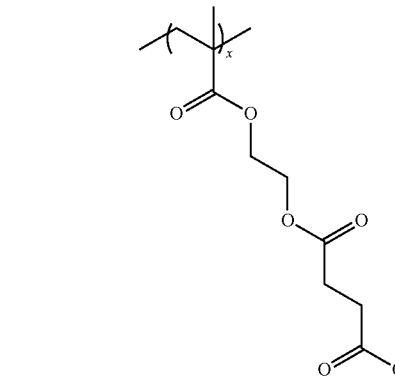
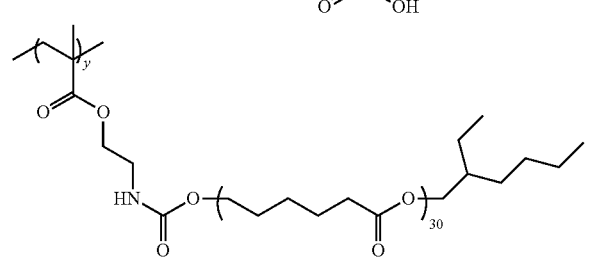
(D-6)
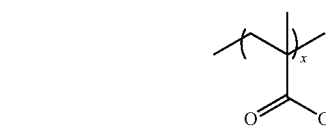
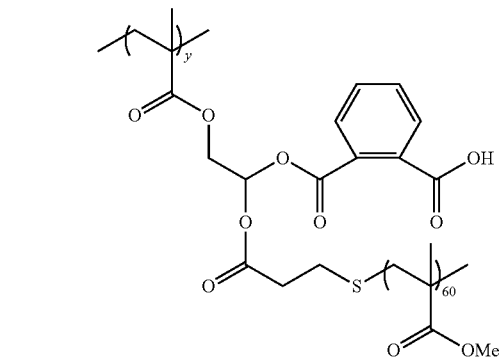
(D-7)
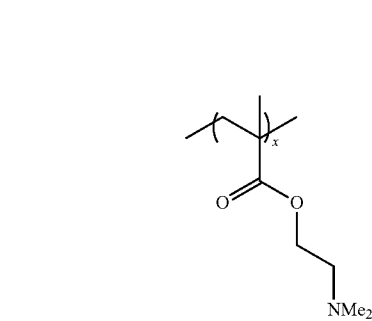
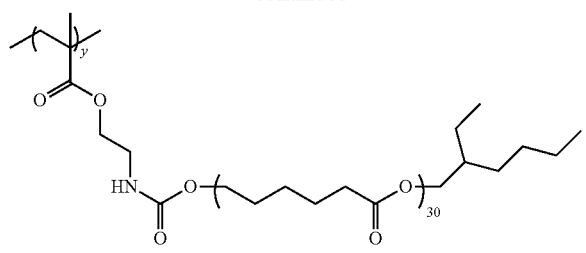
(D-8)
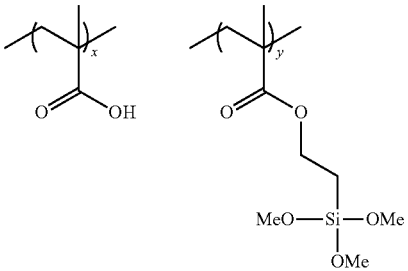
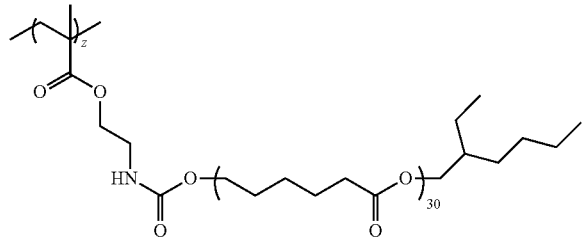
(D-9)
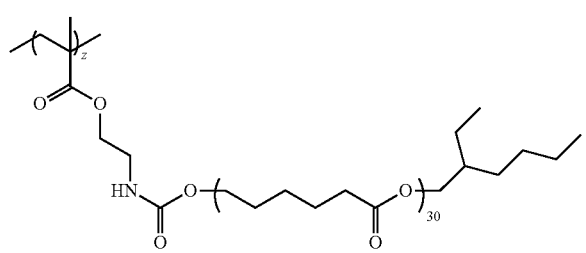
(D-10)
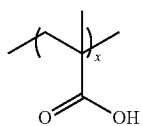

-continued
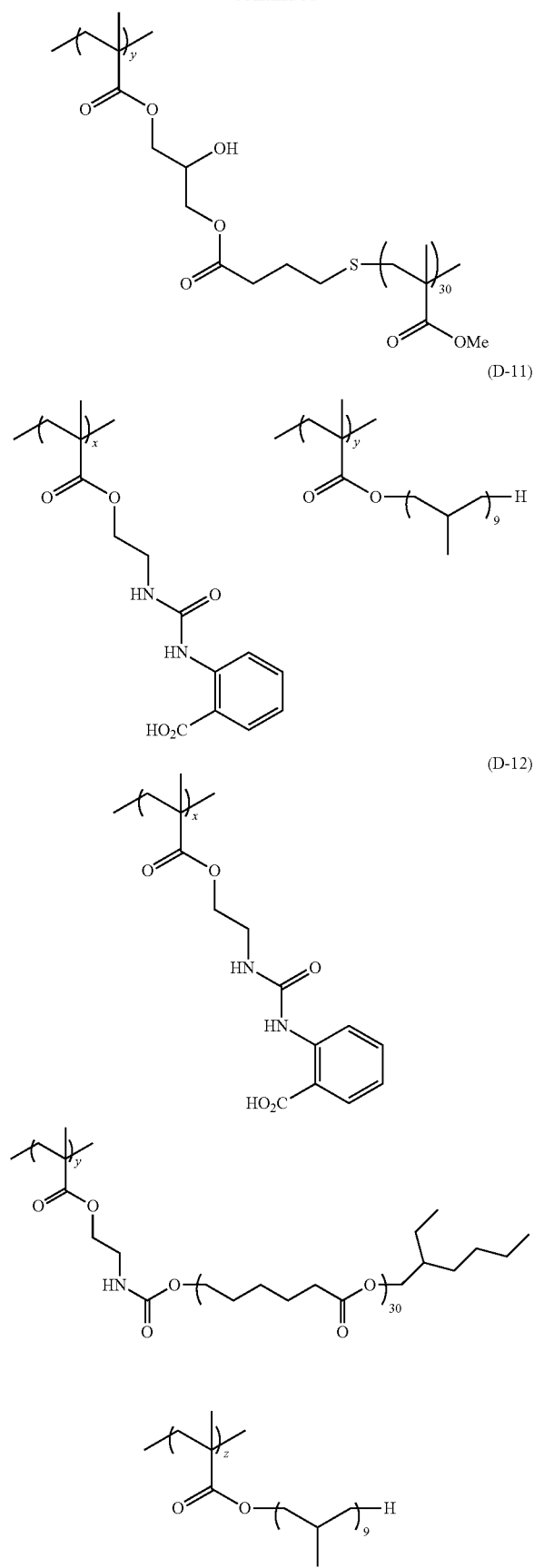
(D-11)
(D-12)
-continued
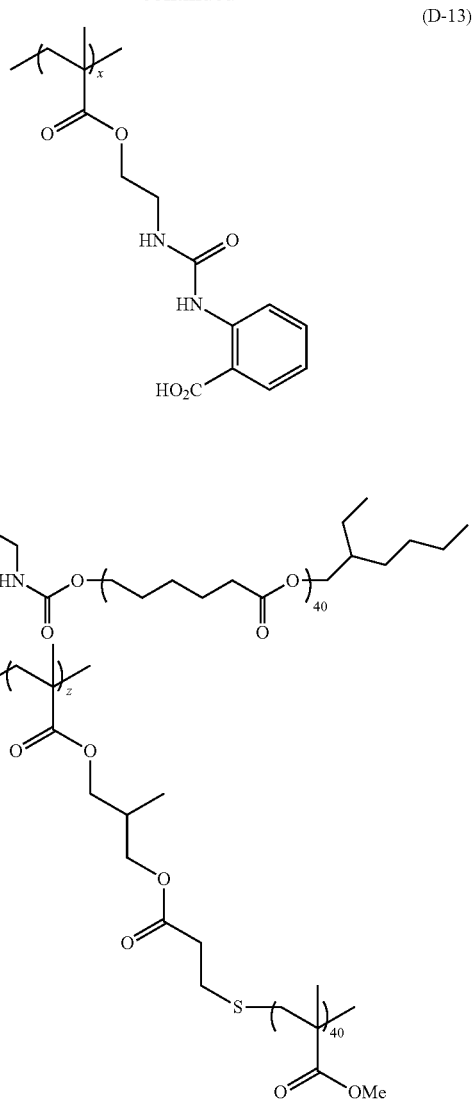
(D-13)
TABLE 2
| Dispersant | Compositional Ratio (mass %) | | | Weight Average Molecular Weight |
|---|---|---|---|---|
| | x | y | z | |
| D-1 | 20 | 80 | — | 20500 |
| D-2 | 20 | 80 | — | 22800 |
| D-3 | 20 | 80 | — | 25500 |
| D-4 | 20 | 80 | — | 26000 |
| D-5 | 20 | 80 | — | 25800 |
| D-6 | 20 | 80 | — | 27000 |
| D-7 | 20 | 80 | — | 18000 |
| D-8 | 10 | 10 | 80 | 17800 |
| D-9 | 10 | 10 | 80 | 35000 |
| D-10 | 20 | 80 | — | 36700 |
| D-11 | 40 | 60 | — | 13000 |
| D-12 | 30 | 30 | 40 | 36700 |
| D-13 | 40 | 30 | 30 | 24500 |
<Measurements of Refractive Index and Transmittance>
The photosensitive transparent composition obtained above was coated on a silicon wafer by a spin coating method and then heated on a hot plate at 100° C. for 2 minutes to obtain a photosensitive transparent composition layer with a film thickness of 1 μm.

Subsequently, the obtained photosensitive transparent composition layer was subjected to entire surface exposure at a wavelength of 365 nm with an exposure dose of 200 mJ/cm$^2$ by using an i-line stepper, FPA-3000i5+ (manufactured by Canon).

The cured film obtained was measured for the refractive index for light at a wavelength of 633 nm by using an ellipsometer (VASE) manufactured by J. A. Woollam Co., Inc.

Also, this cured film was measured for the light transmittance over the entire wavelength region of 400 to 700 nm by using MCPD Series manufactured by Otsuka Electronics Co., Ltd.

The measurements results are shown in Table 3.

<Production of Transparent Pattern>

The photosensitive transparent composition layer described in <Measurements of Refractive Index and Transmittance> above was subjected to exposure at a wavelength of 365 nm with an exposure dose of 200 mJ/cm$^2$ by using an i-line stepper, FPA-3000i5+ (manufactured by Canon), through a mask pattern where square pixels with one side being 1.1 are arrayed in the region of 4 mm×3 mm on a substrate.

The photosensitive transparent composition layer after the exposure above was subjected to puddle development at 23° C. for 60 seconds by using an aqueous 0.3 mass % tetramethylammonium hydroxide solution, then rinsed with water by spin shower and further washed with pure water. After blowing water droplets with high-pressure air, the silicon wafer was naturally dried and then post-baked at 200° C. for 300 seconds by means of a hot plate to obtain a transparent pattern (cured film) having a film thickness of 1 μm on the silicon wafer.

<Evaluations of Resolution, Pattern Profile and Development Scum>

The obtained transparent pattern was observed at a magnification of 30,000 from above the silicon wafer by using a Critical Dimension SEM (S-7800H, manufactured by Hitachi, Ltd.

The resolution was judged under the following standard.

A: A pattern in the form of a square pixel with one side being 1.1 μm was resolved.

B: A pattern in the form of a square pixel with one side being 1.1 μm was not resolved.

The pattern profile was judged under the following standard.

A: A precise pattern could be produced.

B: A pattern could be produced, but the pattern edge was not definite.

C: A pattern could not be produced.

The development scum was judged under the following standard.

A: A fine scum was not observed.

B: A fine scum was observed, but the number of the scums was within the acceptable range.

C: Many fine scums were observed and unacceptable level.

The evaluation results of resolution, pattern profile and development scum are shown in Table 3.

TABLE 3

| | Refractive Index (at 633 nm) | Transmittance (Entire wavelength region of 400 to 700 nm) | Resolution (Pattern in the form of a square pixel with one side being 1.1 μm) | Pattern Profile | Scum |
|---|---|---|---|---|---|
| Example 1 | 1.90 | >90% | A | B | B |
| Example 2 | 1.70 | >91% | A | B | B |
| Example 3 | 1.60 | >92% | A | B | B |
| Example 4 | 1.80 | >90% | A | B | B |
| Example 5 | 1.90 | >91% | A | B | B |
| Example 6 | 1.60 | >92% | A | B | B |
| Example 7 | 1.65 | >93% | A | B | B |
| Example 8 | 1.70 | >90% | A | B | B |
| Example 9 | 1.73 | >91% | A | B | A |
| Example 10 | 1.70 | >92% | A | B | A |
| Example 11 | 1.90 | >93% | A | B | A |
| Example 12 | 1.65 | >94% | A | B | A |
| Example 13 | 1.60 | >92% | A | B | A |
| Example 14 | 1.85 | >93% | A | B | A |
| Example 15 | 1.60 | >94% | A | A | A |
| Example 16 | 1.65 | >93% | A | A | A |
| Example 17 | 1.70 | >92% | A | A | A |
| Example 18 | 1.80 | >91% | A | A | A |
| Example 19 | 1.90 | >90% | A | A | A |
| Example 20 | 1.80 | >92% | A | A | A |
| Example 21 | 1.65 | >91% | A | A | A |
| Example 22 | 1.70 | >94% | A | A | A |
| Example 23 | 1.65 | >92% | A | A | A |
| Example 24 | 1.65 | >93% | A | A | A |
| Example 25 | 1.70 | >90% | A | A | A |
| Example 26 | 1.60 | >91% | A | A | A |
| Example 27 | 1.65 | >92% | A | A | A |
| Example 28 | 1.60 | >92% | A | A | A |
| Example 29 | 1.65 | >90% | A | A | A |
| Example 30 | 1.65 | >91% | A | A | A |
| Example 31 | 1.60 | >92% | A | A | A |
| Example 32 | 1.60 | >92% | A | A | A |
| Example 33 | 1.60 | >90% | A | A | A |
| Example 34 | 1.60 | >92% | A | A | A |
| Example 35 | 1.70 | >93% | A | A | A |
| Example 36 | 1.70 | >90% | A | A | A |
| Example 37 | 1.90 | >91% | A | A | A |
| Example 38 | 1.75 | >92% | A | A | A |
| Example 39 | 1.60 | >93% | A | A | A |
| Example 40 | 1.85 | >90% | A | A | A |
| Example 41 | 1.90 | >91% | A | A | A |
| Example 42 | 1.65 | >90% | A | A | A |
| Example 43 | 1.60 | >91% | A | A | A |
| Comparative Example 1 | 1.70 | >90% | B | C | C |
| Comparative Example 2 | 1.65 | >91% | B | C | C |
| Comparative Example 3 | 1.65 | >91% | B | C | C |

As seen from the results in Table 3, when the photosensitive transparent composition of the present invention was used, a pattern having a high refractive index and having an excellent pattern profile, despite one side having a size of about 1 μm, could be obtained with high resolution in a state of the development scum being reduced. Accordingly, when a white filter pixel contained in a color filter is constituted by a transparent pattern (cured film) obtained using the photosensitive transparent composition, a high-quality image can be captured with high sensitivity in an image sensor having mounted therein the color filter.

On the other hand, when a photosensitive transparent composition of Comparative Examples containing no alkali-soluble resin is used, a pattern in the form of a square pixel with one side being 1.1 μm could not be obtained and although the refractive index was high, the pattern was not in a level employable as a white filter pixel contained in a color filter.

INDUSTRIAL APPLICABILITY

According to the present invention, a photosensitive transparent composition for a color filter of a solid-state imaging device, which can produce a color filter containing a white filter pixel with one side being about 1 μm and ensuring that when the color filter is mounted in an image sensor, a high-quality image can be captured with high sensitivity in the image sensor, and a production method of a color filter of a solid-state imaging device, a color filter of a solid-imaging device, and a solid-state imaging device, each using the composition, can be provided.

This application is based on a Japanese patent application filed on Dec. 24, 2010 (Japanese Patent Application No. 2010-288927), and the contents thereof are incorporated herein by reference.

The invention claimed is:

1. A photosensitive transparent composition for a color filter of a solid-state imaging device, containing:
   (A) a photopolymerization initiator,
   (B) a polymerizable compound, and
   (C) an alkali-soluble resin having an acid value of from 50 mg KOH/g to 150 mg KOH/g,
   wherein:
   a cured film obtained from the photosensitive transparent composition has a refractive index of 1.60 to 1.90 for light at a wavelength of 633 nm, and
   which further contains inorganic fine particles;
   wherein the inorganic fine particles contain oxides of two or more members selected from the group consisting of Si, Ti, Zr, Al and Sn.

2. The photosensitive transparent composition for a color filter of a solid-state imaging device as claimed in claim 1, wherein the alkali-soluble resin is a resin having a polymerizable group.

3. The photosensitive transparent composition for a color filter of a solid-state imaging device as claimed in claim 1, which further contains a dispersant.

4. The photosensitive transparent composition for a color filter of a solid-state imaging device as claimed in claim 1, which further contains an ultraviolet absorber.

5. The photosensitive transparent composition for a color filter of a solid-state imaging device as claimed in claim 1, wherein when a cured film with a thickness of 1 μm is formed from the photosensitive transparent composition, the light transmittance in the thickness direction of the cured film is 90% or more over the entire wavelength region of 400 to 700 nm.

6. A method for producing a color filter of a solid-state imaging device, comprising:
   coating the photosensitive transparent composition for a color filter of a solid-state imaging device claimed in claim 1 to form a coated layer, and
   exposing and developing the coated layer to form a pattern, thereby obtaining a cured film.

7. A color filter of a solid-state imaging device, produced by the production method of a color filter of a solid-state imaging device claimed in claim 6.

8. A solid-state imaging device comprising the color filter of a solid-state image device claimed in claim 7.

9. The photosensitive transparent composition for a color filter of a solid-state imaging device as claimed in claim 1, wherein the content of the inorganic fine particles is 30 to 80 mass % based on the entire solids content of the photosensitive transparent composition.

10. The photosensitive transparent composition for a color filter of a solid-state imaging device as claimed in claim 1, wherein the inorganic fine particles contain oxides of two or more members selected from the group consisting of Ti, Zr and Sn.

11. The photosensitive transparent composition for a color filter of a solid-state imaging device as claimed in claim 1, wherein the content of metals except for transition metals is 300 ppm or less.

12. The photosensitive transparent composition for a color filter of a solid-state imaging device as claimed in claim 1, wherein when a cured film with a thickness of 1 μm is formed from the photosensitive transparent composition, the light transmittance is 95% or more over the entire wavelength region of 400 to 700 nm.

13. The photosensitive transparent composition for a color filter of a solid-state imaging device as claimed in claim 1, wherein the composition contains a resin containing at least a structural unit represented by any one of the following formulae (1) to (4):

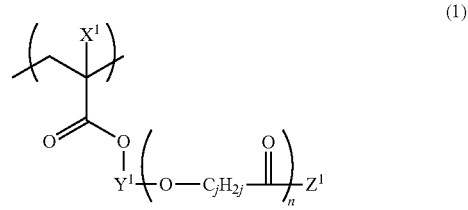

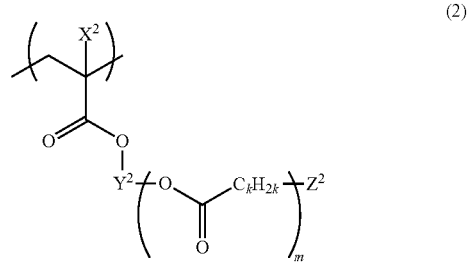

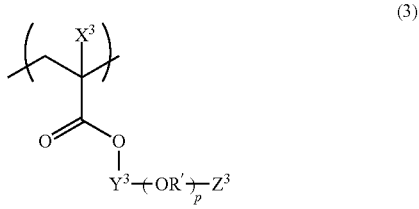

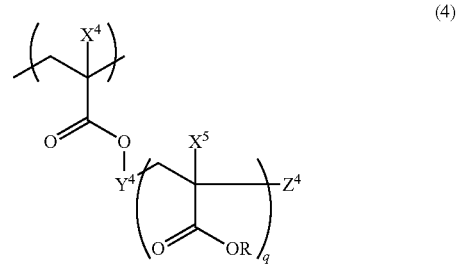

wherein in formulae (1) to (4), each of $X^1$, $X^2$, $X^3$, $X^4$ and $X^5$ independently represents a hydrogen atom or a monovalent organic group;

in formula (3), $R'$ represents a branched or linear alkylene group;

in formulae (1) to (4), each of $Y^1$, $Y^2$, $Y^3$ and $Y^4$ independently represents a divalent linking group;

in formulae (1) to (4), each of $Z^1$, $Z^2$, $Z^3$ and $Z^4$ independently represents a hydrogen atom or a monovalent substituent;

in formulae (1) to (4), each of n, m, p and q each represents an integer of 1 to 500;

in formulae (1) and (2), each of j and k independently represents an integer of 2 to 8; and in formula (4), R represents a hydrogen atom or a monovalent organic group.

14. A photosensitive transparent composition for a color filter of a solid-state imaging device as claimed in claim 1, wherein the inorganic fine particles contain oxides of two or more members selected from the group consisting of Ti, Al and Sn.

15. A photosensitive transparent composition for a color filter of a solid-state imaging device as claimed in claim 1, wherein the alkali-soluble resin is a copolymer of a (meth) acrylic acid and another monomer copolymerizable therewith.

16. A photosensitive transparent composition for a color filter of a solid-state imaging device as claimed in claim 1, wherein the acid value of the alkali-soluble resin (C) is from 70 mg KOH/g to 120 mg KOH/g.

17. A photosensitive transparent composition for a color filter of a solid-state imaging device as claimed in claim 1, wherein the photopolymerization initiator (A) is an oxime-based initiator.

* * * * *